US011476428B2

(12) United States Patent
Zhang et al.

(10) Patent No.: US 11,476,428 B2
(45) Date of Patent: Oct. 18, 2022

(54) COMPOUND, DISPLAY PANEL, AND DISPLAY APPARATUS

(71) Applicant: WuHan TianMa Micro-electronics CO., LTD., Wuhan (CN)

(72) Inventors: Kaibo Zhang, Wuhan (CN); Kui Wang, Wuhan (CN); Tiansheng Ye, Wuhan (CN)

(73) Assignee: WuHan TianMa Micro-electronics CO., LTD., Wuhan (CN)

( * ) Notice: Subject to any disclaimer, the term of this patent is extended or adjusted under 35 U.S.C. 154(b) by 330 days.

(21) Appl. No.: 16/732,179

(22) Filed: Dec. 31, 2019

(65) Prior Publication Data

US 2020/0411763 A1 Dec. 31, 2020

(30) Foreign Application Priority Data

Jun. 28, 2019 (CN) ........................ 201910580331.X

(51) Int. Cl.
*H01L 51/00* (2006.01)
*C07F 5/02* (2006.01)
(Continued)

(52) U.S. Cl.
CPC ............ *H01L 51/008* (2013.01); *C07F 5/027* (2013.01); *C09K 11/06* (2013.01);
(Continued)

(58) Field of Classification Search
CPC ...... H01L 51/009; H01L 51/008; C07F 5/025; C07F 5/027; C09K 2211/1022
See application file for complete search history.

(56) References Cited

U.S. PATENT DOCUMENTS

2014/0061545 A1* 3/2014 Leroy ................ H01L 51/0052 568/34
2019/0088884 A1* 3/2019 Aspuru-Guzik ..... C07D 493/20

FOREIGN PATENT DOCUMENTS

CN 106831773 A 6/2017

* cited by examiner

*Primary Examiner* — Alexander C Kollias
(74) *Attorney, Agent, or Firm* — Christensen O'Connor Johnson Kindness PLLC

(57) ABSTRACT

The present disclosure relates to the field of OLED technologies and provides a compound having TADF property. In an embodiment, the compound has a structure represented by Formula (1), in which $L_1$ and $L_2$ are each a hydrogen atom, phenyl, naphthyl, anthracyl, pyridyl, pyrimidinyl, and pyrazinyl; $R_1$ and $R_2$ are each aryl or and heteroaryl, such as a carbazole-derived group, an acridine-derived group, diarylamino, a diarylamine-derived group, and the like. In the present disclosure, the double boron heterocyclic structure functions not only as an electron acceptor but also as a linker. In the compound according to the present disclosure, by attaching a group having a large steric hindrance to the boron atom of the boron heterocyclic ring, the molecules the compound are prevented from aggregating, and thus a π-aggregation or excimer formed by direct accumulation of the conjugate plane is avoided, thereby improving the light-emitting efficiency.

Formula (1)

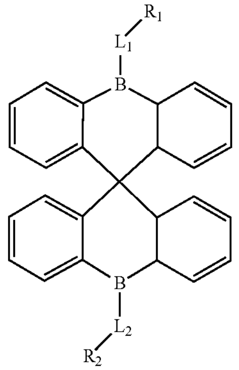

20 Claims, 3 Drawing Sheets

(51) Int. Cl.
*C09K 11/06* (2006.01)
*H01L 51/50* (2006.01)

(52) U.S. Cl.
CPC .. *C09K 2211/1022* (2013.01); *H01L 51/5012* (2013.01); *H01L 51/5016* (2013.01)

COMPOUND, DISPLAY PANEL, AND DISPLAY APPARATUS

CROSS-REFERENCE TO RELATED APPLICATIONS

The present application claims priority to Chinese Patent Application No. 201910580331.X, filed on Jun. 28, 2019, the content of which is incorporated herein by reference in its entirety.

TECHNICAL FIELD

The present disclosure relates to the technical field of organic electroluminescent materials, and particularly, to a compound, a display panel including the compound, and a display apparatus.

BACKGROUND

Light-emitting materials used in conventional OLEDs are mainly classified into fluorescent materials and phosphorescent materials. The fluorescent materials can employ a singlet state to emit light, which can achieve an internal quantum efficiency of 25%. The phosphorescent materials can simultaneously use its singlet state and triplet state to emit light, and thus can achieve an internal quantum efficiency of 100%. However, the efficiency of the phosphorescent material may severely be attenuated and such materials often contains noble metals such as platinum and rhodium, which greatly limits their development.

In recent years, a pure organic thermal active delay fluorescent (TADF) material has made up for deficiencies of phosphorescent and traditional fluorescent materials. Such a material is not only adjustable in color, simple in preparation process, but also has comparable light-emitting efficiency with the phosphorescent material. The energy of singlet and triplet excitons can be utilized simultaneously, and the higher internal quantum efficiency can be achieved. These materials contain no heavy metal like traditional fluorescent materials, and thus are attractive due to the reduced cost and improved stability. At present, devices based on these materials already have the external quantum efficiency (EQE) comparable with the phosphorescent devices, and the theoretical limit of quantum efficiency can reach 100%. Delayed fluorescence is emitted by using a reverse intersystem crossing (RISC) to form the triplet to single state energy level, and thus an energy difference between the singlet energy level and triplet energy level is required to be reduced to a certain value (generally, $\Delta E_{ST} \leq 0.2$ ev) suitable for the RISC. $\Delta E_{ST}$ is positively correlated with an overlapping degree between HOMO and LUMO. In order to reduce $\Delta E_{ST}$, it is necessary to separate HOMO from LUMO as much as possible.

At present, the main factors that restrict the development of stable and efficient blue light light-emitting materials are as follows.

(1) A conjugation length of an aromatic compound is limited by a relatively wide energy band (3.0 eV) of blue light-emitting materials, and thus molecules cannot have a large conjugation structure. In addition, a molecular size of a light-emitting material cannot be excessively large, whereas an excessively small molecular structure may lead to a low thermal stability of the light-emitting material.

(2) A large rigid molecular structure is advantageous for obtaining high-efficient blue light. However, an excessively large rigid molecular structure may increase the difficulty in obtaining a phase-stabilized thin film material.

(3) The wide energy band may greatly increase the difficulty of simultaneous injection of electrons and holes, breaking the balance between electrons and holes, and resulting in a decrease in light-emitting efficiency.

A blue light-emitting material is shown as follows. A structure of triphenylamine is introduced such that the compound can be formed with a propeller-like twisted structure, thereby avoiding intermolecular agglomeration. The material has a photoluminescence wavelength falling within a range of deep blue light range (436 nm). Since the structure of triphenylamine is an electron donor that can lower the turned-on voltage of the device. The OLED device made of such a compound requires a lower turned-on voltage (3.7 eV), and has a maximum luminance of 13306.5 cd/m$^2$, a quantum efficiency of 0.816%, and a light-emitting efficiency of 2.156 cd/A$^{-1}$ and the light-emitting efficiency of 1.4641 m/W$^{-1}$.

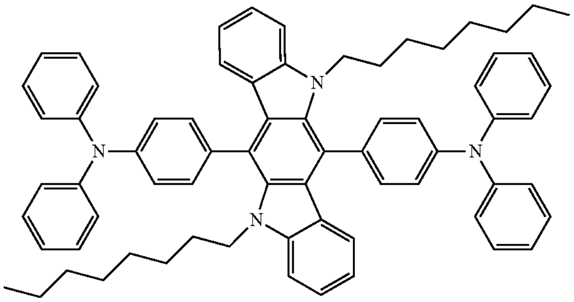 [SMILES: CCCCCCCCn1c2ccccc2c2c(-c3ccc(N(c4ccccc4)c4ccccc4)cc3)c3c(c(-c4ccc(N(c5ccccc5)c5ccccc5)cc4)c21)c1ccccc1n3CCCCCCCC]

Although such a compound having the propeller-like structure can effectively prevent quantum quenching caused by the agglomeration, it has a such large free volume that a glass transition temperature of the material is lowered, and the requirements on final thermal stability cannot be satisfied.

SUMMARY

In view of the problems to be solved in the related art, a first aspect of the present disclosure provides a compound having a structure represented by Formula (1):

Formula (1)

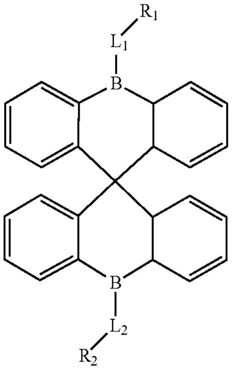

wherein $L_1$ and $L_2$ are each independently selected from the group consisting of a hydrogen atom, phenyl, naphthyl, anthracyl, pyridyl, pyrimidinyl, and pyrazinyl;

$R_1$ and $R_2$ are each independently selected from a group consisting of a substituted or unsubstituted phenyl, a substituted or unsubstituted biphenyl, a substituted or unsubstituted naphthyl, a substituted or unsubstituted anthracyl, a substituted or unsubstituted phenanthryl, a substituted or unsubstituted acenaphthylenyl, a substituted or unsubstituted pyrenyl, a substituted or unsubstituted perylenyl, a substituted or unsubstituted fluorenyl, a substituted or unsubstituted spirodifluorenyl, a substituted or unsubstituted chrysenyl, a substituted or unsubstituted benzophenanthryl, a substituted or unsubstituted benzoanthracyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, carbazolyl and its derivative groups, acridinyl and its derivative groups, diarylamino and its derivative groups.

In another aspect, the present disclosure provides a display panel including an organic light-emitting device. The organic light-emitting device includes an anode, a cathode, a light-emitting layer disposed between the anode and the cathode. A host material or a guest material of the light-emitting layer are one or more compounds according to the first aspect of the present disclosure.

In another aspect, the present disclosure provides a display apparatus including the display panel according to the second aspect of the present disclosure.

DESCRIPTION OF EMBODIMENTS

Figure 1:
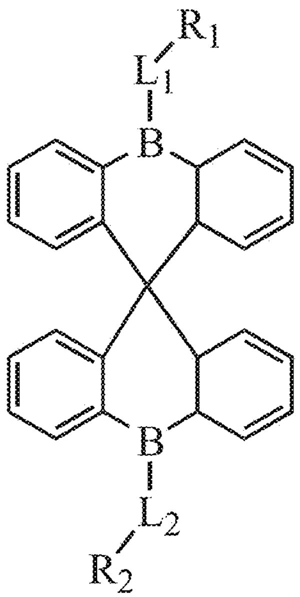
FIG. 1 is a chemical formula of a boron heterocyclic compound according to the present disclosure.
Figure 2:
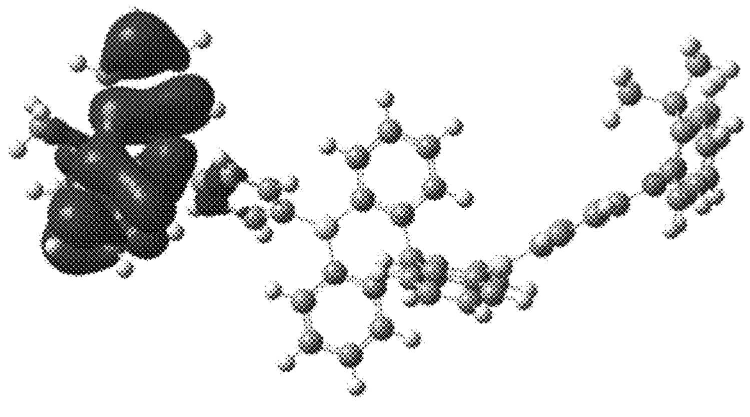
FIG. 2 is a HOMO distribution diagram of the boron heterocyclic compound M1 of the present disclosure.
Figure 3:
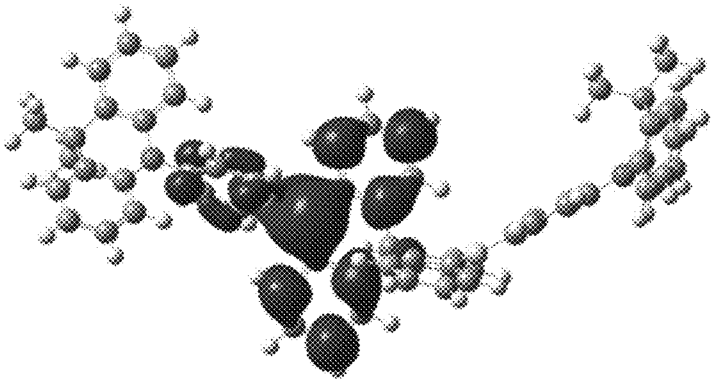
FIG. 3 is a LUMO distribution diagram of the boron heterocyclic compound M1 of the present disclosure.

The present disclosure is described in detail in combination with examples and comparative examples. These embodiments are only used to illustrate the present disclosure, but not intended to limit the scope of the present disclosure. Without departing from the scope of the present disclosure, any modification or equivalent replacement with respect to the technical solutions of the present disclosure shall fall into the scope of protection of the present disclosure.

In an aspect, the present disclosure provides a boron heterocyclic compound having a structure represented by Formula (1):

Formula (1)

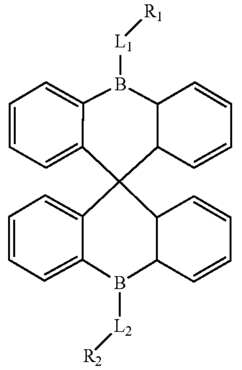

wherein $L_1$ and $L_2$ are each independently selected from the group consisting of a hydrogen atom, phenyl, naphthyl, anthracyl, pyridyl, pyrimidinyl, and pyrazinyl;

$R_1$ and $R_2$ are each independently selected from a group consisting of a substituted or unsubstituted phenyl, a substituted or unsubstituted biphenyl, a substituted or unsubstituted naphthyl, a substituted or unsubstituted anthracyl, a substituted or unsubstituted phenanthryl, a substituted or unsubstituted acenaphthylenyl, a substituted or unsubstituted pyrenyl, a substituted or unsubstituted perylenyl, a substituted or unsubstituted fluorenyl, a substituted or unsubstituted spirodifluorenyl, a substituted or unsubstituted chrysenyl, a substituted or unsubstituted benzophenanthryl, a substituted or unsubstituted benzoanthracyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, carbazolyl and its derivative groups, acridinyl and its derivative groups, diarylamino and its derivative groups.

A p-π-π* conjugation can be formed between an empty p-orbital of the outermost layer of boron element and a π* orbital of a π-system, which reduces an energy level of the lowest unoccupied molecular orbital (LUMO) of the system. In addition, due to the presence of the empty p-orbital, the boron heterocyclic compound of the present disclosure exhibits a large spatial steric hindrance effect by introducing a large volume of aromatic group on a boron atom, thereby increasing the stability of the organic boron π-conjugated compound.

In the present disclosure, the double boron heterocyclic compound functions as an electron acceptor and a linker for connecting groups. Without wishing to be bound by theory, in the compound of the present disclosure, by attaching a group having a large steric hindrance to the boron atom of the boron heterocyclic compound, effective intermolecular charge transfer is enhanced, while aggregation of the compound molecules is avoided, thereby avoiding a π-aggregation or excimer formed by directly overlapping conjugate planes, thereby improving the light-emitting efficiency. Without wishing to be bound by theory, the compound of the present disclosure also has such small free volume that the glass transition temperature of the compound is increased, thereby improving the thermal stability of the compound.

Since the material according to the present disclosure has TADF property, triplet excitons, which are blocked in molecular transition of the conventional fluorescent material, can be used to emit light, thereby improving the efficiency of device. The reason is in that the designed molecule has great rigidity distortion, which reduces the overlapping between HOMO and LUMO, and thus the energy level difference between the triplet state and the singlet state can be reduced to 0.1 eV to satisfy the requirement of the reverse intersystem crossing from the triplet to single state energy level. Therefore, the light-emitting efficiency is improved.

The boron heterocyclic compound itself, as the TADF material, has bipolarity, and thus can greatly improve the injection and transmission of two kinds of carriers when it is used as a light-emitting layer, thereby improving the fluorescence quantum efficiency and reducing the device voltage.

In an embodiment of the compound according to the present disclosure, $R_1$ and $R_2$ are each independently according to any one of the following formulas:

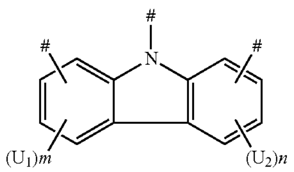

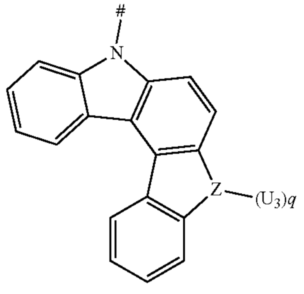

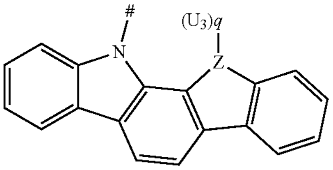

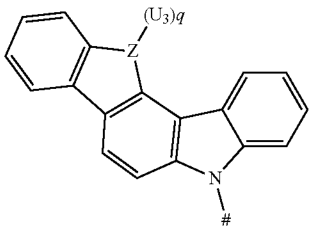

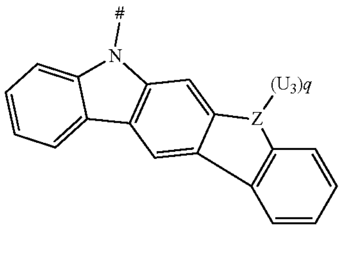

-continued

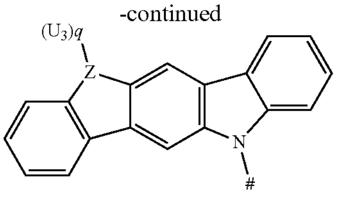

wherein Z is selected from the group consisting of a carbon atom, a nitrogen atom, an oxygen atom, and a sulfur atom;

$U_1$, $U_2$ and $U_3$ are each independently selected from the group consisting of a hydrogen atom, C1-C6 alkyl, and C1-C6 alkoxy; q is an integer selected from 0, 1 or 2;

when Z is an oxygen atom or a sulfur atom, q is 0; and represents a bonding position.

In an embodiment of the compound according to the present disclosure, $R_1$ and $R_2$ are each independently selected from the group consisting of the following groups:

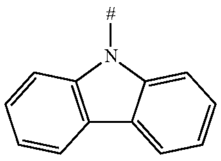

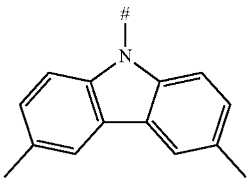

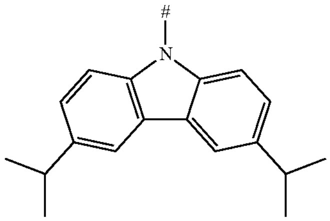

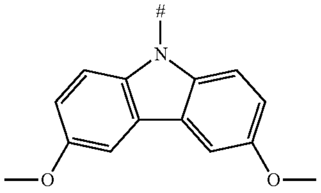

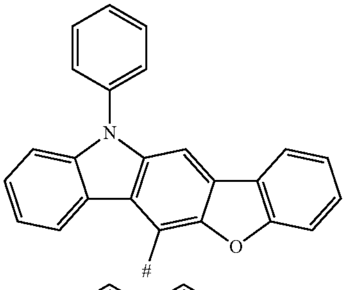

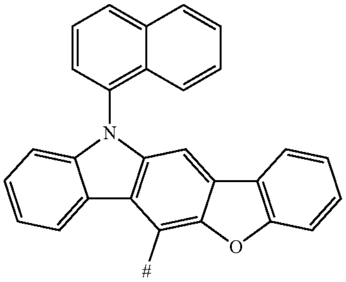

-continued
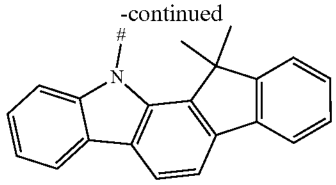
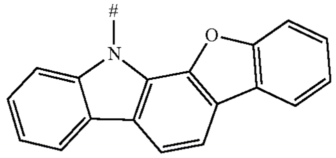
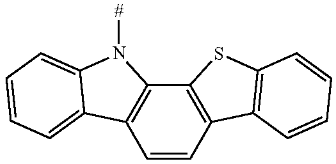
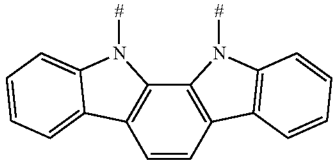
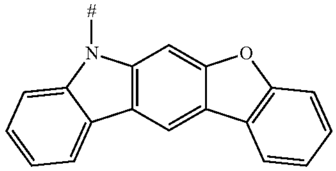
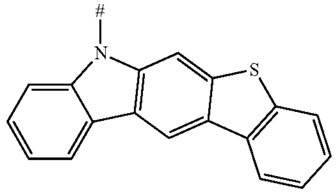
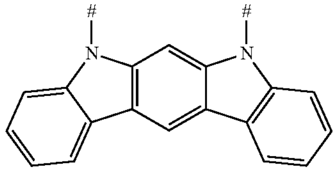
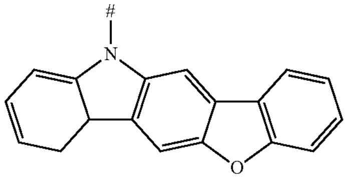
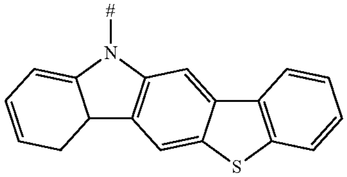
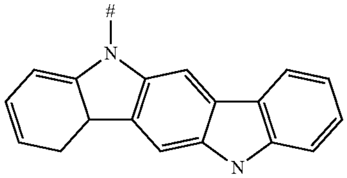
-continued
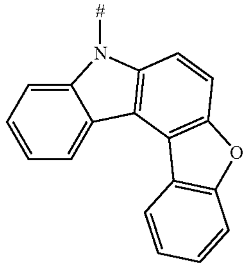
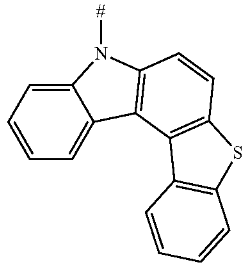
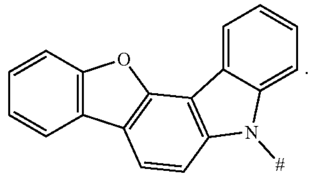
In an embodiment of the compound according to the present disclosure, $R_1$ and $R_2$ are groups each independently according to any one of the following formulas:
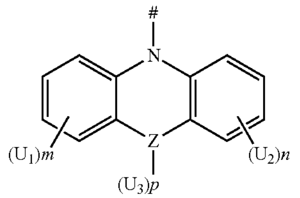
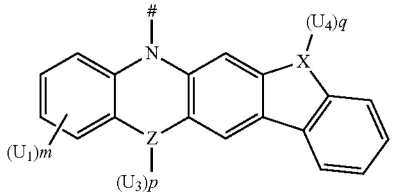
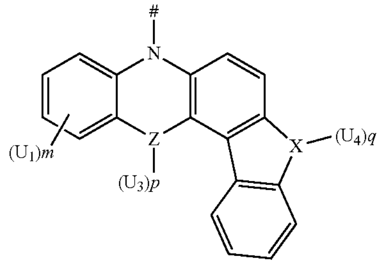
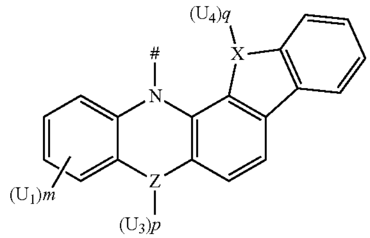
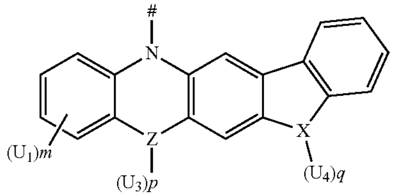

-continued

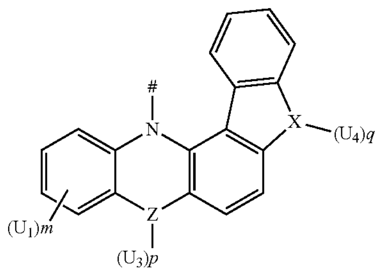

wherein Z is selected from the group consisting of a carbon atom, a nitrogen atom, an oxygen atom, a sulfur atom, and a silicon atom;

X is selected from the group consisting of a carbon atom, a nitrogen atom, an oxygen atom, and a sulfur atom;

$U_1$, $U_2$, $U_3$ and $U_4$ are each independently selected from the group consisting of a hydrogen atom, C1-C6 alkyl, C3-C6 cycloalkyl, C1-C6 alkoxy, and C6-C12 aryl; m, n, p and q are each an integer independently selected from 0, 1 or 2;

when Z or X is an oxygen atom or a sulfur atom, p or q is 0; and represents a bonding position.

In an embodiment of the compound according to the present disclosure, $R_1$ and $R_2$ are each independently according to any one of the following formulas:

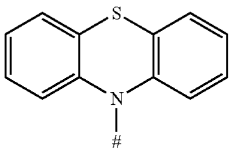

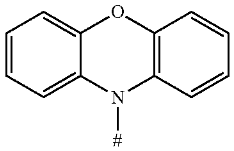

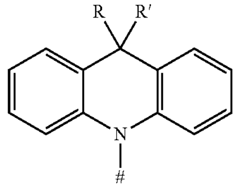

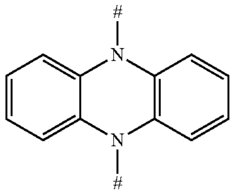

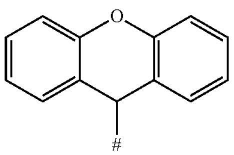

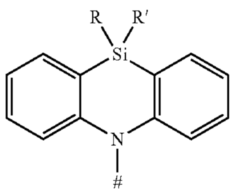

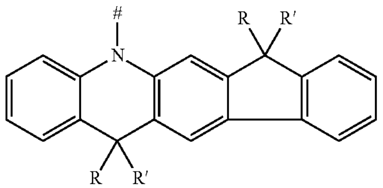

-continued

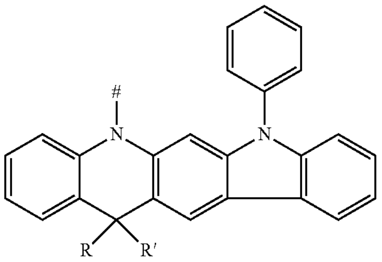

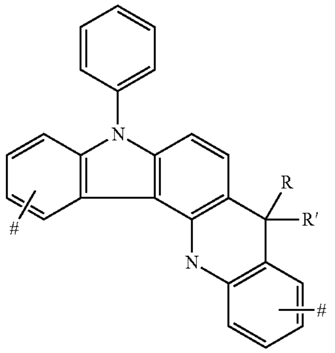

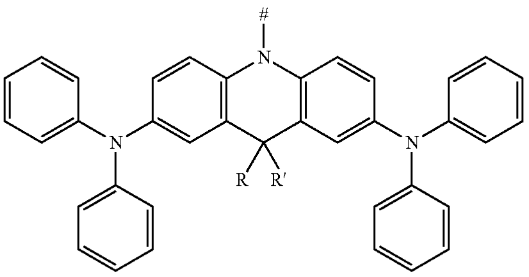

wherein R and R' are each independently selected from the group consisting of a hydrogen atom, C1-C3 alkyl, and phenyl.

In an embodiment of the compound according to the present disclosure, $R_1$ and $R_2$ are each independently selected from the group consisting of the following formula:

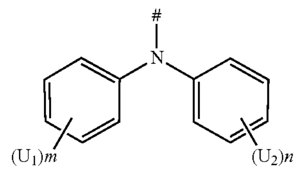

wherein $U_1$ and $U_2$ are each independently selected from the group consisting of a hydrogen atom, C1-C6 alkyl, C1-C6 alkoxy;

m and n are each an integer independently selected from 0, 1, or 2; and represents a bonding position.

In an embodiment of the compound according to the present disclosure, $R_1$ and $R_2$ are each independently selected from the group consisting of the following groups:

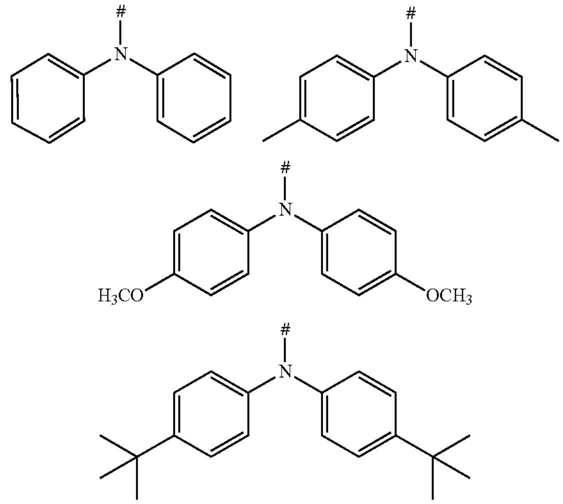

wherein # represents a bonding position.

In an embodiment of the compound according to the present disclosure, $L_1$ and $L_2$ are the same.

In an embodiment of the compound according to the present disclosure, $L_1$ and $L_2$ are each independently selected from the group consisting of the following groups:

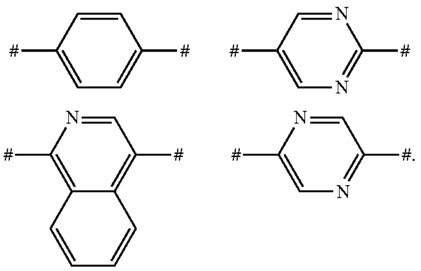

In an embodiment of the compound according to the present disclosure, $R_1$ and $R_2$ are the same.

In an embodiment of the compound according to the present disclosure, $L_1$ and $L_2$ are each independently selected from the group consisting of the following groups:

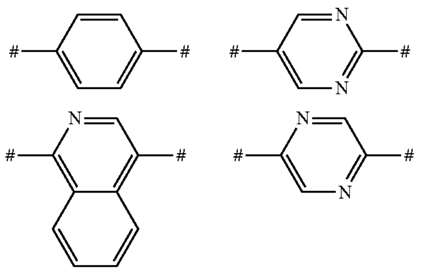

wherein $R_1$ and $R_2$ are each independently selected from the group consisting of the following formula:

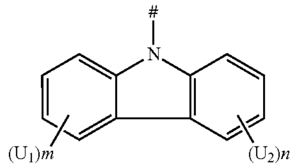

wherein $U_1$ and $U_2$ are each C1-C3 alkyl; m and n are each an integer independently selected from 0, 1, or 2.

In an embodiment of the compound according to the present disclosure, $L_1$ and $L_2$ are each independently selected from the group consisting of the following groups:

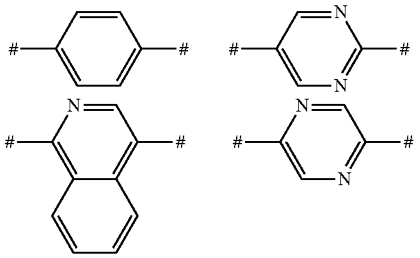

In an embodiment, R1 and R2 are each independently according to the following formula:

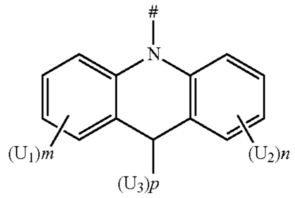

wherein Z is selected from the group consisting of a carbon atom, a nitrogen atom, an oxygen atom and a sulfur atom;

$U_1$, $U_2$ and $U_3$ are each C1-C3 alkyl, or C6-C12 aryl; m and n are an integer independently selected from 0, 1, or 2; and p is an integer selected from 0, 1 or 2;

when Z is an oxygen atom or a sulfur atom, p is 0; and # represents a bonding position.

In an embodiment of the compound according to the present disclosure, $L_1$ and $L_2$ are each independently selected from the group consisting of the following groups:

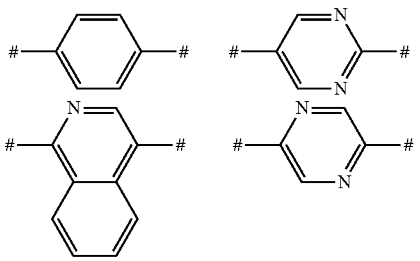

In an embodiment, $R_1$ and $R_2$ are each independently according to the following formula:

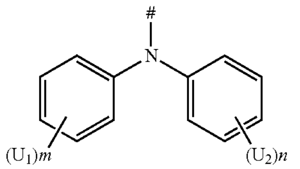

wherein $U_1$ and $U_2$ are each independently selected from the group consisting of C1-C3 alkyl; m and n are each an integer independently selected from 0, 1, or 2.

In an embodiment of the compound according to the present disclosure, $L_1$ and $L_2$ are each independently selected from the group consisting of the following groups:

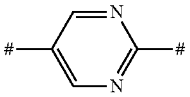

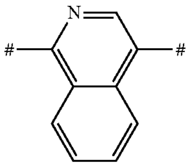

In an embodiment, $R_1$ and $R_2$ are each independently selected from the group consisting of the following groups:

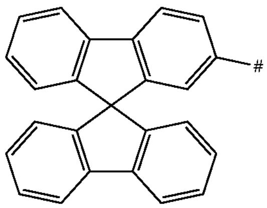

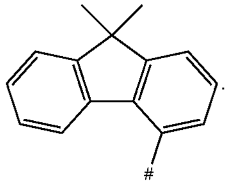

In an embodiment of the compound according to the present disclosure, the compound has a chemical structure represented by Formula (1-1) to Formula (1-6):

Formula£″ 1-1£©

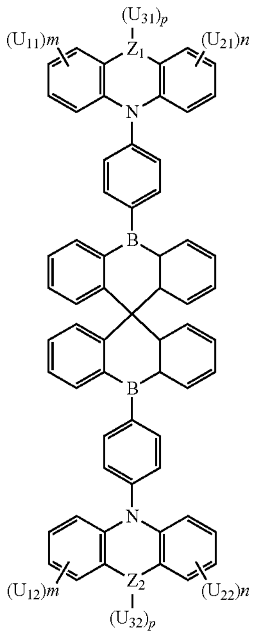

Formula£″ 1-2£©

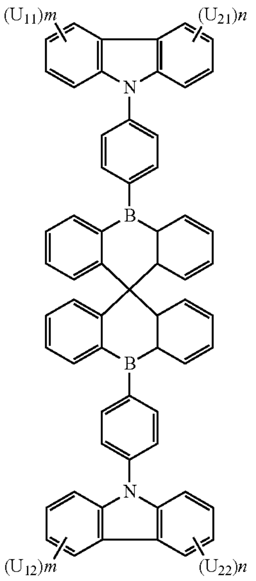

-continued

Formula£" 1-3£©

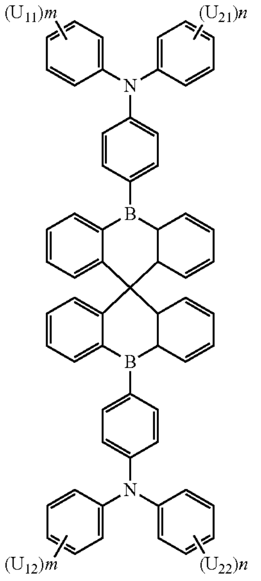

Formula (1-4)

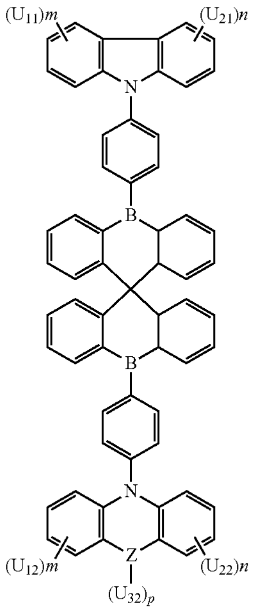

-continued

Formula (1-5)

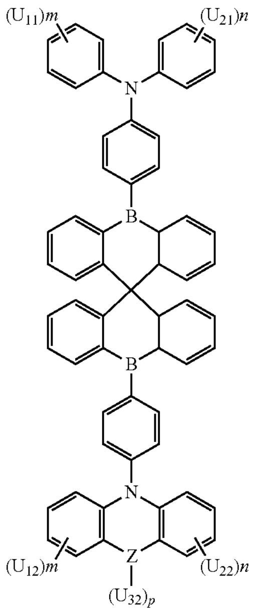

Formula (1-6)

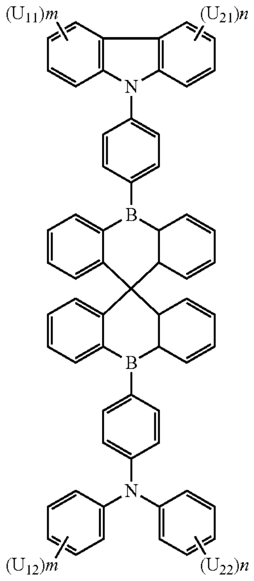

wherein Z is selected from the group consisting of a carbon atom, a nitrogen atom, an oxygen atom, and a sulfur atom;

$U_{11}$, $U_{12}$, $U_{21}$, $U_{22}$, $U_{31}$ and $U_{32}$ are each independently selected from the group consisting of a hydrogen atom, C1-C6 alkyl, C3-C6 cycloalkyl, C1-C6 alkoxy, and C6-C12 aryl;

m, n, and p are each an integer independently selected from 0, 1, or 2; and when Z is an oxygen atom or a sulfur atom, p is 0.

In an embodiment of the compound according to the present disclosure, the compound is selected from the group consisting of the following compounds:
M1
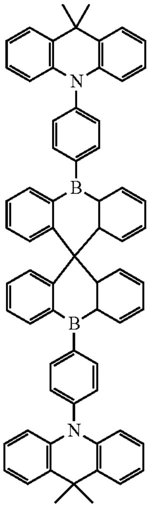
M2
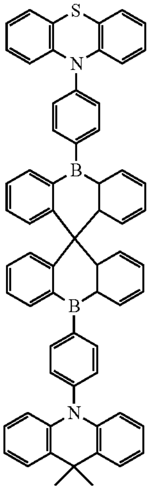
M3
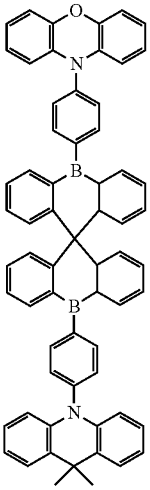
-continued
M4
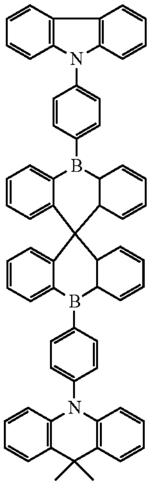
M5
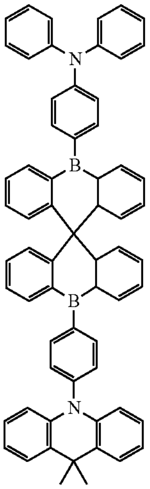
M6
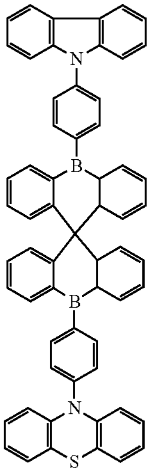

-continued
M7
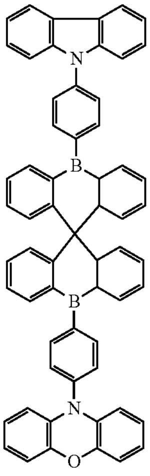
M8
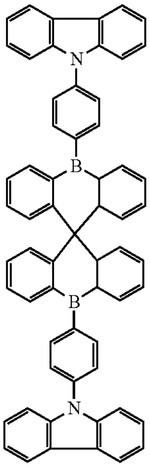
M9
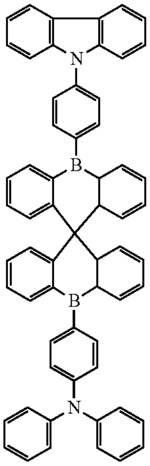
-continued
M10
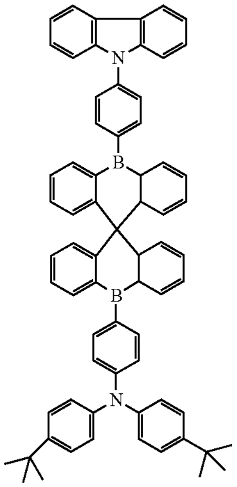
M11
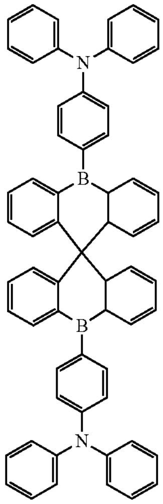
M12
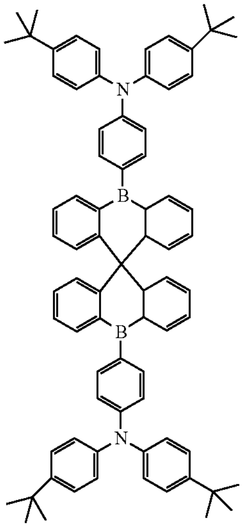

M13
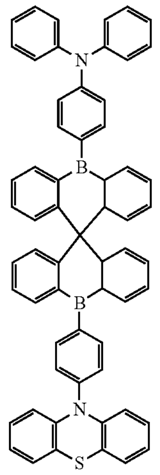
M14
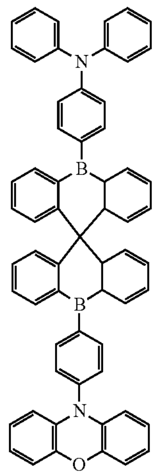
M15
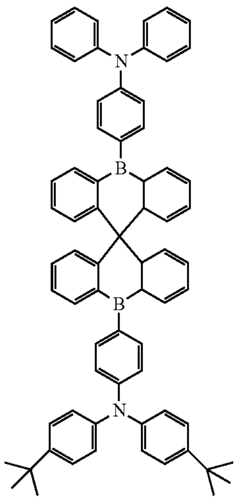
M16
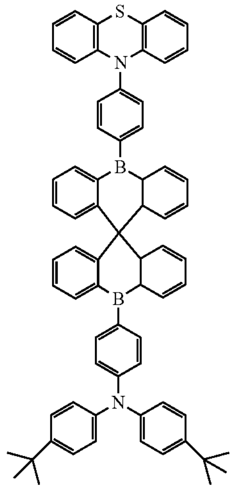
M17
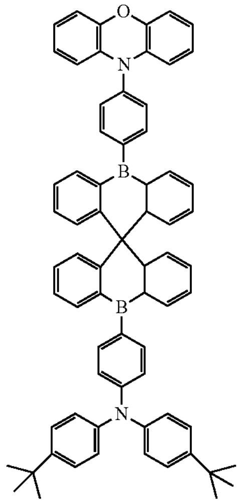
M18
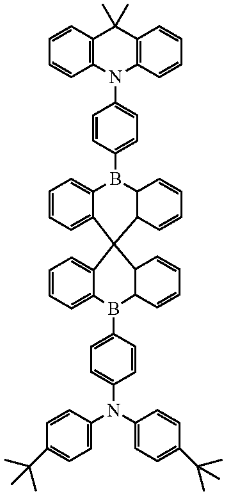

-continued
M19
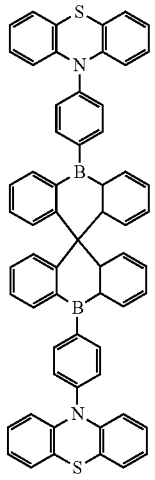
M20
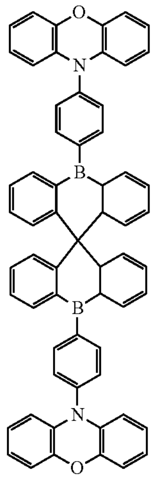
M21
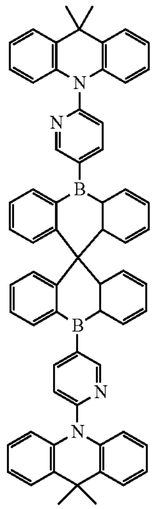
-continued
M22
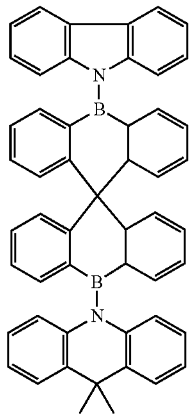
M23
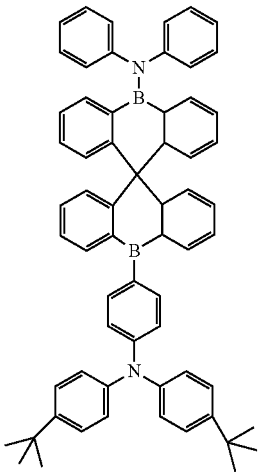

-continued

M24

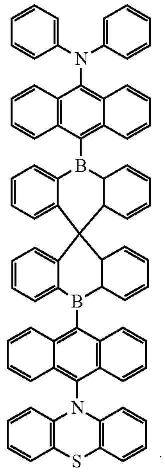

In an embodiment of the compound according to the present disclosure, an energy level difference $\Delta E_{st}$ between a lowest singlet energy level S1 of the compound and a lowest triplet energy level T1 of the compound satisfies an equation $\Delta E_{st}=E_{S1}-E_{T1}\leq 0.1$ eV.

The boron heterocyclic compound according to the present disclosure has TADF property and can be used as a host material or a guest material of a light-emitting layer of OLED.

In another aspect, the present disclosure provides several methods for preparing the exemplary boron heterocyclic compounds M1, M6, M7, M8, M10, M12, M21, M22, and M24, as described in the following Examples 1-9.

M1

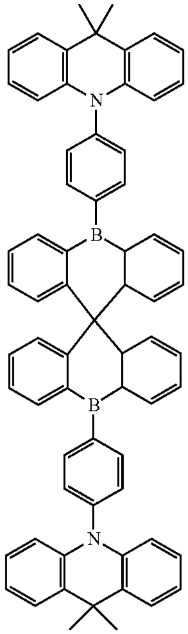

-continued

M6

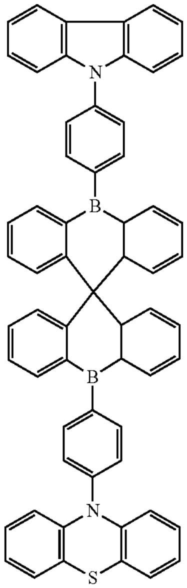

M7

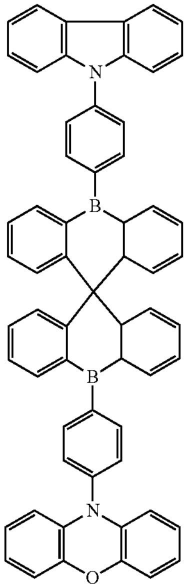

-continued
M8
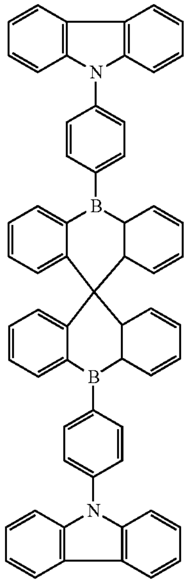
M10
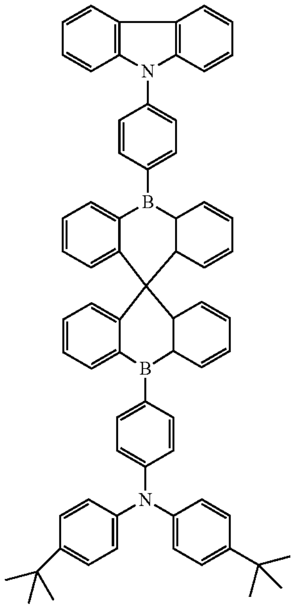
-continued
M12
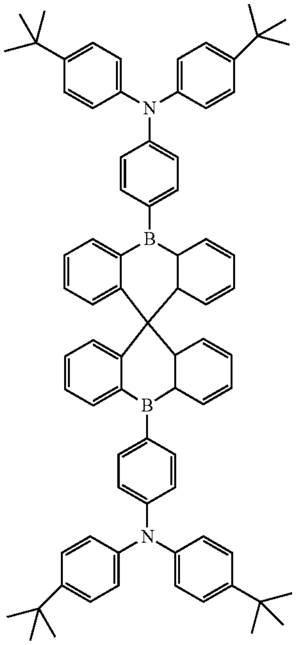
M21
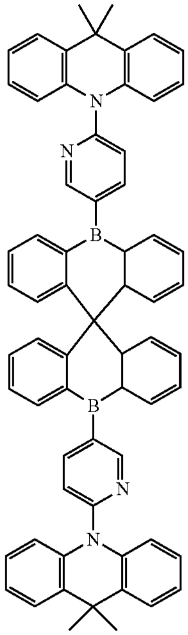

-continued
M22
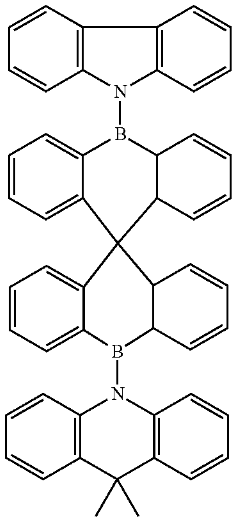
-continued
M24
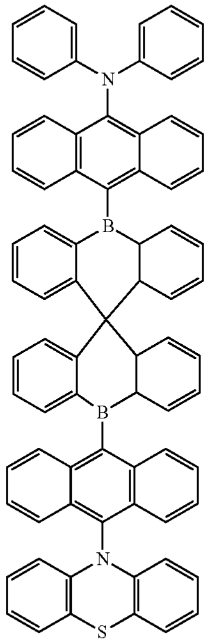
.
Example 1
Synthesis of Compound M1
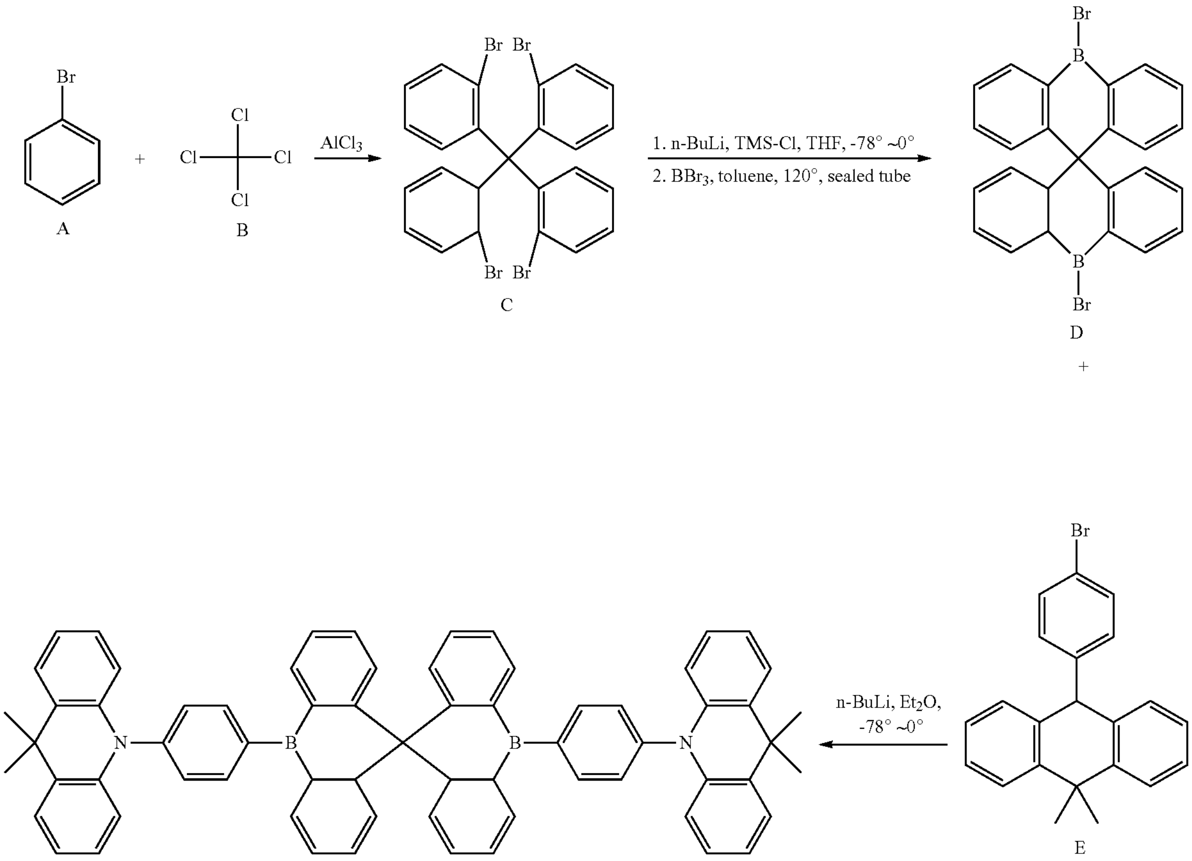
A
B
C
D
+
E
M1

-continued

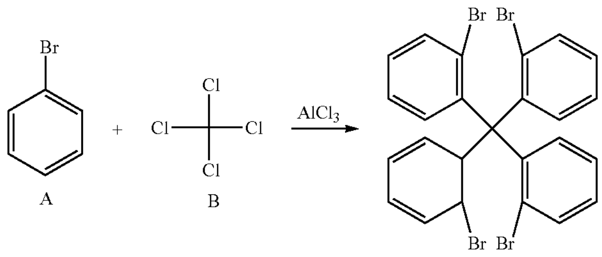

A B C 12.48 g (80 mmol) of Compound A was added in a 200 mL three-necked flask. 0.5 g of anhydrous aluminum trichloride was then added to Compound A and stirred thoroughly. 3.08 g (20 mmol) of dried compound B was added in batches at 30-40° C. while stirring, until the reaction no longer released heat under continuous stirring, the temperature was kept with the steam at 70-80° C. The mixture was refluxed until hydrogen chloride escape was slight. 20 mL of hydrochloric acid (6 mol/L) was added to and sufficiently mixed with benzene. The mixture was added in batches with vigorous stirring to carry out hydrolysis reaction while the hydrolysis temperature was controlled below 40° C. The benzene layer was separated. The aqueous layer was diluted with ice water, and then extracted with benzene several times. The extracted solution was collected, dried with anhydrous calcium chloride, decolorized with activated carbon, filtered and then cooled to crystallize. The crystals were dissolved in a mixed solvent of benzene and petroleum ether to which a small amount of chloroacetyl was added, and recrystallization was carried out to obtain Compound C.

MALDI-TOF:635.79; $^{1}H$ NMR (400 MHz, $CDCl_3$) δ 7.54 (s, 4H), 7.22 (s, 2H), 7.07 (d, J=48.0 Hz, 8H), 7.01 (s, 5H), 6.97 (d, J=3.7 Hz, 1H), 6.68-6.26 (m, 1H); $^{13}C$ NMR (100 MHz, $CDCl_3$) δ 141.47 (s), 134.17 (s), 130.51 (s), 128.20 (s), 125.73 (s), 125.48 (s), 67.17 (s).

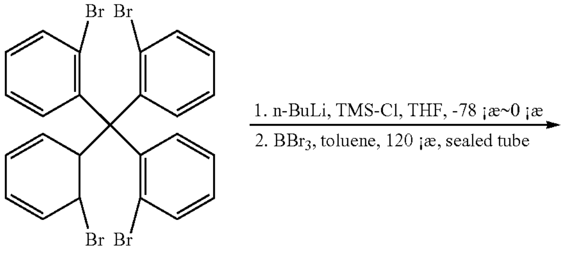

C

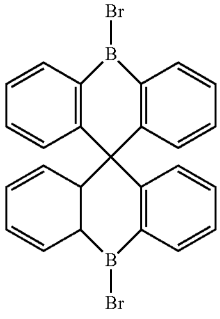

D

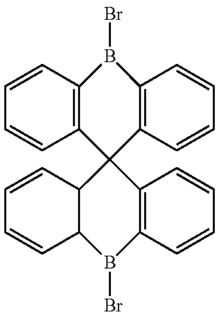

D

+

12.72 g (20 mmol) of Compound C and THF (80 mL) were added and dissolved in a 200 mL three-necked flask and the nitrogen displacement was performed three times, then the temperature was lowered to −78° C. 20 mL (50 mmol) of n-BuLi was added dropwise while the temperature was controlled below −65° C., and then the mixture was stirred for 30 minutes. 4.35 g (40 mmol) of TMS-Cl was added dropwise, and the mixture was heated to 0° C. and reacted for 4 h. After this, the reaction was quenched with ice water. It was extracted with DCM (80 mL×2). The organic phase was collected and distilled by using a rotary evaporator to obtain a light yellow oil, and the light yellow oil was crystallized by using toluene/ethanol to obtain a light yellow solid. 8.47 g (15 mmol) of the light yellow solid, an anhydrous toluene solution (70 mL) and 0.76 mL (8 mmol) of boron tribromide were sequentially added into a 200 mL sealed tube while stirring at 120° C. for 12 h. After the reaction was completed, it was quenched with water (100 mL). The reaction solution was extracted with DCM (100 mL×3). The organic phases were collected, dried and then filtered, and the filtrate was distilled by using a rotary evaporator to remove solvent. Crystallization was performed with DCM/EtOH so as to obtain a white solid, and yield was 75.4%.

MALDI-TOF:497.98; $^{1}H$ NMR (400 MHz, $CDCl_3$) δ 7.74 (s, 3H), 7.35-7.18 (m, 12H); $^{13}C$ NMR (100 MHz, $CDCl_3$) δ 144.78 (s), 132.15 (s), 125.92 (s), 125.08 (s), 124.06 (s), 118.29 (s).

-continued

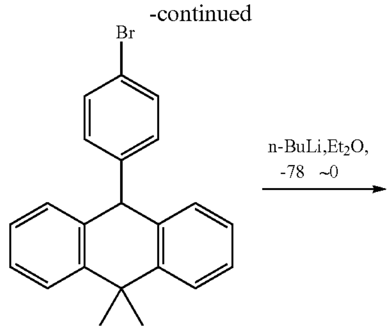

E

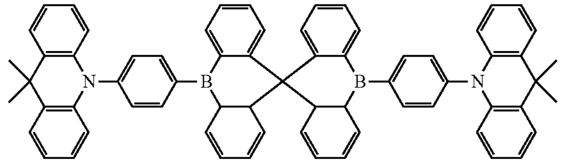

M1

9.96 g (20 mmol) of Compound D and 100 mL of diethyl ether were sequentially added into a 250 mL three-necked flask, the nitrogen displacement was performed, and the mixture was then stirred. The temperature was cooled to −78° C. by liquid nitrogen, and 9 mL (21.6 mmol) of n-BuLi was added dropwise, and then the mixture was stirred for 30 min. 13.52 g (20 mmol) of Compound E was dissolved in 60 mL of toluene, and the solution was added dropwise to the reaction system. After the addition of the solution, the mixture was naturally warmed to room temperature and reacted for 6 hours. After the reaction was completed, the reaction was quenched with 60 mL of ice water. The reaction solution was extracted with DCM (100 mL×3) and a saturated aqueous solution of brine (100 mL×2), respectively. The organic phases were distilled by using a rotary evaporator so as to obtain an oily product. Recrystallization was carried out with toluene/ethanol so as to obtain a solid M1.

MALDI-TOF:910.46; $^{1}$H NMR (400 MHz, $CDCl_3$) δ 7.72 (d, J=12.0 Hz, 5H), 7.48 (s, 2H), 7.39-7.15 (m, 19H), 6.94 (s, 2H), 6.55 (s, 2H), 5.97 (s, 1H), 5.80 (s, 1H), 1.69 (s, 10H); $^{13}$C NMR (100 MHz, $CDCl_3$) δ 163.06 (s), 155.24 (s), 147.84 (s), 146.17 (s), 142.44 (s), 133.31 (d, J=10.8 Hz), 132.68 (s), 132.09 (s), 128.97 (t, J=2.5 Hz), 128.22-128.00 (m), 126.75 (s), 125.01 (s), 124.50 (s), 122.86 (s), 120.00 (s), 110.44 (s), 48.30 (s), 41.77 (s), 35.71 (s), 29.68 (s).

Example 2

Synthesis of Compound M6

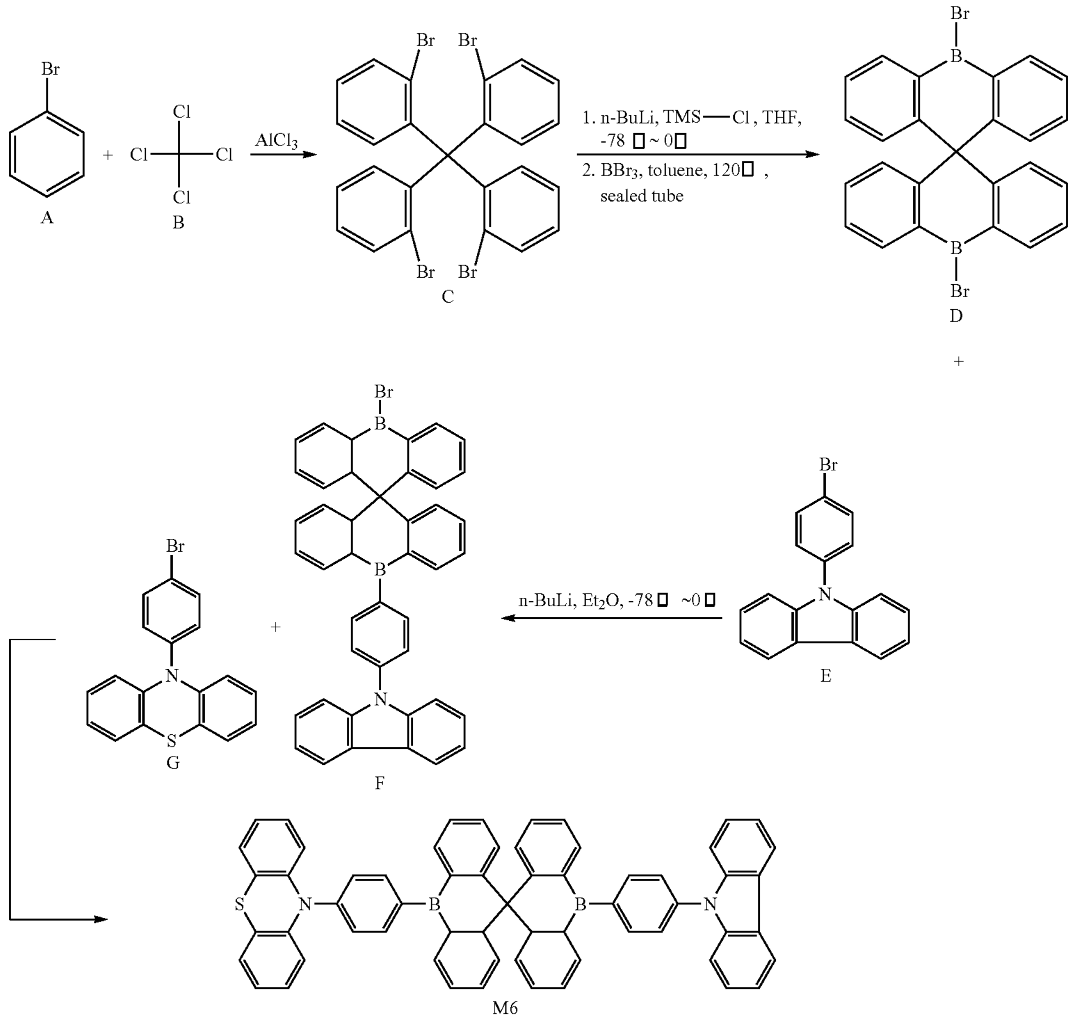

A B C D E F G M6

-continued

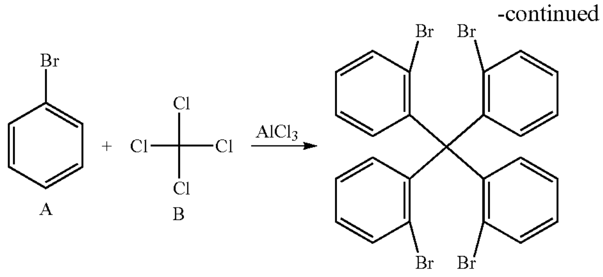

A B C 12.48 g (80 mmol) of Compound A was added into a 200 mL three-necked flask. 0.5 g of anhydrous aluminum trichloride was then added to Compound A and stirred thoroughly. 3.08 g (20 mmol) of dried compound B was added in batches at 30-40° C. while stirring until the reaction no longer released heat under continuous stirring, the temperature was kept with the steam at 70-80° C. The mixture was refluxed until hydrogen chloride escape was slight. 20 mL of hydrochloric acid (6 mol/L) was added to and sufficiently mixed with benzene. The mixture was added in batches with vigorous stirring to carry out hydrolysis reaction while the hydrolysis temperature was controlled below 40° C. The benzene layer was separated. The aqueous layer was diluted with ice water, and then extracted with benzene several times. The extracted solution was collected, dried with anhydrous calcium chloride, decolorized with activated carbon, filtered and then cooled to crystallize. The crystals were dissolved in a mixed solvent of benzene and petroleum ether to which a small amount of chloroacetyl was added, and recrystallization was carried out to obtain Compound C.

MALDI-TOF:635.79; $^{1}H$ NMR (400 MHz, $CDCl_3$) δ 7.54 (s, 4H), 7.22 (s, 2H), 7.07 (d, J=48.0 Hz, 8H), 7.01 (s, 5H), 6.97 (d, J=3.7 Hz, 1H), 6.68-6.26 (m, 1H); $^{13}C$ NMR (100 MHz, $CDCl_3$) δ 141.47 (s), 134.17 (s), 130.51 (s), 128.20 (s), 125.73 (s), 125.48 (s), 67.17 (s).

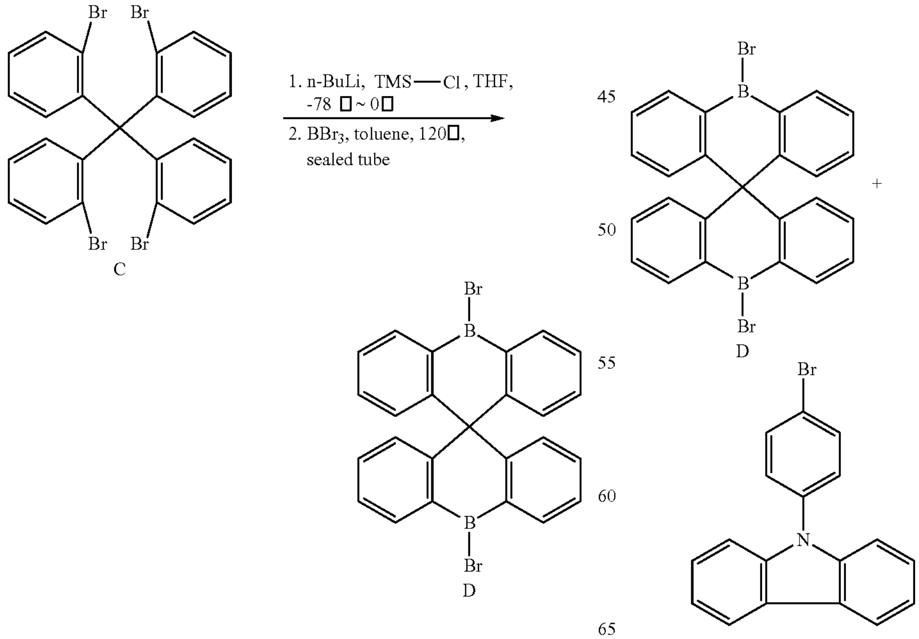

C D D 12.72 g (20 mmol) of Compound C and THF (80 mL) were added and dissolved in a 200 mL three-necked flask and the nitrogen displacement was performed three times, then the temperature was lowered to −78° C. 20 mL (50 mmol) of n-BuLi was added dropwise while the temperature was controlled below −65° C., and then the mixture was stirred for 30 minutes. 4.35 g (40 mmol) of TMS-Cl was added dropwise, and the mixture was heated to 0° C. and reacted for 4 h. After this, the reaction was quenched with ice water. It was extracted with DCM (80 mL×2). The organic phase was collected and distillated by using a rotary evaporator to obtain a light yellow oil, and the light yellow oil was crystallized by using toluene/ethanol to obtain a light yellow solid. 8.47 g (15 mmol) of the light yellow solid, an anhydrous toluene solution (70 mL) and 0.76 mL (8 mmol) of boron tribromide were sequentially added into a 200 mL sealed tube while stirring at 120° C. for 12 h. After the reaction was completed, it was quenched with water (100 mL). The reaction solution was extracted with DCM (100 mL×3). The organic phases were collected, dried and then filtered, and the filtrate was distillated by using a rotary evaporator to remove solvent. Crystallization was performed with DCM/EtOH so as to obtain a white solid, and yield was 75.4%.

MALDI-TOF: 497.98; $^{1}H$ NMR (400 MHz, $CDCl_3$) δ 7.74 (s, 3H), 7.35-7.18 (m, 12H); $^{13}C$ NMR (100 MHz, $CDCl_3$) δ 144.78 (s), 132.15 (s), 125.92 (s), 125.08 (s), 124.06 (s), 118.29 (s).

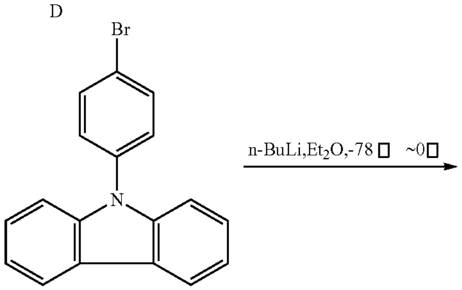

E

-continued

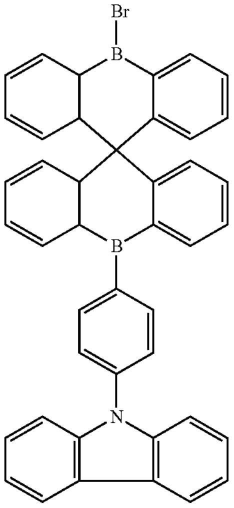

F 9.96 g (20 mmol) of Compound D and 100 mL of diethyl ether were sequentially added into a 250 mL three-necked flask, the nitrogen displacement was performed, and the mixture was stirred. The temperature was cooled to −78° C. by liquid nitrogen, and 9 mL (21.6 mmol) of n-BuLi was added dropwise, and then the mixture was stirred for 30 min. 5.78 mmol of Compound E was dissolved in 60 mL of toluene, and the solution was added dropwise to the reaction system. After the addition of the solution, the mixture was naturally warmed to room temperature and reacted for 6 hours. After the reaction was completed, the reaction was quenched with 60 mL of ice water. The reaction solution was extracted with DCM (100 mL×3) and a saturated aqueous solution of brine (100 mL×2), respectively. The organic phases were distillated by using a rotary evaporator so as to obtain an oil. Recrystallization was carried out with toluene/ethanol so as to obtain a solid F.

MALDI-TOF:633.19; $^{1}H$ NMR (400 MHz, $CDCl_3$) δ 8.33 (dd, J=7.5, 1.5 Hz, 1H), 8.26-8.17 (m, 1H), 7.98 (dd, J=7.4, 1.5 Hz, 1H), 7.92-7.86 (m, 2H), 7.78-7.70 (m, 2H), 7.48 (ddd, J=11.0, 6.2, 1.0 Hz, 2H), 7.43-7.28 (m, 4H), 7.32-7.17 (m, 4H), 7.17 (ddd, J=7.4, 3.9, 1.6 Hz, 6H), 6.55 (ddd, J=10.8, 6.1, 0.9 Hz, 2H), 5.80 (dd, J=10.9, 6.2 Hz, 4H), 2.80 (ddd, J=7.2, 6.1, 1.0 Hz, 2H), 2.00 (ddd, J=7.1, 6.1, 1.0 Hz, 2H); $^{13}C$ NMR (100 MHz, $CDCl_3$) δ 148.88 (s), 148.51 (s), 141.84 (s), 140.56 (s), 133.55 (s), 133.53 (s), 130.11 (s), 129.96 (s), 129.93 (s), 127.88 (s), 127.71 (s), 127.60 (s), 126.67 (s), 126.64 (s), 126.47 (s), 126.29 (s), 126.07 (s), 125.78 (s), 125.74 (s), 125.61 (s), 125.23 (s), 123.83 (s), 123.55 (s), 122.86 (s), 122.43 (s), 121.18 (s), 120.27 (s), 109.75 (s), 50.41 (s), 49.35 (s), 45.00 (s), 42.61 (s), 39.10 (s).

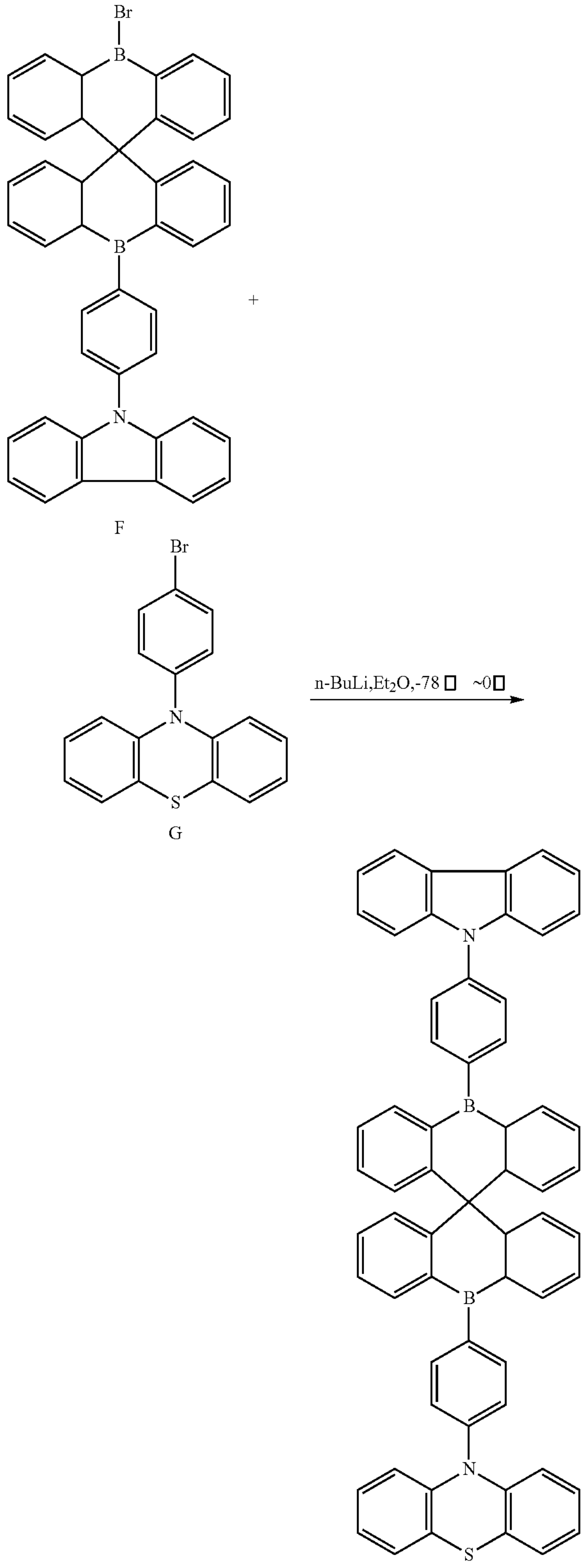

F

+

G

M6

12.66 g (20 mmol) of Compound F and 100 mL of diethyl ether were sequentially added into a 250 mL three-necked flask, the nitrogen displacement was performed, and the mixture was stirred. The temperature was cooled to −78° C. by liquid nitrogen, and 9 mL (21.6 mmol) of n-BuLi was added dropwise, and then the mixture was stirred for 30 min. 7.77 (22 mmol) of Compound G was dissolved in 60 mL of toluene, and the solution was added dropwise to the reaction system. After the addition of the solution, the mixture was naturally warmed to room temperature and reacted for 6 hours. After the reaction was completed, the reaction was quenched with 60 mL of ice water. The reaction solution was extracted with DCM (100 mL×3) and a saturated aqueous solution of brine (100 mL×2), respectively. The organic phases were distillated by using a rotary evaporator so as to obtain an oil. Recrystallization was carried out with toluene/ethanol so as to obtain a solid M6.

MALDI-TOF:858.34; $^1$H NMR (400 MHz, $CDCl_3$) δ 8.08 (ddd, J=23.3, 7.2, 1.9 Hz, 2H), 8.01-7.81 (m, 5H), 7.80-7.67 (m, 6H), 7.66-7.54 (m, 3H), 7.50-7.34 (m, 3H), 7.29-7.21 (m, 2H), 7.22 (ddd, J=5.3, 3.4, 1.7 Hz, 2H), 7.22-7.08 (m, 2H), 7.08-6.93 (m, 2H), 6.75 (dddd, J=21.8, 10.9, 6.2, 1.0 Hz, 2H), 6.61 (td, J=7.4, 2.0 Hz, 1H), 6.52 (dd, J=7.4, 2.1 Hz, 1H), 6.42-6.18 (m, 3H), 6.06 (dd, J=10.9, 6.2 Hz, 1H), 5.82 (ddd, J=13.0, 10.9, 6.2 Hz, 3H), 3.00-2.88 (m, 2H), 0.85-0.72 (m, 2H); $^{13}$C NMR (100 MHz, $CDCl_3$) δ 148.88 (s), 143.12 (s), 140.56 (s), 133.83 (s), 133.55 (s), 130.11 (s), 129.93 (s), 127.88 (s), 127.71 (s), 127.29 (s), 126.84 (s), 126.67 (s), 126.47 (s), 126.29 (s), 126.07 (s), 125.78 (s), 125.61 (s), 125.33 (s), 123.55 (s), 123.49 (s), 123.39 (s), 122.86 (s), 121.18 (s), 120.27 (s), 116.90 (s), 109.75 (s), 50.41 (s), 42.61 (s).

Example 3

Synthesis of Compound M7

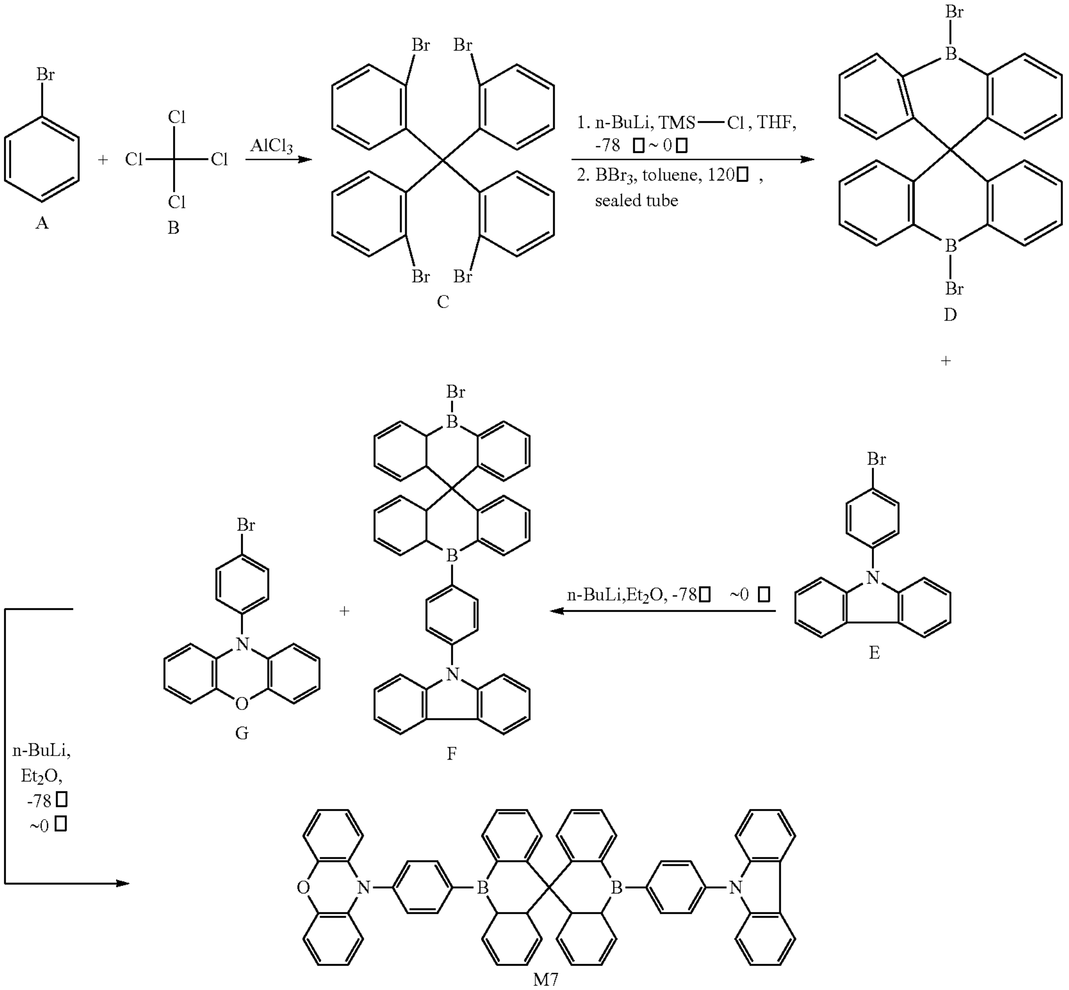

M7

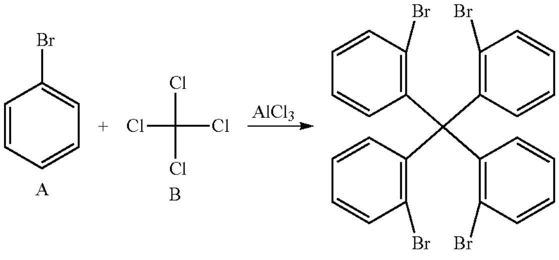

C 12.48 g (80 mmol) of Compound A was added into a 200 mL three-necked flask. 0.5 g of anhydrous aluminum trichloride was then added to Compound A and stirred thoroughly. 3.08 g (20 mmol) of dried compound B was added in batches at 30-40° C. while stirring until the reaction no longer released heat under continuous stirring, the temperature was kept with the steam at 70-80° C. The mixture was refluxed until hydrogen chloride escape was slight. 20 mL of hydrochloric acid (6 mol/L) was added to and sufficiently mixed with benzene. The mixture was added in batches with vigorous stirring to carry out hydrolysis reaction while the hydrolysis temperature was controlled below 40° C. A benzene layer was separated. An aqueous layer was diluted with ice water, and then extracted with benzene several times. The extracted solution was combined, dried with anhydrous calcium chloride, decolorized with activated carbon, filtered and then cooled to crystallize. The crystals were dissolved in a mixed solvent of benzene and petroleum ether to which a small amount of chloroacetyl was added, and recrystallization was carried out to obtain Compound C.

MALDI-TOF: 635.79; $^{1}H$ NMR (400 MHz, $CDCl_3$) δ 7.54 (s, 4H), 7.22 (s, 2H), 7.07 (d, J=48.0 Hz, 8H), 7.01 (s, 5H), 6.97 (d, J=3.7 Hz, 1H), 6.68-6.26 (m, 1H); $^{13}C$ NMR (100 MHz, $CDCl_3$) δ 141.47 (s), 134.17 (s), 130.51 (s), 128.20 (s), 125.73 (s), 125.48 (s), 67.17 (s).

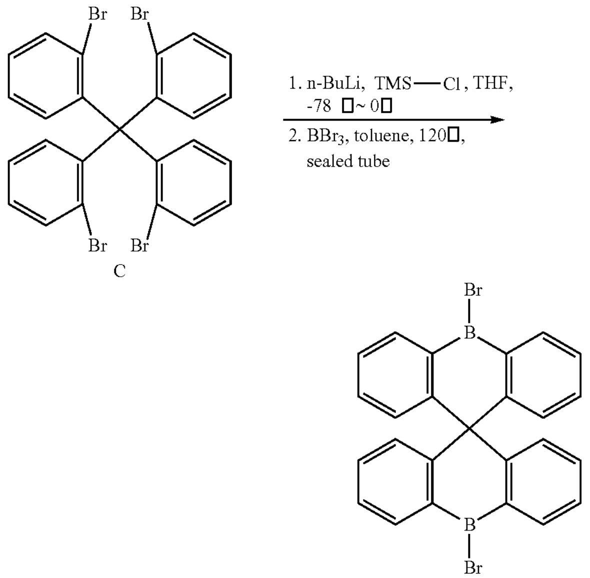

C

D 12.72 g (20 mmol) of substrate C and THF (80 mL) were added and dissolved in a 200 mL three-necked flask, the nitrogen displacement was performed three times, and then the temperature of the mixture was lowered to −78° C. 20 mL (50 mmol) of n-BuLi was added dropwise while the temperature was controlled below −65° C., and then the mixture was stirred for 30 minutes. 4.35 g (40 mmol) of TMS-Cl was added dropwise, and the mixture was heated to 0° C. and reacted for 4 h. Then the reaction was quenched with ice water. It was extracted with DCM (80 mL×2). The organic phases were collected and distillated by using a rotary evaporator to obtain a light yellow oil, and the light yellow oil was crystallized by using toluene/ethanol to obtain a light yellow solid. 8.47 g (15 mmol) of the light yellow solid, an anhydrous toluene solution (70 mL) and 0.76 mL (8 mmol) of boron tribromide were sequentially added into a 200 mL sealed tube while stirring at 120° C. for 12 h. After the reaction was completed, it was quenched with water (100 mL). The reaction solution was extracted with DCM (100 mL×3). The organic phases were collected, dried and then filtered, and the filtrate was distillated by using a rotary evaporator to remove solvent. Crystallization was carried out with DCM/EtOH so as to obtain a white solid, and yield was 75.4%.

MALDI-TOF: 497.98; $^{1}H$ NMR (400 MHz, $CDCl_3$) δ 7.74 (s, 3H), 7.35-7.18 (m, 12H); $^{13}C$ NMR (100 MHz, $CDCl_3$) δ 144.78 (s), 132.15 (s), 125.92 (s), 125.08 (s), 124.06 (s), 118.29 (s).

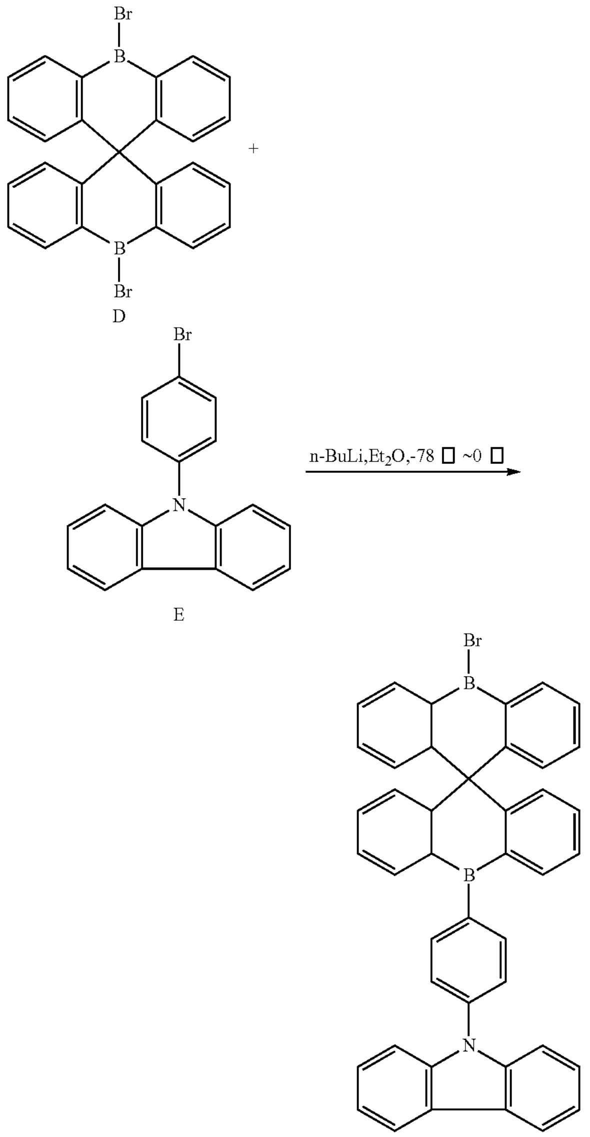

D

E

F 9.96 g (20 mmol) of Compound D and 100 mL of diethyl ether were sequentially added into a 250 mL three-necked flask, the nitrogen displacement was performed, and the mixture was stirred. The temperature was cooled to −78° C. by liquid nitrogen, and 9 mL (21.6 mmol) of n-BuLi was added dropwise, and then the mixture was stirred for 30 min. 5.78 (mmol) of Compound E was dissolved in 60 mL of toluene, and the solution was added dropwise to the reaction system. After the addition of the solution, the mixture was naturally warmed to room temperature and reacted for 6 hours. After the reaction was completed, the reaction was quenched with 60 mL of ice water. The reaction solution was extracted with DCM (100 mL×3) and a saturated aqueous solution of brine (100 mL×2), respectively. The organic phases were distillated by using a rotary evaporator so as to obtain an oil. Recrystallization was carried out with toluene/ethanol so as to obtain a solid F.

MALDI-TOF: 633.19; $^{1}$H NMR (400 MHz, $CDCl_3$) δ 8.33 (dd, J=7.5, 1.5 Hz, 1H), 8.26-8.17 (m, 1H), 7.98 (dd, J=7.4, 1.5 Hz, 1H), 7.92-7.86 (m, 2H), 7.78-7.70 (m, 2H), 7.48 (ddd, J=11.0, 6.2, 1.0 Hz, 2H), 7.43-7.28 (m, 4H), 7.32-7.17 (m, 4H), 7.17 (ddd, J=7.4, 3.9, 1.6 Hz, 6H), 6.55 (ddd, J=10.8, 6.1, 0.9 Hz, 2H), 5.80 (dd, J=10.9, 6.2 Hz, 4H), 2.80 (ddd, J=7.2, 6.1, 1.0 Hz, 2H), 2.00 (ddd, J=7.1, 6.1, 1.0 Hz, 2H); $^{13}$C NMR (100 MHz, $CDCl_3$) δ 148.88 (s), 148.51 (s), 141.84 (s), 140.56 (s), 133.55 (s), 133.53 (s), 130.11 (s), 129.96 (s), 129.93 (s), 127.88 (s), 127.71 (s), 127.60 (s), 126.67 (s), 126.64 (s), 126.47 (s), 126.29 (s), 126.07 (s), 125.78 (s), 125.74 (s), 125.61 (s), 125.23 (s), 123.83 (s), 123.55 (s), 122.86 (s), 122.43 (s), 121.18 (s), 120.27 (s), 109.75 (s), 50.41 (s), 49.35 (s), 45.00 (s), 42.61 (s),
39.10 (s).

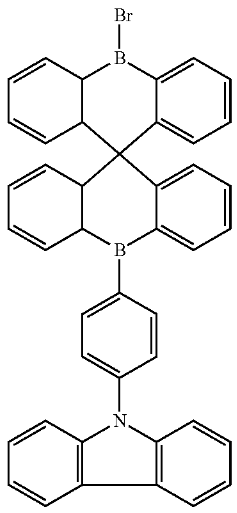

F

+

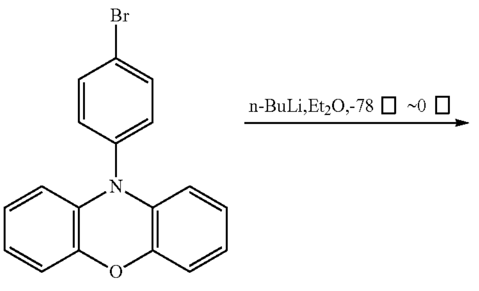

G

-continued

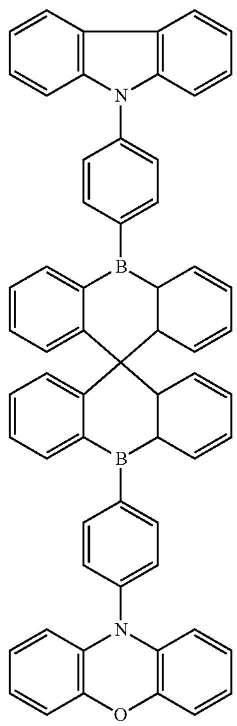

M7

12.66 g (20 mmol) of Compound F and 100 mL of diethyl ether were sequentially added into a 250 mL three-necked flask, and the nitrogen displacement was performed, and the mixture was stirred. The temperature was cooled to −78° C. by liquid nitrogen, and 9 mL (21.6 mmol) of n-BuLi was added dropwise, and then the mixture was stirred for 30 min. 7.41 g (22 mmol) of Compound G was dissolved in 60 mL of toluene, and the solution was added dropwise to the reaction system. After the addition of the solution, the mixture was naturally warmed to room temperature and reacted for 6 hours. After the reaction was completed, the reaction was quenched with 60 mL of ice water. The reaction solution was extracted with DCM (100 mL×3) and a saturated aqueous solution of brine (100 mL×2), respectively. The organic phases were distillated by using a rotary evaporator so as to obtain an oil. Recrystallization was carried out with toluene/ethanol so as to obtain a solid M7.

MALDI-TOF: 842.36; $^{1}$H NMR (400 MHz, $CDCl_3$) δ 8.08 (ddd, J=23.3, 7.1, 1.9 Hz, 2H), 7.93-7.80 (m, 4H), 7.80-7.66 (m, 6H), 7.67-7.60 (m, 2H), 7.50-7.34 (m, 3H), 7.30-7.16 (m, 6H), 7.20-7.07 (m, 1H), 6.99-6.87 (m, 3H), 6.75 (dddd, J=19.1, 10.9, 6.1, 1.0 Hz, 2H), 6.62 (td, J=7.5, 2.1 Hz, 1H), 6.53 (dd, J=7.4, 2.1 Hz, 1H), 6.42-6.18 (m, 3H), 6.06 (dd, J=10.9, 6.2 Hz, 1H), 5.82 (ddd, J=13.2, 10.9, 6.2 Hz, 3H), 3.00-2.88 (m, 2H), 0.85-0.71 (m, 2H); $^{13}$C NMR (100 MHz, $CDCl_3$) δ 148.88 (s), 141.59 (s), 140.56 (s), 134.16 (s), 133.83 (s), 133.55 (s), 130.11 (s), 129.93 (s), 127.88 (s), 127.71 (s), 126.67 (s), 126.47 (s), 126.29 (s), 126.07 (s), 125.78 (s), 125.61 (s), 125.33 (s), 123.55 (s), 123.21 (s), 122.86 (s), 121.59 (s), 121.18 (s), 120.27 (s), 115.41 (s), 113.31 (s), 109.75 (s), 50.41 (s), 42.61 (s).

Example 4

Synthesis of Compound M8

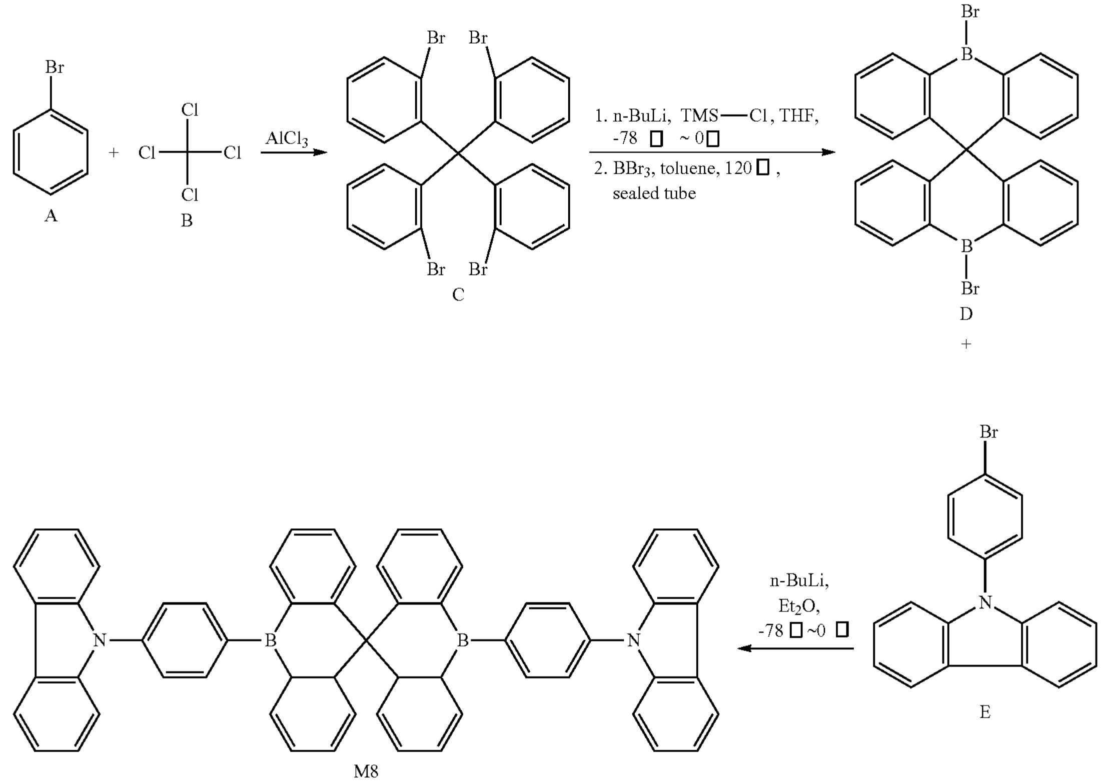

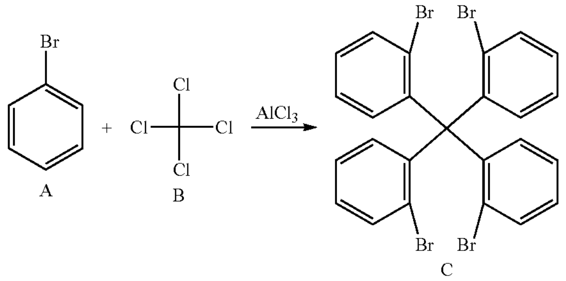

12.48 g (80 mmol) of Compound A was added into a 200 mL three-necked flask. 0.5 g of anhydrous aluminum trichloride was then added to Compound A and stirred thoroughly. 3.08 g (20 mmol) of dried compound B was added in batches at 30-40° C. while stirring until the reaction no longer released heat under continuous stirring, and the temperature was kept with the steam at 70-80° C. The mixture was refluxed until hydrogen chloride escape was slight. 20 mL of hydrochloric acid (6 mol/L) was added to and sufficiently mixed with benzene. The mixture was added in batches with vigorous stirring to carry out hydrolysis reaction while the hydrolysis temperature was controlled below 40° C. The benzene layer was separated. The aqueous layer was diluted with ice water, and then extracted with benzene several times. The extracted solution was combined, dried with anhydrous calcium chloride, decolorized with activated carbon, filtered and then cooled to crystallize. The crystals were dissolved in a mixed solvent of benzene and petroleum ether to which a small amount of chloroacetyl was added, and recrystallization was carried out to obtain Compound C.

MALDI-TOF: 635.79; $^{1}H$ NMR (400 MHz, $CDCl_3$) δ 7.54 (s, 4H), 7.22 (s, 2H), 7.07 (d, J=48.0 Hz, 8H), 7.01 (s, 5H), 6.97 (d, J=3.7 Hz, 1H), 6.68-6.26 (m, 1H); $^{13}C$ NMR (100 MHz, $CDCl_3$) δ 141.47 (s), 134.17 (s), 130.51 (s), 128.20 (s), 125.73 (s), 125.48 (s), 67.17 (s).

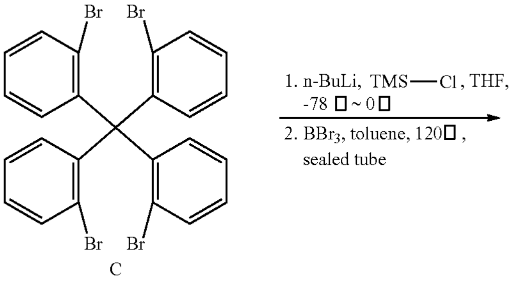

-continued

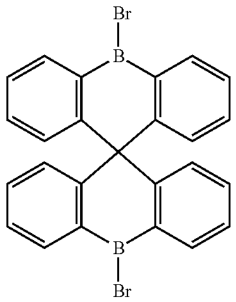

D 12.72 g (20 mmol) of substrate C and THF (80 mL) were added and dissolved in a 200 mL three-necked flask and the nitrogen displacement was performed three times, then the temperature of the mixture was lowered to −78° C., 20 mL (50 mmol) of n-BuLi was added dropwise while the temperature was controlled below −65° C., and then the mixture was stirred for 30 minutes. 4.35 g (40 mmol) of TMS-Cl was added dropwise, and the mixture was heated to 0° C. and reacted for 4 h. Then, the reaction was quenched with ice water, and the mixture was extracted with DCM (80 mL×2). The organic phases were collected and distillated by using a rotary evaporator to obtain a light yellow oil, and the light yellow oil was crystallized by using toluene/ethanol to obtain a light yellow solid. 8.47 g (15 mmol) of the light yellow solid, an anhydrous toluene solution (70 mL) and 0.76 mL (8 mmol) of boron tribromide were sequentially added into a 200 mL sealed tube while stirring at 120° C. for 12 h. After the reaction was completed, it was quenched with water (100 mL). The reaction solution was extracted with DCM (100 mL×3). The organic phases were collected, dried and then filtered, and the filtrate was distillated by using a rotary evaporator to remove solvent. Crystallization was carried out with DCM/EtOH so as to obtain a white solid, and yield was 75.4%.

MALDI-TOF: 497.98; $^{1}$H NMR (400 MHz, $CDCl_3$) δ 7.74 (s, 3H), 7.35-7.18 (m, 12H); $^{13}$C NMR (100 MHz, $CDCl_3$) δ 144.78 (s), 132.15 (s), 125.92 (s), 125.08 (s), 124.06 (s), 118.29 (s).

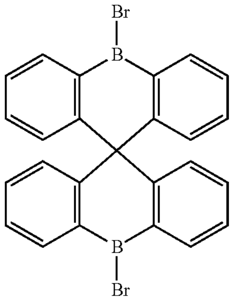

D

+

-continued

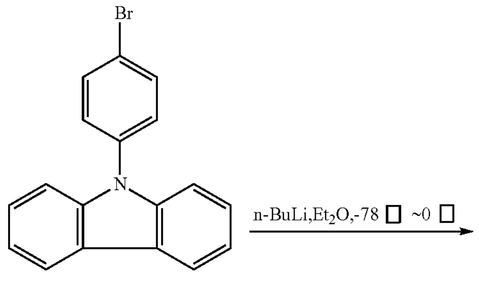

E

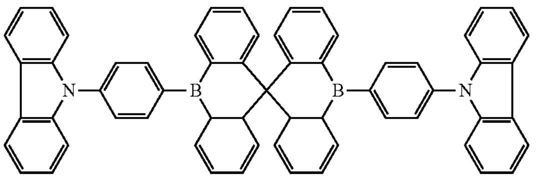

M8

9.96 g (20 mmol) of Compound D and 100 mL of diethyl ether were sequentially added into a 250 mL three-necked flask, the nitrogen displacement was performed, and the mixture was stirred. The temperature was cooled to −78° C. by liquid nitrogen, 9 mL (21.6 mmol) of n-BuLi was added dropwise, and then the mixture was stirred for 30 min. 14.15 g (42 mmol) of Compound E was dissolved in 60 mL of toluene, and the solution was added dropwise to the reaction system. After the addition of the solution, the mixture was naturally warmed to room temperature and reacted for 6 hours. After the reaction was completed, the reaction was quenched with 60 mL of ice water. The reaction solution was extracted with DCM (100 mL×3) and a saturated aqueous solution of brine (100 mL×2), respectively. The organic phases were distillated by using a rotary evaporator so as to obtain an oil. Recrystallization was carried out with toluene/ethanol so as to obtain a solid M8.

MALDI-TOF: 826.37; $^{1}$H NMR (400 MHz, $CDCl_3$) δ 8.35 (ddd, J=23.2, 7.2, 1.9 Hz, 2H), 8.06 (ddd, J=7.4, 5.7, 1.5 Hz, 1H), 7.88 (d, J=1.4 Hz, 4H), 7.81-7.70 (m, 2H), 7.59 (dt, J=7.2, 1.9 Hz, 1H), 7.46-7.26 (m, 6H), 6.70 (dddd, J=10.7, 9.5, 6.2, 1.0 Hz, 1H), 6.32-6.18 (m, 1H), 5.89-5.75 (m, 2H), 3.11 (t, J=6.6 Hz, 1H), 0.87-0.78 (m, 1H); $^{13}$C NMR (100 MHz, $CDCl_3$) δ 140.56 (s), 133.55 (s), 133.53 (s), 130.11 (s), 129.93 (s), 127.88 (s), 127.71 (s), 126.67 (s), 126.47 (s), 126.29 (s), 126.07 (s), 125.78 (s), 125.61 (s), 123.55 (s), 122.86 (s), 121.18 (s), 120.27 (s), 109.75 (s), 50.41 (s), 42.61 (s).

Example 5

Synthesis of Compound M10

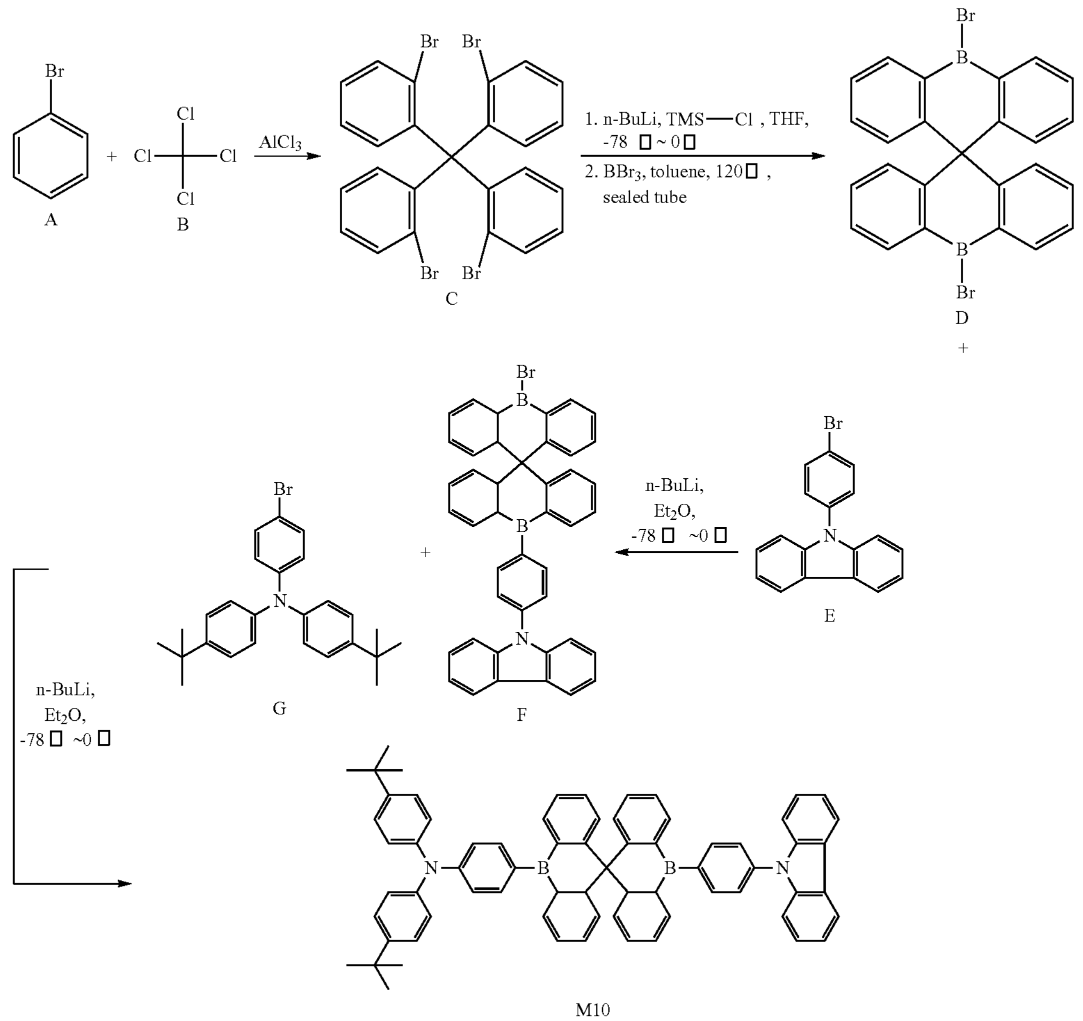

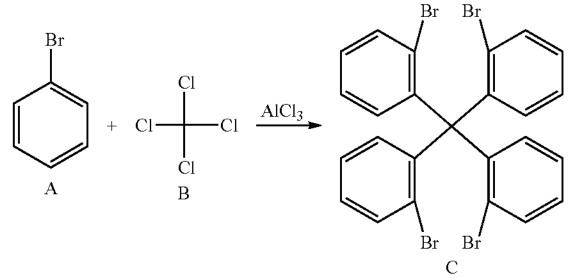

12.48 g (80 mmol) of Compound A was added into a 200 mL three-necked flask. 0.5 g of anhydrous aluminum trichloride was then added to Compound A and stirred thoroughly. 3.08 g (20 mmol) of dried compound B was added in batches at 30-40° C. while stirring until the reaction no longer released heat under continuous stirring, and the temperature was kept with the steam at 70-80° C. The mixture was refluxed until hydrogen chloride escape was slight. 20 mL of hydrochloric acid (6 mol/L) was added to and sufficiently mixed with benzene. The mixture was added in batches with vigorous stirring to carry out hydrolysis reaction while the hydrolysis temperature was controlled below 40° C. The benzene layer was separated. The aqueous layer was diluted with ice water, and then extracted with benzene several times. The extracted solution was collected, dried with anhydrous calcium chloride, decolorized with activated carbon, filtered and then cooled to crystallize. The crystals were dissolved in a mixed solvent of benzene and petroleum ether to which a small amount of chloroacetyl was added, and recrystallization was carried out to obtain Compound C.

MALDI-TOF: 635.79; $^{1}H$ NMR (400 MHz, $CDCl_3$) δ 7.54 (s, 4H), 7.22 (s, 2H), 7.07 (d, J=48.0 Hz, 8H), 7.01 (s, 5H), 6.97 (d, J=3.7 Hz, 1H), 6.68-6.26 (m, 1H); $^{13}C$ NMR (100 MHz, $CDCl_3$) δ 141.47 (s), 134.17 (s), 130.51 (s), 128.20 (s), 125.73 (s), 125.48 (s), 67.17 (s).

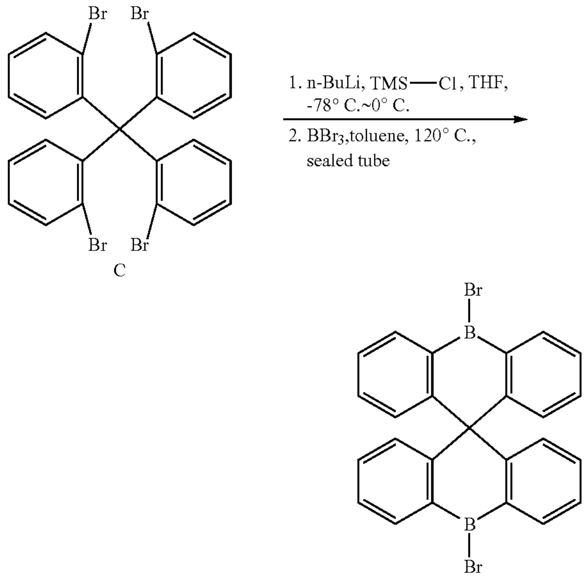

C

D 12.72 g (20 mmol) of substrate C and THF (80 mL) were added and dissolved in a 200 mL three-necked flask, the nitrogen displacement was performed three times, then the temperature of the mixture was lowered to −78° C., 20 mL (50 mmol) of n-BuLi was added dropwise while the temperature was controlled below −65° C., and then the mixture was stirred for 30 minutes. Next, 4.35 g (40 mmol) of TMS-Cl was added dropwise, and the mixture was heated to 0° C. and reacted for 4 h. After this, the reaction was quenched with ice water. It was extracted with DCM (80 mL×2). An organic phase was collected and distillated by using a rotary evaporator to obtain a light yellow oil, and the light yellow oil was crystallized by using toluene/ethanol to obtain a light yellow solid. 8.47 g (15 mmol) of the light yellow solid, an anhydrous toluene solution (70 mL) and 0.76 mL (8 mmol) of boron tribromide were sequentially added into a 200 mL sealed tube while stirring at 120° C. for 12 h. After the reaction was completed, it was quenched with water (100 mL). The reaction solution was extracted with DCM (100 mL×3). An organic phase was collected, dried and then filtered, and a filtrate was distillated by using a rotary evaporator to remove solvent. Crystallization was carried out with DCM/EtOH so as to obtain a white solid, and yield was 75.4%.

MALDI-TOF: 497.98; $^1H$ NMR (400 MHz, $CDCl_3$) δ 7.74 (s, 3H), 7.35-7.18 (m, 12H); $^{13}C$ NMR (100 MHz, $CDCl_3$) δ 144.78 (s), 132.15 (s), 125.92 (s), 125.08 (s), 124.06 (s), 118.29 (s).

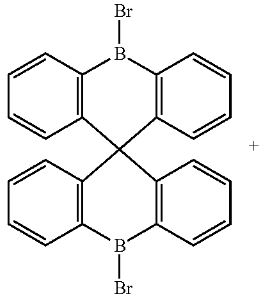

D

+

-continued

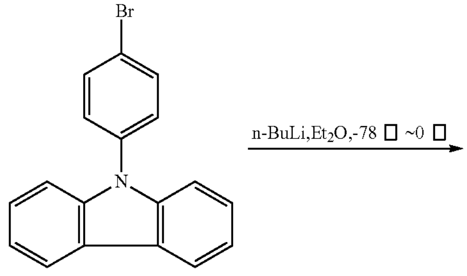

E

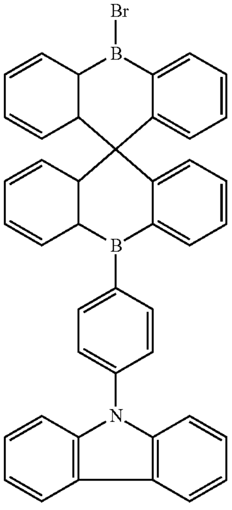

F 9.96 g (20 mmol) of Compound D and 100 mL of diethyl ether were sequentially added into a 250 mL three-necked flask, the nitrogen displacement was performed, and the mixture was stirred. The temperature was cooled to −78° C. by liquid nitrogen, and 9 mL (21.6 mmol) of n-BuLi was added dropwise, and then the mixture was stirred for 30 min. 5.78 (mmol) of Compound E was dissolved in 60 mL of toluene, and the solution was added dropwise to the reaction system. After the addition of the solution, the mixture was naturally warmed to room temperature and reacted for 6 hours. After the reaction was completed, the reaction was quenched with 60 mL of ice water. The reaction solution was extracted with DCM (100 mL×3) and a saturated aqueous solution of brine (100 mL×2), respectively. The organic phases were distillated by using a rotary evaporator so as to obtain an oil. Recrystallization was carried out with toluene/ethanol so as to obtain a solid F.

MALDI-TOF: 633.19; $^{1}H$ NMR (400 MHz, $CDCl_3$) δ 8.33 (dd, J=7.5, 1.5 Hz, 1H), 8.26-8.17 (m, 1H), 7.98 (dd, J=7.4, 1.5 Hz, 1H), 7.92-7.86 (m, 2H), 7.78-7.70 (m, 2H), 7.48 (ddd, J=11.0, 6.2, 1.0 Hz, 2H), 7.43-7.28 (m, 4H), 7.32-7.17 (m, 4H), 7.17 (ddd, J=7.4, 3.9, 1.6 Hz, 6H), 6.55 (ddd, J=10.8, 6.1, 0.9 Hz, 2H), 5.80 (dd, J=10.9, 6.2 Hz, 4H), 2.80 (ddd, J=7.2, 6.1, 1.0 Hz, 2H), 2.00 (ddd, J=7.1, 6.1, 1.0 Hz, 2H); $^{13}C$ NMR (100 MHz, $CDCl_3$) δ 148.88 (s), 148.51 (s), 141.84 (s), 140.56 (s), 133.55 (s), 133.53 (s), 130.11 (s), 129.96 (s), 129.93 (s), 127.88 (s), 127.71 (s), 127.60 (s), 126.67 (s), 126.64 (s), 126.47 (s), 126.29 (s), 126.07 (s), 125.78 (s), 125.74 (s), 125.61 (s), 125.23 (s), 123.83 (s), 123.55 (s), 122.86 (s), 122.43 (s), 121.18 (s), 120.27 (s), 109.75 (s), 50.41 (s), 49.35 (s), 45.00 (s), 42.61 (s), 39.10 (s).

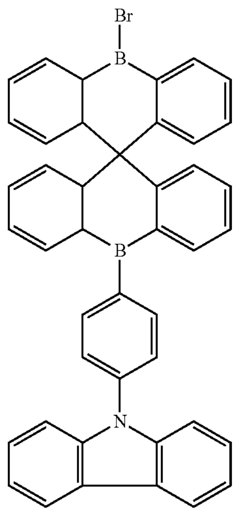

F

+

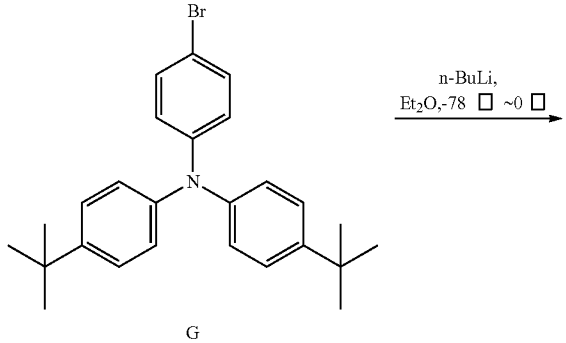

G

-continued

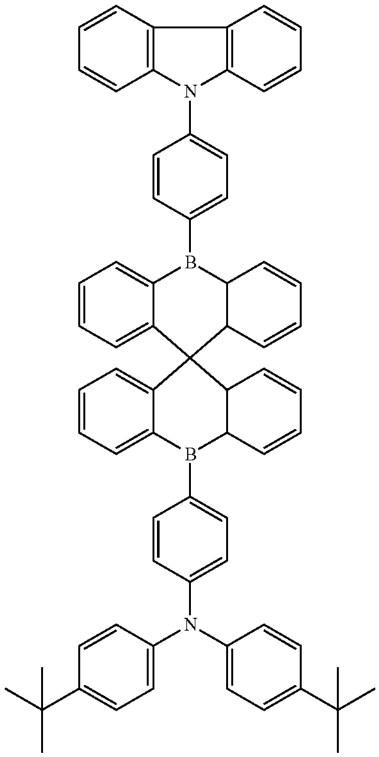

M10

12.66 g (20 mmol) of Compound F and 100 mL of diethyl ether were sequentially added into a 250 mL three-necked flask, and the nitrogen displacement was performed, and the mixture was stirred. The temperature was cooled to −78° C. by liquid nitrogen, 9 mL (21.6 mmol) of n-BuLi was added dropwise, and then the mixture was stirred for 30 min. 9.57 (22 mmol) of Compound G was dissolved in 60 mL of toluene, and the solution was added dropwise to the reaction system. After the addition of the solution, the mixture was naturally warmed to room temperature and reacted for 6 hours. After the reaction was completed, the reaction was quenched with 60 mL of ice water. The reaction solution was extracted with DCM (100 mL×3) and a saturated aqueous solution of brine (100 mL×2), respectively. The organic phases were distillated by using a rotary evaporator so as to obtain an oil. Recrystallization was carried out with toluene/ethanol so as to obtain a solid M10.

MALDI-TOF: 940.51; $^{1}H$ NMR (400 MHz, $CDCl_3$) δ 8.35 (ddd, J=24.4, 7.2, 1.7 Hz, 1H), 7.93-7.83 (m, 2H), 7.79-7.67 (m, 3H), 7.56 (td, J=7.2, 2.6 Hz, 1H), 7.45-7.18 (m, 6H), 7.22-7.03 (m, 3H), 6.77-6.64 (m, 1H), 6.23 (dddd, J=11.0, 7.4, 6.2, 1.0 Hz, 1H), 5.82 (ddd, J=15.5, 11.1, 6.0 Hz, 2H), 3.14-3.04 (m, 1H), 1.28 (s, 10H), 0.86-0.75 (m, 1H); $^{13}C$ NMR (100 MHz, $CDCl_3$) δ 148.88 (s), 144.83 (s), 144.49 (s), 140.56 (s), 133.63 (s), 133.55 (s), 133.53 (s), 130.11 (s), 129.93 (s), 127.88 (s), 127.71 (s), 126.67 (s), 126.47 (s), 126.40 (s), 126.29 (s), 126.07 (s), 125.78 (s), 125.61 (s), 124.14 (s), 124.00 (s), 123.55 (s), 122.86 (s), 121.18 (s), 120.27 (s), 109.75 (s), 50.41 (s), 42.61 (s), 34.67 (s), 31.09 (s).

Example 6

Synthesis of Compound M12

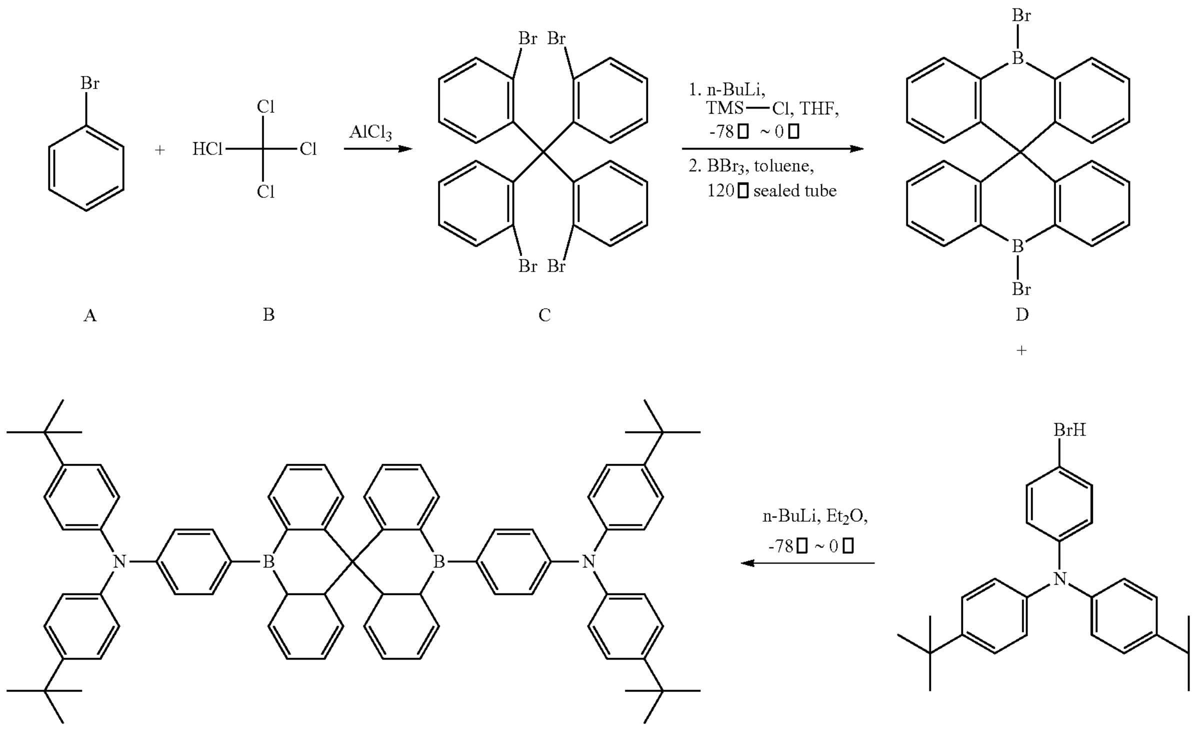

A B C D

\+

M12 E

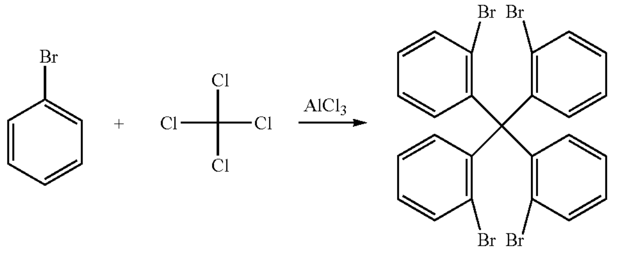

A B C 12.48 g (80 mmol) of Compound A was added into a 200 mL three-necked flask. 0.5 g of anhydrous aluminum trichloride was then added to Compound A and stirred thoroughly. 3.08 g (20 mmol) of dried compound B was added in batches at 30-40° C. while stirring until the reaction no longer released heat under continuous stirring, and the temperature was kept with the steam at 70-80° C. The mixture was refluxed until hydrogen chloride escape was slight. 20 mL of hydrochloric acid (6 mol/L) was added to and sufficiently mixed with benzene. The mixture was added in batches with vigorous stirring to carry out hydrolysis reaction while the hydrolysis temperature was controlled below 40° C. The benzene layer was separated. The aqueous layer was diluted with ice water, and then extracted with benzene several times. The extracted solution was collected, dried with anhydrous calcium chloride, decolorized with activated carbon, filtered and then cooled to crystallize. The crystals were dissolved in a mixed solvent of benzene and petroleum ether to which a small amount of chloroacetyl was added, and recrystallization was carried out to obtain Compound C.

MALDI-TOF: 635.79; $^1H$ NMR (400 MHz, $CDCl_3$) δ 7.54 (s, 4H), 7.22 (s, 2H), 7.07 (d, J=48.0 Hz, 8H), 7.01 (s, 5H), 6.97 (d, J=3.7 Hz, 1H), 6.68-6.26 (m, 1H); $^{13}C$ NMR (100 MHz, $CDCl_3$) δ 141.47 (s), 134.17 (s), 130.51 (s), 128.20 (s), 125.73 (s), 125.48 (s), 67.17 (s).

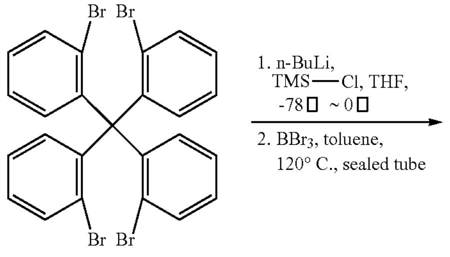

C

-continued

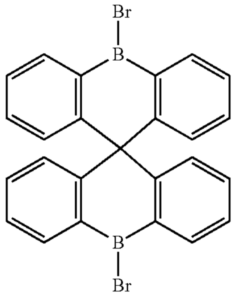

D 12.72 g (20 mmol) of substrate C and THF (80 mL) were added and dissolved in a 200 mL three-necked flask, the nitrogen displacement was performed three times, and then the temperature of the mixture was lowered to −78° C., 20 mL (50 mmol) of n-BuLi was added dropwise while the temperature was controlled below −65° C., and then the mixture was stirred for 30 minutes. 4.35 g (40 mmol) of TMS-Cl was added dropwise, and the mixture was heated to 0° C. and reacted for 4 h. After this, the reaction was quenched with ice water. It was extracted with DCM (80 mL×2). The organic phases were collected and distillated by using a rotary evaporator to obtain a light yellow oil, and the light yellow oil was crystallized by using toluene/ethanol to obtain a light yellow solid. 8.47 g (15 mmol) of the light yellow solid, an anhydrous toluene solution (70 mL) and 0.76 mL (8 mmol) of boron tribromide were sequentially added into a 200 mL sealed tube while stirring at 120° C. for 12 h. After the reaction was completed, it was quenched with water (100 mL). The reaction solution was extracted with DCM (100 mL×3). The organic phase was collected, dried and then filtered, and the filtrate was distillated by using a rotary evaporator to remove solvent. Crystallization was carried out with DCM/EtOH so as to obtain a white solid, and yield was 75.4%.

MALDI-TOF: 497.98; $^1$H NMR (400 MHz, $CDCl_3$) δ 7.74 (s, 3H), 7.35-7.18 (m, 12H); $^{13}$C NMR (100 MHz, $CDCl_3$) δ 144.78 (s), 132.15 (s), 125.92 (s), 125.08 (s), 124.06 (s), 118.29 (s).

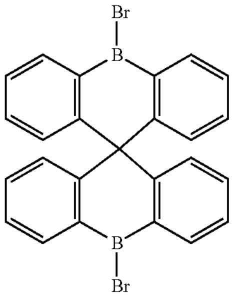

D

+

-continued

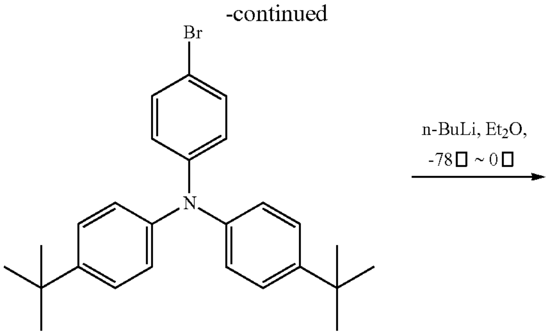

E

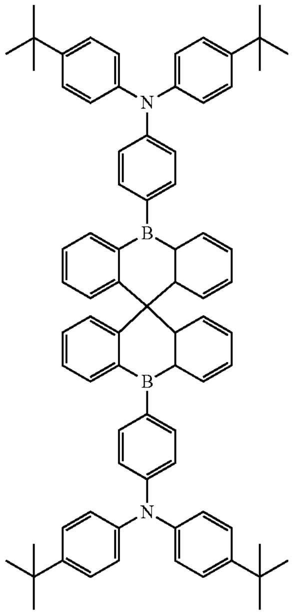

M12

9.96 g (20 mmol) of Compound D and 100 mL of diethyl ether were sequentially added into a 250 mL three-necked flask, the nitrogen displacement was performed, and the mixture was stirred. The temperature was cooled to −78° C. by liquid nitrogen, 9 mL (21.6 mmol) of n-BuLi was added dropwise, and then the mixture was stirred for 30 min. 18.28 g (42 mmol) of Compound E was dissolved in 60 mL of toluene, and the solution was added dropwise to the reaction system. After the addition of the solution, the mixture was naturally warmed to room temperature and reacted for 6 hours. After the reaction was completed, the reaction was quenched with 60 mL of ice water. The reaction solution was extracted with DCM (100 mL×3) and a saturated aqueous solution of brine (100 mL×2), respectively. The organic phases were distillated by using a rotary evaporator so as to obtain an oil. Recrystallization was carried out with toluene/ethanol so as to obtain a solid M12.

MALDI-TOF: 1054.65; $^1$H NMR (400 MHz, $CDCl_3$) δ 7.79-7.67 (m, 3H), 7.58-7.49 (m, 1H), 7.35 (ddt, J=6.0, 4.7, 2.2 Hz, 2H), 7.27-7.02 (m, 10H), 6.69 (dddd, J=11.0, 8.9, 6.2, 1.0 Hz, 1H), 6.22 (dddd, J=11.1, 6.2, 5.0, 0.9 Hz, 1H), 5.87-5.75 (m, 2H), 3.06 (tdd, J=6.2, 2.4, 1.0 Hz, 1H), 1.28 (s, 20H), 0.83-0.74 (m, 1H); $^{13}$C NMR (100 MHz, $CDCl_3$) δ 144.83 (s), 144.49 (s), 133.63 (s), 133.55 (s), 130.11 (s), 129.93 (s), 127.88 (s), 127.71 (s), 126.67 (s), 126.47 (s), 126.40 (s), 126.07 (s), 125.78 (s), 125.61 (s), 124.14 (s), 124.00 (s), 50.41 (s), 42.61 (s), 34.67 (s), 31.09 (s).

Example 7

Synthesis of Compound M21

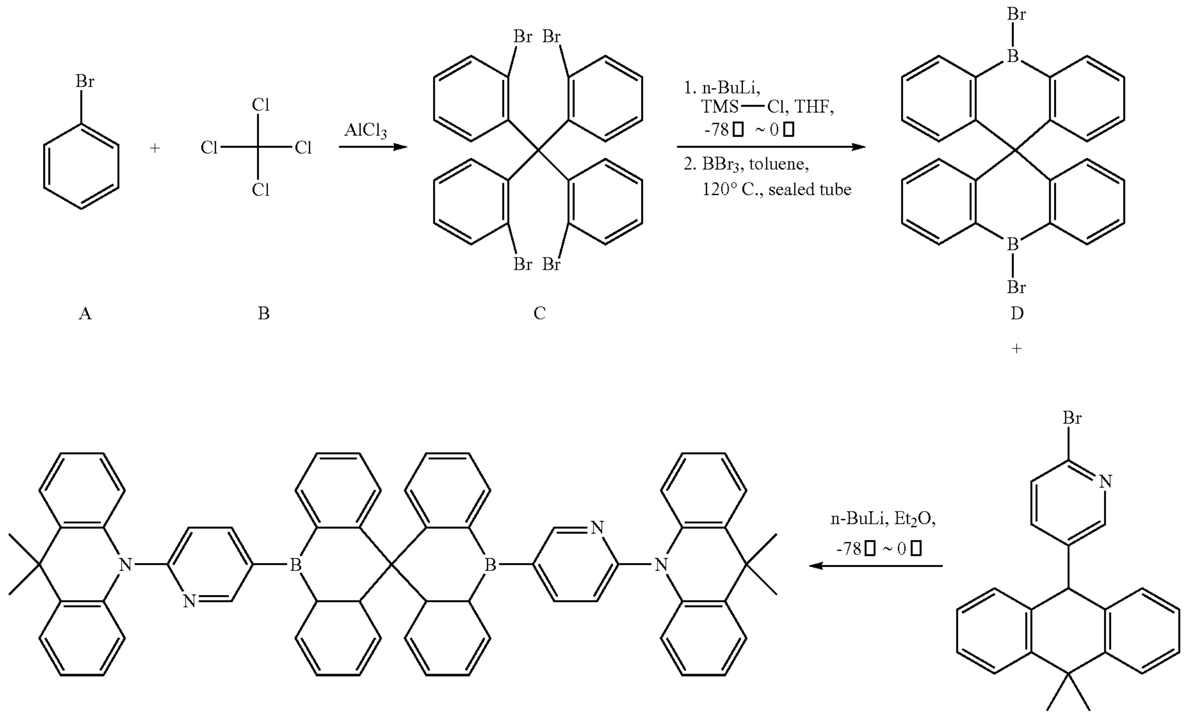

A B C D

\+

M21 E

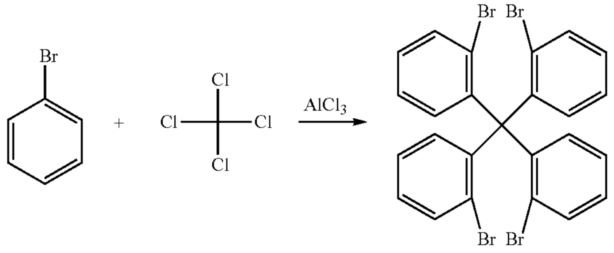

A B C 12.48 g (80 mmol) of Compound A was added into a 200 mL three-necked flask. 0.5 g of anhydrous aluminum trichloride was then added to Compound A and stirred thoroughly. 3.08 g (20 mmol) of dried compound B was added in batches at 30-40° C. while stirring until the reaction no longer released heat under continuous stirring, and the temperature was kept with the steam at 70-80° C. The mixture was refluxed until hydrogen chloride escape was slight. 20 mL of hydrochloric acid (6 mol/L) was added to and sufficiently mixed with benzene. The mixture was added in batches with vigorous stirring to carry out hydrolysis reaction while the hydrolysis temperature was controlled below 40° C. The benzene layer was separated. The aqueous layer was diluted with ice water, and then extracted with benzene several times. The extracted solution was collected, dried with anhydrous calcium chloride, decolorized with activated carbon, filtered and then cooled to crystallize. The crystals were dissolved in a mixed solvent of benzene and petroleum ether to which a small amount of chloroacetyl was added, and recrystallization was carried out to obtain Compound C.

MALDI-TOF: 635.79; $^1$H NMR (400 MHz, $CDCl_3$) δ 7.54 (s, 4H), 7.22 (s, 2H), 7.07 (d, J=48.0 Hz, 8H), 7.01 (s, 5H), 6.97 (d, J=3.7 Hz, 1H), 6.68-6.26 (m, 1H); $^{13}$C NMR (100 MHz, $CDCl_3$) δ 141.47 (s), 134.17 (s), 130.51 (s), 128.20 (s), 125.73 (s), 125.48 (s), 67.17 (s).

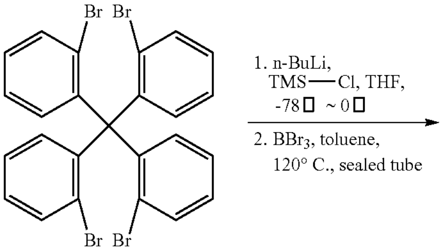

C

-continued

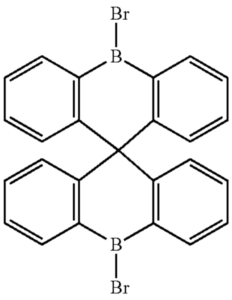

D

-continued

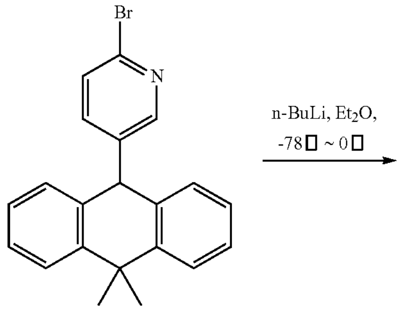

E

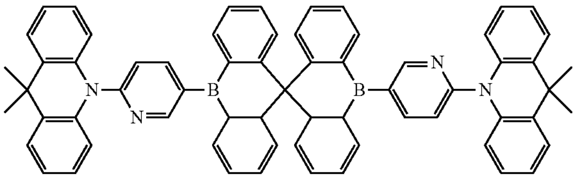

M21

12.72 g (20 mmol) of substrate C and THF (80 mL) were added and dissolved in a 200 mL three-necked flask, the nitrogen displacement was performed three times, and then the temperature of the mixture was lowered to −78° C. 20 mL (50 mmol) of n-BuLi was added dropwise while the temperature was controlled below −65° C., and then the mixture was stirred for 30 minutes. 4.35 g (40 mmol) of TMS-Cl was added dropwise, and the mixture was heated to 0° C. and reacted for 4 h, and then reaction was quenched with ice water. The mixture was extracted with DCM (80 mL×2). The organic phases were collected and distillated by using a rotary evaporator to obtain a light yellow oil, and the light yellow oil was crystallized by using toluene/ethanol to obtain a light yellow solid. 8.47 g (15 mmol) of the light yellow solid, an anhydrous toluene solution (70 mL) and 0.76 mL (8 mmol) of boron tribromide were sequentially added into a 200 mL sealed tube while stirring at 120° C. for 12 h. After the reaction was completed, it was quenched with water (100 mL). The reaction solution was extracted with DCM (100 mL×3). The organic phases were collected, dried and then filtered, and a filtrate was distillated by using a rotary evaporator to remove solvent. Crystallization was carried out with DCM/EtOH so as to obtain a white solid, and yield was 75.4%.

MALDI-TOF: 497.98; $^{1}H$ NMR (400 MHz, $CDCl_3$) δ 7.74 (s, 3H), 7.35-7.18 (m, 12H); $^{13}C$ NMR (100 MHz, $CDCl_3$) δ 144.78 (s), 132.15 (s), 125.92 (s), 125.08 (s), 124.06 (s), 118.29 (s).

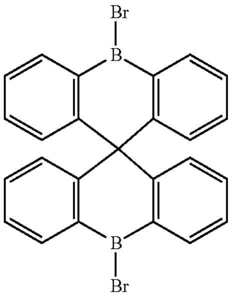

D 9.96 g (20 mmol) of Compound D and 100 mL of diethyl ether were sequentially added into a 250 mL three-necked flask, the nitrogen displacement was performed, and the mixture was stirred. The temperature was cooled to −78° C. by liquid nitrogen, 9 mL (21.6 mmol) of n-BuLi was added dropwise, and then the mixture was stirred for 30 min. 15.29 g (42 mmol) of Compound E was dissolved in 60 mL of toluene, and the solution was added dropwise to the reaction system. After the addition of the solution, the mixture was naturally warmed to room temperature and reacted for 6 hours. After the reaction was completed, the reaction was quenched with 60 mL of ice water. The reaction solution was extracted with DCM (100 mL×3) and a saturated aqueous solution of brine (100 mL×2), respectively. The organic phases were distillated by using a rotary evaporator so as to obtain an oil. Recrystallization was carried out with toluene/ethanol so as to obtain a solid M21.

MALDI-TOF: 912.45; $^{1}H$ NMR (400 MHz, $CDCl_3$) δ 8.60 (dd, J=14.8, 1.2 Hz, 2H), 7.71 (ddd, J=21.8, 7.3, 2.1 Hz, 3H), 7.66 (s, 2H), 7.68-7.62 (m, 2H), 7.52-7.29 (m, 6H), 7.19-6.96 (m, 10H), 6.74 (dddd, J=16.9, 10.8, 6.2, 1.0 Hz, 2H), 6.66-6.55 (m, 3H), 6.41-6.18 (m, 3H), 6.04 (dd, J=10.9, 6.2 Hz, 1H), 5.80 (ddd, J=10.9, 6.3, 2.5 Hz, 3H), 3.01 (ddd, J=7.2, 6.1, 1.0 Hz, 1H), 1.70 (dd, J=19.6, 5.6 Hz, 12H), 0.79 (ddd, J=7.0, 6.2, 1.0 Hz, 1H); $^{13}C$ NMR (100 MHz, $CDCl_3$) δ 155.88 (s), 153.64 (s), 148.88 (s), 142.80 (s), 138.91 (s), 135.99 (s), 133.55 (s), 129.93 (s), 128.54 (s), 128.38 (s), 127.88 (s), 127.71 (s), 126.67 (s), 126.47 (s), 126.07 (s), 125.78 (s), 125.61 (s), 124.87 (s), 121.04 (s), 119.21 (s), 118.15 (s), 50.41 (s), 42.61 (s), 35.93 (s), 31.83 (s).

Example 8

Synthesis of Compound M22

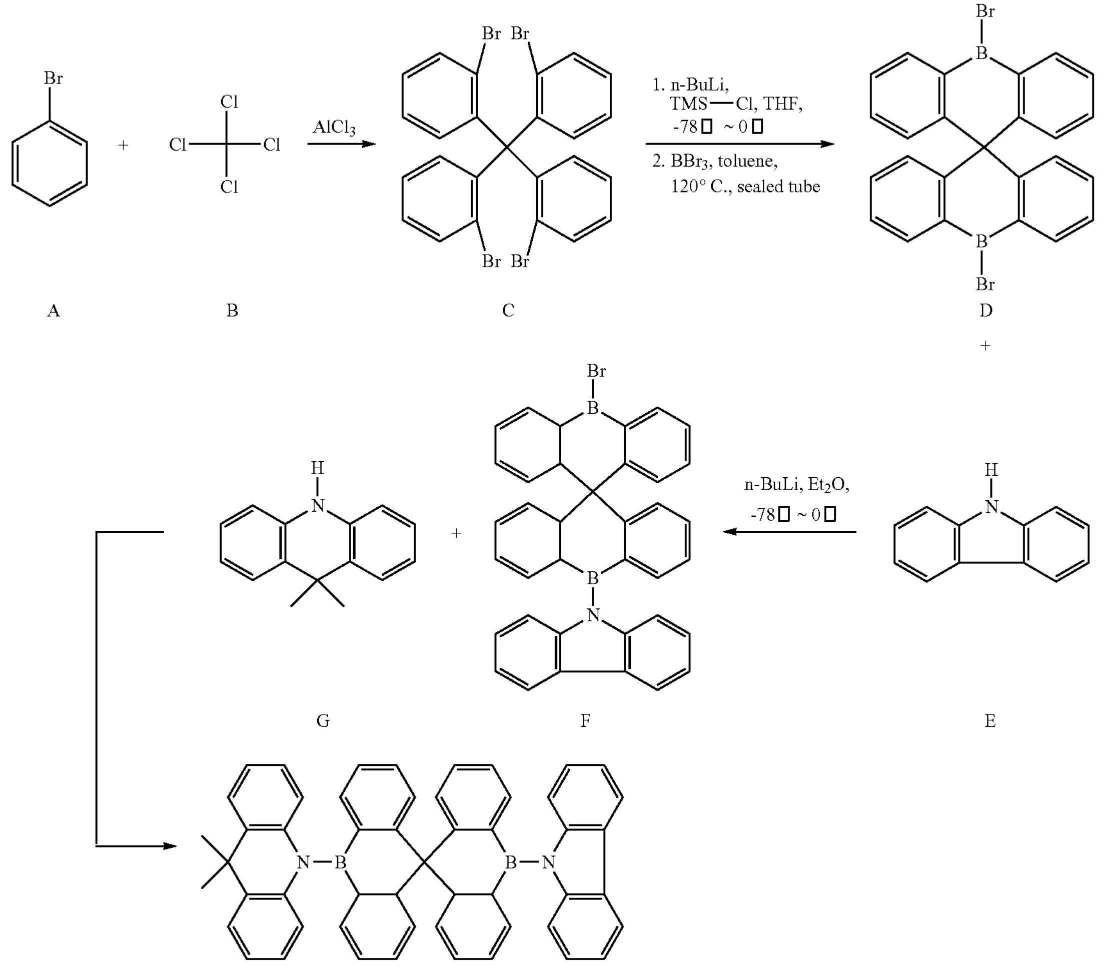

A B C D E F G

M22

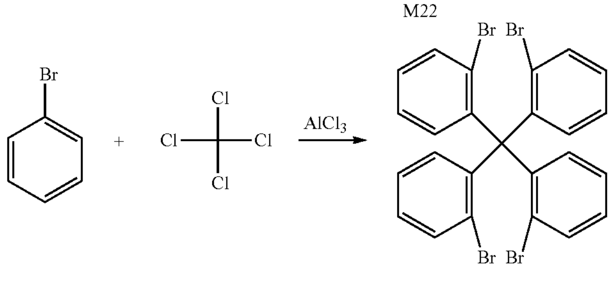

A B C 12.48 g (80 mmol) of Compound A was added into a 200 mL three-necked flask. 0.5 g of anhydrous aluminum trichloride was then added to Compound A and stirred thoroughly. 3.08 g (20 mmol) of dried compound B was added in batches at 30-40° C. while stirring until the reaction no longer released heat under continuous stirring, the temperature was kept with the steam at 70-80° C. The mixture was refluxed until hydrogen chloride escape was slight. 20 mL of hydrochloric acid (6 mol/L) was added to and sufficiently mixed with benzene. The mixture was added in batches with vigorous stirring to carry out hydrolysis reaction while the hydrolysis temperature was controlled below 40° C. The benzene layer was separated. The aqueous layer was diluted with ice water, and then extracted with benzene several times. The extracted solution was collected, dried with anhydrous calcium chloride, decolorized with activated carbon, filtered and then cooled to crystallize. The crystals were dissolved in a mixed solvent of benzene and petroleum ether to which a small amount of chloroacetyl was added, and recrystallization was carried out to obtain Compound C.

MALDI-TOF: 635.79; $^{1}H$ NMR (400 MHz, $CDCl_3$) δ 7.54 (s, 4H), 7.22 (s, 2H), 7.07 (d, J=48.0 Hz, 8H), 7.01 (s, 5H), 6.97 (d, J=3.7 Hz, 1H), 6.68-6.26 (m, 1H); $^{13}C$ NMR (100 MHz, $CDCl_3$) δ 141.47 (s), 134.17 (s), 130.51 (s), 128.20 (s), 125.73 (s), 125.48 (s), 67.17 (s).

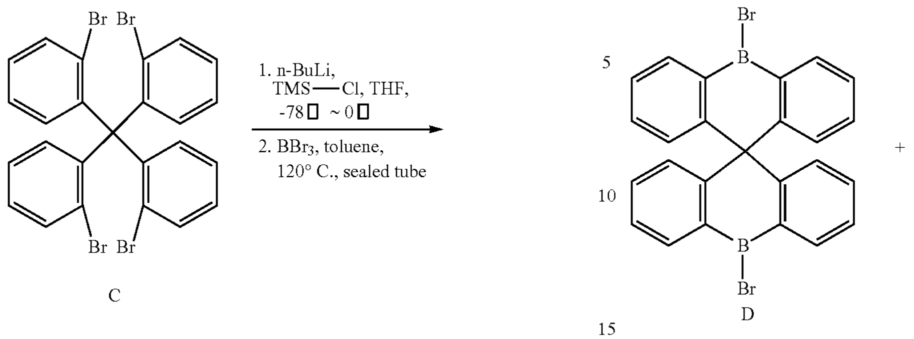

C

D

+

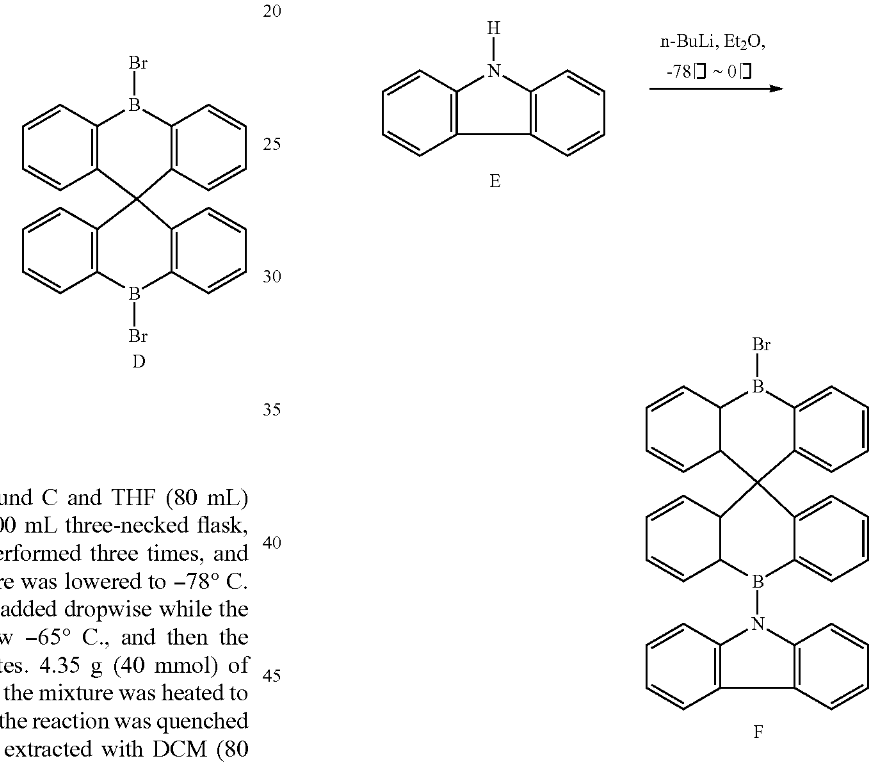

D

E

F 12.72 g (20 mmol) of Compound C and THF (80 mL) were added and dissolved in a 200 mL three-necked flask, the nitrogen displacement was performed three times, and then the temperature of the mixture was lowered to −78° C. 20 mL (50 mmol) of n-BuLi was added dropwise while the temperature was controlled below −65° C., and then the mixture was stirred for 30 minutes. 4.35 g (40 mmol) of TMS-Cl was added dropwise, and the mixture was heated to 0° C. and reacted for 4 h, and then the reaction was quenched with ice water. The mixture was extracted with DCM (80 mL×2). The organic phases were collected and distillated by using a rotary evaporator to obtain a light yellow oil, and the light yellow oil was crystallized by using toluene/ethanol to obtain a light yellow solid. 8.47 g (15 mmol) of the light yellow solid, an anhydrous toluene solution (70 mL) and 0.76 mL (8 mmol) of boron tribromide were sequentially added into a 200 mL sealed tube while stirring at 120° C. for 12 h. After the reaction was completed, it was quenched with water (100 mL). The reaction solution was extracted with DCM (100 mL×3). The organic phases were collected, dried and then filtered, and the filtrate was distillated by using a rotary evaporator to remove solvent. Crystallization was carried out with DCM/EtOH so as to obtain a white solid, and yield was 75.4%.

MALDI-TOF: 497.98; $^1$H NMR (400 MHz, $CDCl_3$) δ 7.74 (s, 3H), 7.35-7.18 (m, 12H); $^{13}$C NMR (100 MHz, $CDCl_3$) δ 144.78 (s), 132.15 (s), 125.92 (s), 125.08 (s), 124.06 (s), 118.29 (s).

9.96 g (20 mmol) of Compound D and 100 mL of toluene were sequentially added into a 250 mL three-necked flask, the nitrogen displacement was performed, and the mixture was stirred. 10 mL of triethylamine was added dropwise. 3 g (18 mmol) of Compound E was dissolved in 60 mL of toluene, and the solution was added dropwise to the reaction system. After the addition of the solution, the mixture was naturally warmed to room temperature and reacted for 6 hours. After the reaction was completed, the reaction was quenched with 60 mL of ice water. The reaction solution was extracted with DCM (100 mL×3) and a saturated aqueous solution of brine (100 mL×2), respectively. The organic phases were distillated by using a rotary evaporator so as to obtain an oil. Recrystallization was carried out with toluene/ethanol so as to obtain a solid F.

MALDI-TOF 587.2; $^1$H NMR (400 MHz, $CDCl_3$) δ 8.33 (dd, J=7.4, 1.5 Hz, 1H), 8.26-8.16 (m, 1H), 7.74 (dd, J=7.8, 2.1 Hz, 2H), 7.64 (dd, J=7.4, 1.5 Hz, 1H), 7.48 (ddd, J=10.9, 6.2, 1.0 Hz, 2H), 7.40-7.24 (m, 4H), 7.25-7.08 (m, 7H), 6.55 (ddd, J=10.8, 6.1, 0.9 Hz, 2H), 5.80 (dd, J=10.9, 6.2 Hz, 4H), 2.80 (ddd, J=7.2, 6.1, 1.0 Hz, 2H), 2.00 (ddd, J=7.1, 6.1, 1.0 Hz, 2H); $^{13}$C NMR (100 Hz, $CDCl_3$) δ 148.51 (s), 145.71 (s), 145.37 (s), 134.68 (s), 130.81 (s), 129.96 (s), 127.71 (s), 127.60 (s), 127.52 (s), 127.48 (s), 126.92 (s), 126.67 (s), 126.64 (s), 125.85 (s), 125.82 (s), 125.74 (s), 125.70 (s), 125.23 (s), 124.33 (s), 123.83 (s), 122.43 (s), 121.09 (s), 118.57 (s), 110.87 (s), 68.20 (s), 49.35 (s), 45.00 (s), 40.23 (s), 39.10 (s).

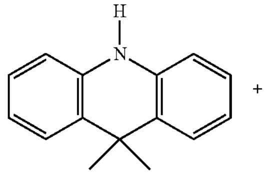

G

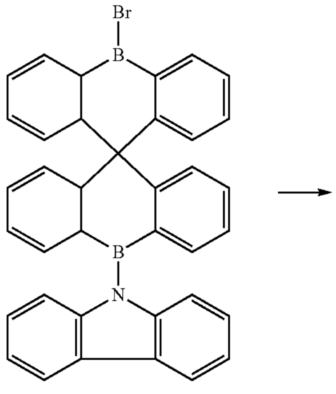

F

-continued

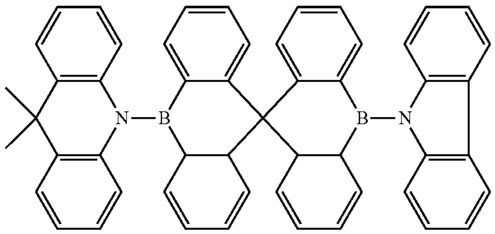

M22

11.74 g (20 mmol) of Compound F and 100 mL of diethyl ether were sequentially added into a 250 mL three-necked flask, the nitrogen displacement was performed, and the mixture was stirred. 10 mL of triethylamine was added dropwise, and 4.6 g (18 mmol) of Compound G was dissolved in 60 mL of toluene. The solution was added dropwise to the reaction system. After the addition of the solution, the mixture was naturally warmed to room temperature and reacted for 6 hours. After the reaction was completed, the reaction was quenched with 60 mL of ice water. The reaction solution was extracted with DCM (100 mL×3) and a saturated aqueous solution of brine (100 mL×2), respectively. The organic phases were distillated by using a rotary evaporator so as to obtain an oil. Recrystallization was carried out with toluene/ethanol so as to obtain a solid M22.

MALDI-TOF: 716.35; $^1$H NMR (400 MHz, $CDCl_3$) δ 7.74 (dd, J=7.9, 2.0 Hz, 2H), 7.64 (dd, J=7.5, 1.5 Hz, 1H), 7.48 (ddd, J=11.0, 6.2, 1.0 Hz, 2H), 7.39-7.04 (m, 18H), 6.94 (ddd, J=7.5, 5.9, 3.6 Hz, 2H), 6.55 (ddd, J=10.8, 6.1, 0.9 Hz, 2H), 5.80 (dd, J=10.9, 6.1 Hz, 4H), 2.80 (ddd, J=7.2, 6.1, 1.0 Hz, 2H), 2.04-1.96 (m, 2H), 1.72 (s, 6H); $^{13}$C NMR (100 MHz, $CDCl_3$) δ 146.86 (s), 145.71 (s), 142.86 (s), 134.68 (s), 130.81 (s), 128.55 (s), 127.71 (s), 127.52 (s), 127.48 (s), 126.92 (s), 126.67 (s), 125.85 (s), 125.82 (s), 125.70 (s), 125.65 (s), 124.33 (s), 121.09 (s), 118.72 (s), 118.57 (s), 115.02 (s), 110.87 (s), 68.20 (s), 40.23 (s), 31.83 (s).

Example 9

Synthesis of Compound M24

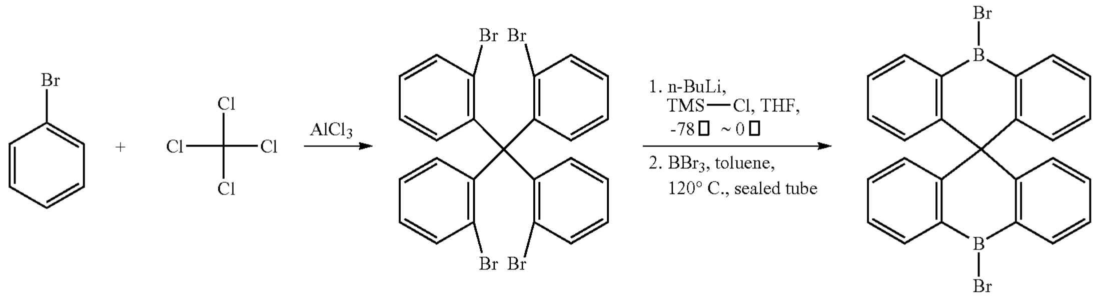

A B C D

+

-continued

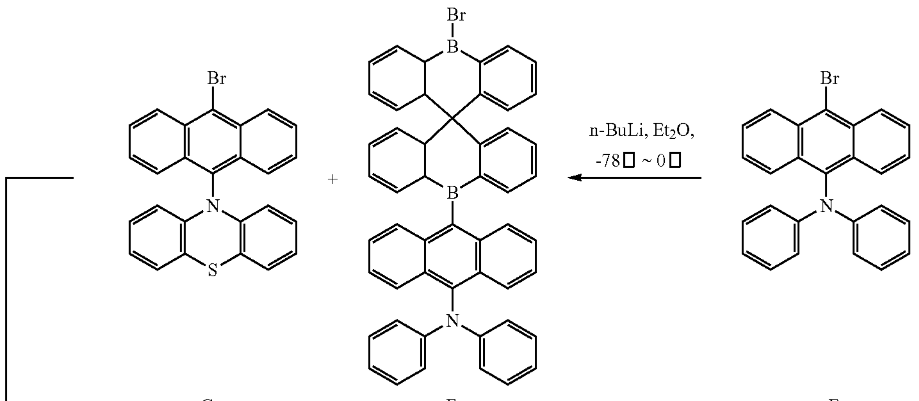

G F E

M24

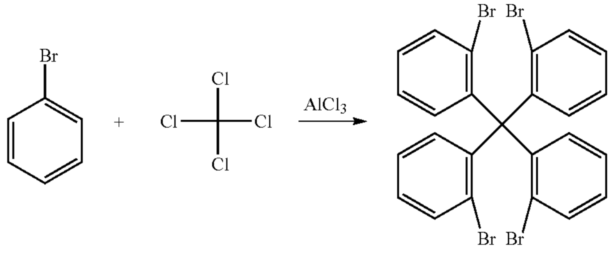

A B C 12.48 g (80 mmol) of Compound A was added into a 200 mL three-necked flask. 0.5 g of anhydrous aluminum trichloride was then added to Compound A and stirred thoroughly. 3.08 g (20 mmol) of dried compound B was added in batches at 30-40° C. while stirring until the reaction no longer released heat under continuous stirring, the temperature was kept with the steam at 70-80° C. The mixture was refluxed until hydrogen chloride escape was slight. 20 mL of hydrochloric acid (6 mol/L) was added to and sufficiently mixed with benzene. The mixture was added in batches with vigorous stirring to carry out hydrolysis reaction while the hydrolysis temperature was controlled below 40° C. The benzene layer was separated. The aqueous layer was diluted with ice water, and then extracted with benzene several times. The extracted solution was collected, dried with anhydrous calcium chloride, decolorized with activated carbon, filtered and then cooled to crystallize. The crystals were dissolved in a mixed solvent of benzene and petroleum ether to which a small amount of chloroacetyl was added, and recrystallization was carried out to obtain Compound C.

MALDI-TOF: 635.79; $^1$H NMR (400 MHz, $CDCl_3$) δ 7.54 (s, 4H), 7.22 (s, 2H), 7.07 (d, J=48.0 Hz, 8H), 7.01 (s, 5H), 6.97 (d, J=3.7 Hz, 1H), 6.68-6.26 (m, 1H); $^{13}$C NMR (100 MHz, $CDCl_3$) δ 141.47 (s), 134.17 (s), 130.51 (s), 128.20 (s), 125.73 (s), 125.48 (s), 67.17 (s).

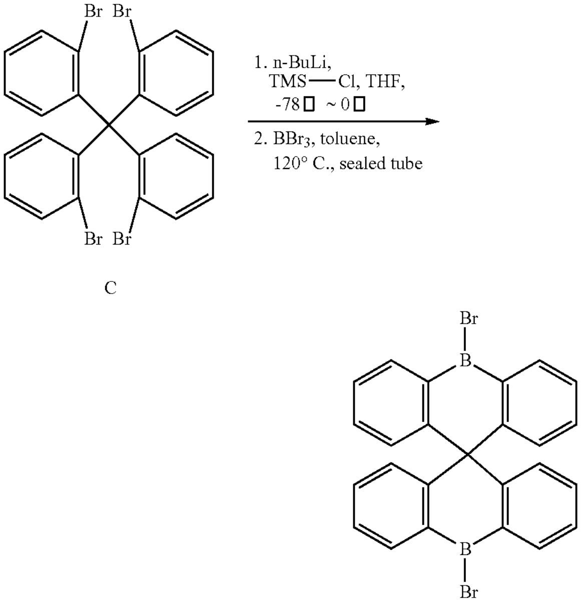

C

D 12.72 g (20 mmol) of substrate C and THF (80 mL) were added and dissolved in a 200 mL three-necked flask, the nitrogen displacement was performed three times, and then the temperature of the mixture was lowered to −78° C. 20 mL (50 mmol) of n-BuLi was added dropwise while the temperature was controlled below −65° C., and then the mixture was stirred for 30 minutes. Next, 4.35 g (40 mmol) of TMS-Cl was added dropwise, and the mixture was heated to 0° C. and reacted for 4 h. After this, the reaction was quenched with ice water. It was extracted with DCM (80 mL×2). The organic phases were collected and distillated by using a rotary evaporator to obtain a light yellow oil, and the light yellow oil was crystallized by using toluene/ethanol to obtain a light yellow solid. 8.47 g (15 mmol) of the light yellow solid, an anhydrous toluene solution (70 mL) and 0.76 mL (8 mmol) of boron tribromide were sequentially added into a 200 mL sealed tube while stirring at 120° C. for 12 h. After the reaction was completed, it was quenched with water (100 mL). The reaction solution was extracted with DCM (100 mL×3). The organic phases were collected, dried and then filtered, and the filtrate was distillated by using a rotary evaporator to remove solvent. Crystallization was carried out with DCM/EtOH so as to obtain a white solid, and yield was 75.4%.

MALDI-TOF: 497.98; $^{1}H$ NMR (400 MHz, $CDCl_3$) δ 7.74 (s, 3H), 7.35-7.18 (m, 12H); $^{13}C$ NMR (100 MHz, $CDCl_3$) δ 144.78 (s), 132.15 (s), 125.92 (s), 125.08 (s), 124.06 (s), 118.29 (s).

-continued

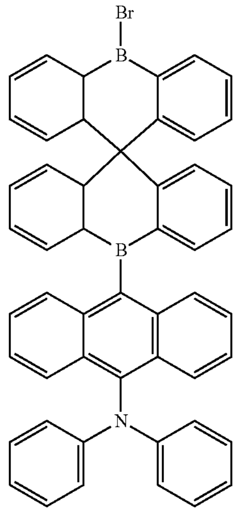

F

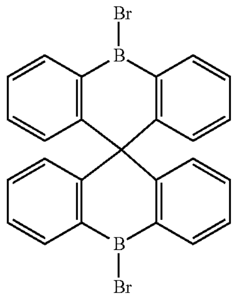

D

+

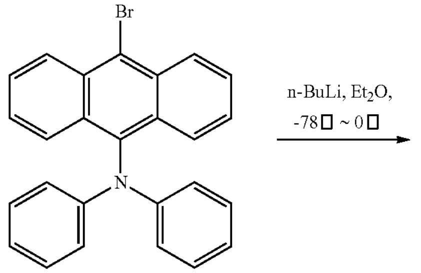

E 9.96 g (20 mmol) of Compound D and 100 mL of diethyl ether were sequentially added into a 250 mL three-necked flask, the nitrogen displacement was performed, and the mixture was stirred. The temperature was cooled to −78° C. by liquid nitrogen, 9 mL (21.6 mmol) of n-BuLi was added dropwise, and then the mixture was stirred for 30 min. 7.62 g (18 mmol) of Compound E was dissolved in 60 mL of toluene, and the solution was added dropwise to the reaction system. After the addition of the solution, the mixture was naturally warmed to room temperature and reacted for 6 hours. After the reaction was completed, the reaction was quenched with 60 mL of ice water. The reaction solution was extracted with DCM (100 mL×3) and a saturated aqueous solution of brine (100 mL×2), respectively. The organic phases were distillated by using a rotary evaporator so as to obtain an oil. Recrystallization was carried out with toluene/ethanol so as to obtain a solid F.

MALDI-TOF: 765.2; $^{1}H$ NMR (400 MHz, $CDCl_3$) δ 8.19-8.04 (m, 2H), 7.78-7.70 (m, 1H), 7.58-7.43 (m, 3H), 7.33-7.13 (m, 5H), 7.12-7.04 (m, 2H), 7.00 (tt, J=7.5, 2.0 Hz, 1H), 6.55 (ddd, J=10.8, 6.1, 0.9 Hz, 1H), 5.80 (dd, J=10.9, 6.2 Hz, 2H), 2.80 (ddd, J=7.2, 6.1, 1.0 Hz, 1H), 2.00 (ddd, J=7.1, 6.1, 1.0 Hz, 1H); $^{13}C$ NMR (100 MHz, $CDCl_3$) δ 150.18 (s), 148.51 (s), 146.08 (s), 135.86 (s), 135.48 (s), 130.60 (s), 129.96 (s), 129.30 (s), 128.71 (s), 128.09 (s), 127.88 (s), 127.77 (s), 127.71 (s), 127.60 (s), 127.10 (s), 126.67 (s), 126.64 (s), 126.48 (s), 126.13 (s), 125.99 (s), 125.94 (s), 125.78 (s), 125.74 (s), 125.23 (s), 124.63 (s), 124.31 (s), 124.07 (s), 123.83 (s), 122.43 (s), 112.27 (s), 66.32 (s), 49.35 (s), 45.00 (s), 42.61 (s), 39.10 (s).

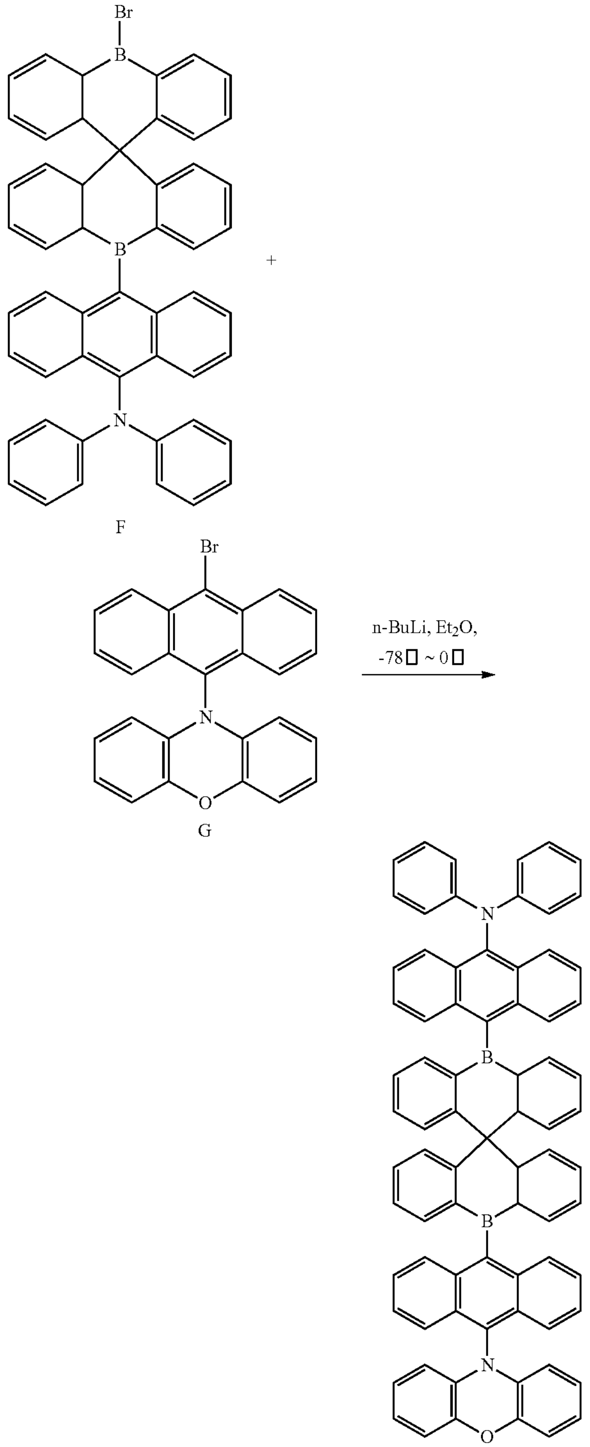

F + G → M24

15.30 g (20 mmol) of Compound F and 100 mL of diethyl ether were sequentially added into a 250 mL three-necked flask, the nitrogen displacement was performed, and the mixture was stirred. The temperature was cooled to −78° C. by liquid nitrogen, 9 mL (21.6 mmol) of n-BuLi was added dropwise, and then the mixture was stirred for 30 min. 9.97 (22 mmol) of Compound G was dissolved in 60 mL of toluene. The solution was added dropwise to the reaction system. After the addition of the solution, the mixture was naturally warmed to room temperature and reacted for 6 hours. After the reaction was completed, the reaction was quenched with 60 mL of ice water. The reaction solution was extracted with DCM (100 mL×3) and a saturated aqueous solution of brine (100 mL×2), respectively. The organic phases were distillated by using a rotary evaporator so as to obtain an oil. Recrystallization was carried out with toluene/ethanol so as to obtain a solid M24.

MALDI-TOF: 1060.42; $^1$H NMR (400 MHz, $CDCl_3$) δ 9.49 (dd, J=7.5, 1.5 Hz, 1H), 9.21 (td, J=7.5, 1.5 Hz, 1H), 8.67-8.52 (m, 3H), 8.41 (dd, J=7.5, 1.5 Hz, 1H), 8.30 (td, J=7.5, 1.5 Hz, 1H), 8.17 (qd, J=7.5, 1.5 Hz, 2H), 8.02 (dd, J=7.4, 1.5 Hz, 1H), 7.85-7.60 (m, 7H), 7.55 (dtd, J=15.1, 7.5, 1.5 Hz, 2H), 7.47-7.33 (m, 5H), 7.29-7.11 (m, 6H), 7.15-6.95 (m, 3H), 6.84 (dddd, J=19.7, 10.9, 6.0, 1.5 Hz, 3H), 6.72-6.54 (m, 3H), 6.49-6.22 (m, 6H), 5.80 (dd, J=10.9, 6.2 Hz, 2H), 2.99 (td, J=6.4, 5.8, 1.0 Hz, 1H). $^{13}$C NMR (100 MHz, $CDCl_3$) δ 150.18 (s), 146.08 (s), 142.41 (s), 135.48 (s), 130.60 (s), 129.30 (s), 128.71 (s), 128.09 (s), 127.88 (s), 127.77 (s), 127.71 (s), 127.52 (s), 127.32 (s), 127.10 (s), 126.67 (s), 126.48 (s), 126.13 (s), 125.99 (s), 125.93 (s), 125.78 (s), 124.63 (s), 124.31 (s), 124.07 (s), 123.49 (s), 122.73 (s), 118.47 (s), 112.27 (s), 66.32 (s), 42.61 (s).

Example 10

The electroluminescent performance of the exemplary boron heterocyclic compounds M1, M6, M7, M8, M10, M12, M21, M22, and M24 according to the present disclosure were simulated by using Gaussian software.

HOMO energy level, LUMO energy level and other parameters of the boron heterocyclic compounds M1, M6, M7, M8, M10, M12, M21, M22, M24 were tested, and the obtained results are shown in Table 1.

TABLE 1

Parameters of representative boron heterocyclic compounds

| Compound | HOMO (ev) | LUMO (ev) | $S_1$ (ev) | $T_1$ (ev) | $\Delta E_{ST}$ (ev) | τ (μS) |
|---|---|---|---|---|---|---|
| M1 | −4.86 | −1.79 | 2.66 | 2.65 | 0.01 | 6.1 |
| M6 | −4.94 | −1.86 | 2.72 | 2.60 | 0.12 | 3.5 |
| M7 | −4.99 | −1.92 | 2.48 | 2.41 | 0.07 | 5.2 |
| M8 | −4.83 | −1.76 | 2.54 | 2.51 | 0.03 | 7.6 |
| M10 | −4.98 | −1.89 | 2.59 | 48 | 0.11 | 4.3 |
| M12 | −5.01 | −1.99 | 2.91 | 2.46 | 0.15 | 2.9 |
| M21 | −5.12 | −2.04 | 2.82 | 2.67 | 0.14 | 7.4 |
| M22 | −4.96 | −1.82 | 2.69 | 2.67 | 0.02 | 9.1 |
| M24 | −5.07 | −1.98 | 2.73 | 2.59 | 0.14 | 7.6 |

It can be seen from Table 1 that, all of the compounds of the present disclosure have higher triplet energy level and greater optical band gap, which are mainly attributed to a non-conjugated connection formed by connecting the electron donor and the electron acceptor on the boron heterocyclic ring. With such a D-σ-A type molecular structure, the higher triplet energy level and the greater optical band gap can be obtained.

In another aspect, the present disclosure provides a display panel. The display panel includes an organic light-emitting device. The organic light-emitting device includes an anode, a cathode, a light-emitting layer disposed between the anode and the cathode. A host material or a guest material of the light-emitting layer is one or more compounds of the present disclosure.

In an embodiment of the display panel of the present disclosure, the organic light-emitting device further includes one or more layers of a hole injection layer, a hole transmission layer, an electron blocking layer, a hole blocking layer, an electron transmission layer, or an electron injection layer.

Figure 4:
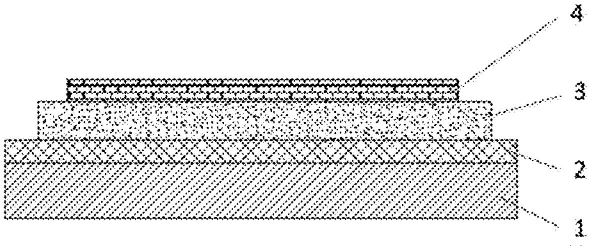
FIG. 4 is a structural schematic diagram of an OLED according to an embodiment of the present disclosure.

In an embodiment of the display panel of the present disclosure, the organic light-emitting device (OLED) has a structure shown in FIG. 4. In FIG. 4, a substrate made of glass or other suitable material (such as plastic) is denoted with reference number 1; a transparent anode such as ITO or IGZO is denoted with reference number 2 is; an organic film layer, which includes a light-emitting layer, is denoted with reference number 3; and a metal cathode is denoted with reference number 4. All of the above constitutes a complete OLED device. The two electrodes 2 and 4 can be interchanged.

In the display panel provided by the present disclosure, the anode of the organic light-emitting device can be made of metal such as copper, gold, silver, iron, chromium, nickel, manganese, palladium, platinum, or alloys thereof. The anode can also be made of metal oxides such as indium oxide, zinc oxide, indium tin oxide (ITO), indium zinc oxide (IZO), or the like. The anode can also be made of a conductive polymer such as polyaniline, polypyrrole, poly (3-methylthiophene), or the like. In addition to the anode materials mentioned above, the anode can also be made of any suitable material known in the related art, or combinations thereof, as long as the material is conductive to hole injection.

In the display panel provided by the present disclosure, in an embodiment, the cathode of the organic light-emitting device comprises a metal, such as a metal selected from the group consisting of aluminum, magnesium, silver, indium, tin, titanium, and alloys thereof. In an embodiment, the cathode comprises a multiple-layered metal material, such as a multiple-layered metal material selected from the group consisting of LiF/Al, $LiO_2$/Al, $BaF_2$/Al, and combinations thereof. In addition to the cathode materials listed above, the cathode material also can also be the materials that facilitate electron injection and combinations thereof, including materials known to be suitable for using as the cathode.

The organic light-emitting device can be manufactured according to the methods well known in the art and will not be elaborated herein. In the present disclosure, the organic light-emitting device can be manufactured by the following steps: forming an anode on a transparent or opaque smooth substrate; forming an organic thin layer on the anode; and further forming a cathode on the organic thin layer. The organic thin layer can be formed with a known method such as vapor deposition, sputtering, spin coating, dipping, ion plating, and the like.

The following Device Example 1 to Device Example 9 provide exemplary device examples for illustrating practical applications of the boron heterocyclic compounds according to the present disclosure as the guest material (doping material) of the light-emitting layer of the light-emitting device of the organic light-emitting display panel.

Device Example 1

The anode substrate including an ITO film having a film thickness of 100 nm was ultrasonically washed with distilled water, acetone, and isopropanol, then dried in an oven. The surface was subjected to UV treatment for 30 minutes, and then the substrate was transferred to a vacuum vapor deposition chamber. The vapor deposition of each layer was carried out under a vacuum of $2\times10^6$ Pa. A hole injection layer was formed by depositing 5 nm of HATCN. A hole transmission layer (HTL) was then formed by depositing a 40 nm thickness of N,N'-diphenyl-N,N'-(1-naphthyl)-1,1'-biphenyl-4,4'-diamine(NPB), and then depositing a 10 nm thickness of 4,4',4"-tris(carbazole-9-yl)triphenylamine (TCTA). Compound M1 according to the present disclosure was used as a doping material in the light-emitting layer, 3,3'-bis (N-carbazolyl)-1,1'-biphenyl (mCBP) was used as a host material of the light-emitting layer, the doping material and the host material are vapor deposited at the same time, so as to form a light-emitting layer having a thickness of 30 nm. Then, diphenyl[4-(triphenylsilyl)phenyl]phosphine oxide (TSPO1) was vapor-deposited on the light-emitting layer to form a 5 nm-thick hole blocking layer (HBL). 4,7-diphenyl-1,10-phenanthroline (Bphen) was vapor-deposited on the hole blocking layer to form an electron transmission layer (ETL) of 30 nm. A LiF layer having a thickness of 2.5 nm and an Al layer having a thickness of 100 nm were deposited on the electron transmission layer sequentially, respectively serving as an electron injection layer (EIL) and a cathode, so as to manufacture an organic light-emitting display apparatus.

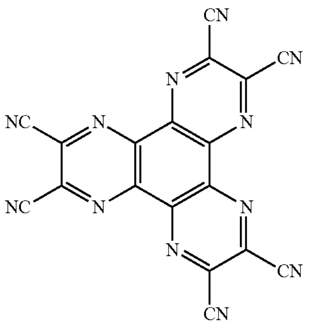

HAT-CN

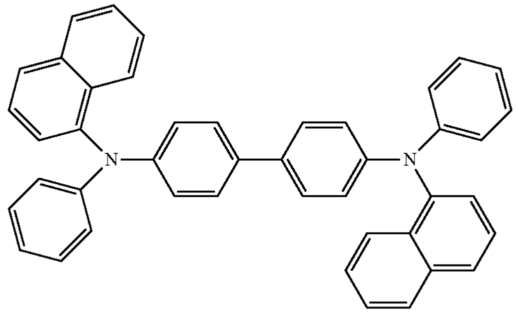

NPB

-continued

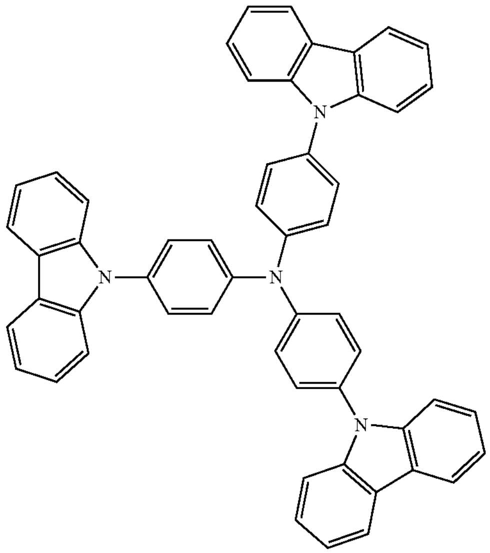

TCTA

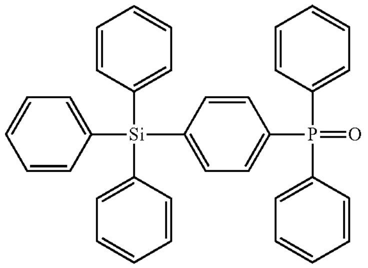

TSPO1

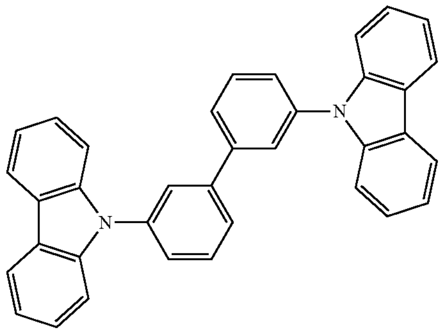

mCBP

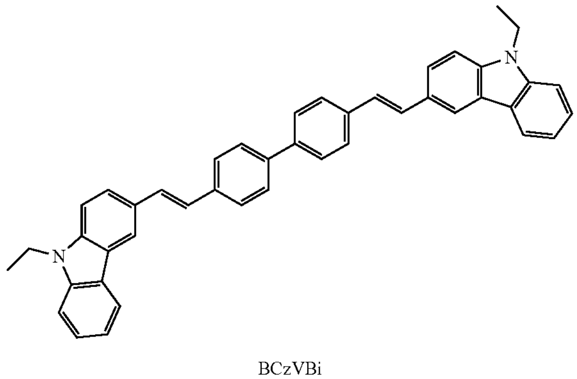

BCzVBi

Device Example 2

Device Example 2 differs from Device Example 1 in that compound M1 was replaced with Compound M6. The other manufacturing steps were the same as the corresponding steps in Device Example 1.

Device Example 3

Device Example 3 differs from Device Example 1 in that compound M1 was replaced with Compound M7. The other manufacturing steps were the same as the corresponding steps in Device Example 1.

Device Example 4

Device Example 4 differs from Device Example 1 in that compound M1 was replaced with Compound M8. The other manufacturing steps were the same as the corresponding steps in Device Example 1.

Device Example 5

Device Example 5 differs from Device Example 1 in that compound M1 was replaced with Compound M10. The other manufacturing steps were the same as the corresponding steps in Device Example 1.

Device Example 6

Device Example 6 differs from Device Example 1 in that compound M1 was replaced with Compound M12. The other manufacturing steps were the same as the corresponding steps in Device Example 1.

Device Example 7

Device Example 7 differs from Device Example 1 in that compound M1 was replaced with Compound M21. The other manufacturing steps were the same as the corresponding steps in Device Example 1.

Device Example 8

Device Example 8 differs from Device Example 1 in that compound M1 was replaced with Compound M22. The other manufacturing steps were the same as the corresponding steps in Device Example 1.

Device Example 9

Device Example 9 differs from Device Example 1 in that compound M1 was replaced with Compound M24. The other manufacturing steps were the same as the corresponding steps in Device Example 1.

Comparative Device Example 1

Comparative Device Example 1 differs from Device Example 1 in that compound M1 was replaced with Compound BCzVBi. The other manufacturing steps were the same as the corresponding steps in Device Example 1.

TABLE 2

| Performance Characterization of Devices | | | | | |
|---|---|---|---|---|---|
| No. | Guest Material | Driving Voltage (V) | EQE/ % | CE (cd/A) | Color |
| Device Example 1 | M1 | 4.26 | 13.2 | 19.8 | Blue light |
| Device Example 2 | M6 | 4.08 | 12.4 | 19.2 | Blue light |
| Device Example 3 | M7 | 4.15 | 9.8 | 16.2 | Blue light |
| Device Example 4 | M8 | 3.98 | 10.7 | 17.4 | Blue light |
| Device Example 5 | M10 | 4.04 | 10.4 | 17.0 | Blue light |
| Device Example 6 | M12 | 4.16 | 11.5 | 18.5 | Blue light |
| Device Example 7 | M21 | 4.12 | 12.3 | 19.0 | Blue light |
| Device Example 8 | M22 | 4.15 | 10.8 | 17.9 | Blue light |
| Device Example 9 | M24 | 4.05 | 12.6 | 16.8 | Blue light |
| Comparative Device Example 1 | BCzVBi | 4.82 | 4.8 | 7.5 | Blue light |

It can be seen from Table 2 that, the organic light-emitting devices respectively employing compounds M1, M6, M7, M8, M10, M12, M21, M22 and M24 as doping material (guest material) have significantly greater $EQE_{(max)}$ than the comparative example 1 using the traditional blue light-emitting material BCzVBi as fluorescent doping material, which is attributed to TADF properties of M1, M6, M7, M8, M10, M12, M21, M22, and M24. That is, the triplet exciton, which are blocked in molecular transition of the conventional fluorescent material, can be used to emit light, thereby improving the efficiency of device.

Device Example 10

The following examples provide exemplary device examples for illustrating practical application of the compounds of the present disclosure in an organic light-emitting display panel in which the compound according to the present disclosure is used as a host material for alight-emitting layer, and a fluorescent material or a phosphorescent material is used as a doping material.

The anode substrate including an ITO film having a film thickness of 100 nm was ultrasonically washed with distilled water, acetone, and isopropanol, then dried in an oven. The surface was subjected to UV treatment for 30 minutes, and then the substrate was transferred to a vacuum vapor deposition chamber. The vapor deposition of each layer was carried out under a vacuum of $2\times10^{6}$ Pa. A hole injection layer was formed by depositing 5 nm of HATCN. A hole transmission layer (HTL) was then formed by depositing a 40 nm thickness of 2,2'-Dimethyl-N,N'-di-1-naphthalenyl-N,N'-diphenyl[1,1'-biphenyl]-4,4'-diamine (α-NPD), and then depositing a 10 nm thickness of 4,4',4''-tris(carbazole-9-yl)triphenylamine (TCTA). Compound M1 according to the present disclosure was used as a doping material in the light-emitting layer, Ir(ppy)3 was used as a host material of the light-emitting layer, the doping material and the host material are vapor deposited at the same time, so as to form a light-emitting layer having a thickness of 30 nm. Then, 1,3,5-tris(1-phenyl-H-benzimidazol-2-yl)benzene (TPBi) was vapor-deposited on the light-emitting layer to form a 5 nm-thick hole blocking layer (HBL). 1,3,5-tris[(3-pyridyl)-3-phenyl]benzene (TmPyBP) was vapor-deposited on the hole blocking layer to form an electron transmission layer (ETL) of 30 nm. A LiF layer having a thickness of 2.5 nm and an Al layer having a thickness of 100 nm were deposited on the electron transmission layer sequentially, respectively serving as an electron injection layer (EIL) and a cathode, so as to manufacture an organic light-emitting display apparatus.

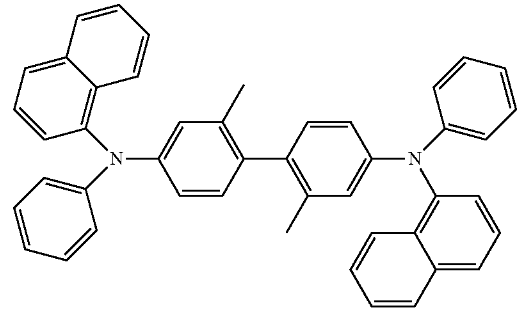

α-NPD

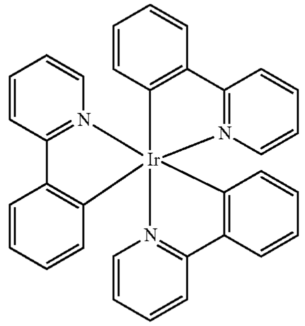

$Ir(ppy)_3$

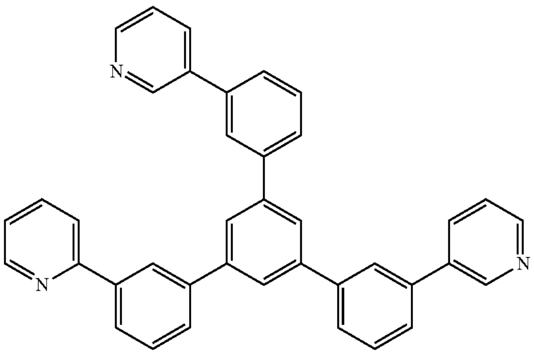

TmPyBP

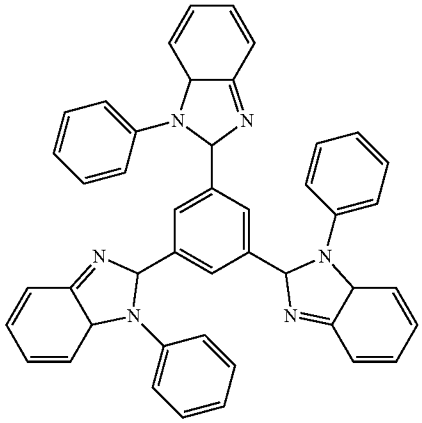

TPBI

-continued

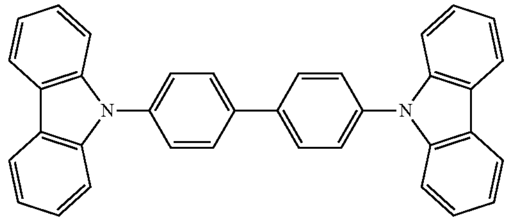

CBP

Device Example 11

Device Example 11 differs from Device Example 10 in that compound M1 was replaced with Compound M6. The other manufacturing steps were the same as the corresponding steps in Device Example 10.

Device Example 12

Device Example 12 differs from Device Example 10 in that compound M1 was replaced with Compound M7. The other manufacturing steps were the same as the corresponding steps in Device Example 10.

Device Example 13

Device Example 13 differs from Device Example 10 in that compound M1 was replaced with Compound M8. The other manufacturing steps were the same as the corresponding steps in Device Example 10.

Device Example 14

Device Example 14 differs from Device Example 10 in that compound M1 was replaced with Compound M10. The other manufacturing steps were the same as the corresponding steps in Device Example 10.

Device Example 15

Device Example 15 differs from Device Example 10 in that compound M1 was replaced with Compound M12. The other manufacturing steps were the same as the corresponding steps in Device Example 10.

Device Example 16

Device Example 16 differs from Device Example 10 in that compound M1 was replaced with Compound M21. The other manufacturing steps were the same as the corresponding steps in Device Example 10.

Device Example 17

Device Example 17 differs from Device Example 10 in that compound M1 was replaced with Compound M22. The other manufacturing steps were the same as the corresponding steps in Device Example 10.

Device Example 18

Device Example 18 differs from Device Example 10 in that compound M1 was replaced with Compound M24. The other manufacturing steps were the same as the corresponding steps in Device Example 10.

Comparative Device Example 2

Comparative Device Example 2 differs from Device Example 10 in that compound M1 was replaced with Compound CBP. The other manufacturing steps were the same as the corresponding steps in Device Example 14

TABLE 3

Performance Characterization of Devices

| No. | Host material | Driving Voltage (V) | EQE/ % | CE (cd/A) |
|---|---|---|---|---|
| Device Example 10 | M1 | 3.5 | 13.9 | 21.7 |
| Device Example 11 | M6 | 3.9 | 13.4 | 21.3 |
| Device Example 12 | M7 | 3.8 | 13.1 | 20.8 |
| Device Example 13 | M8 | 4.0 | 14.5 | 22.4 |
| Device Example 14 | M10 | 3.5 | 15.3 | 22.6 |
| Device Example 15 | M12 | 3.9 | 13.9 | 23.1 |
| Device Example 16 | M21 | 3.4 | 13.5 | 22.0 |
| Device Example 17 | M22 | 3.8 | 14.2 | 21.4 |
| Device Example 18 | M24 | 3.3 | 14.6 | 21.8 |
| Comparative Device Example 2 | CBP | 4.2 | 10.8 | 20.6 |

The doped devices, in which Compounds M1, M6, M7, M8, M10, M12, M21, M22, and M24 of the present disclosure were used as a host material and Ir(ppy)3 was used as a doping material, achieve a maximum external quantum efficiency of up to 15%. It indicates that, when the compounds of the present disclosure are used as the host material of a phosphorescent material, the device has higher light-emitting efficiency than the comparative device using compound CBP as the host material.

Figure 5:
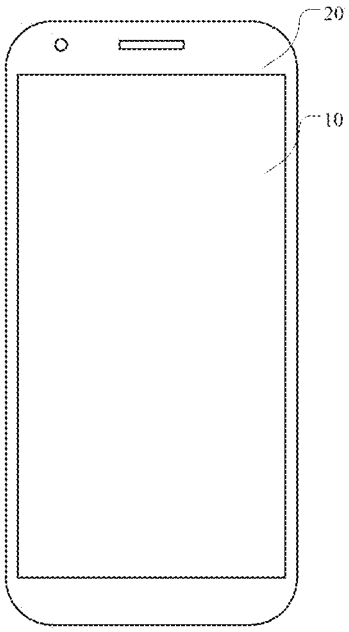
FIG. 5 is a schematic diagram of a display apparatus according to an embodiment of the present disclosure.

The present disclosure also provides a display apparatus including the above-mentioned organic light-emitting display panel. In the present disclosure, the organic light-emitting device may be an OLED used in an organic light-emitting display apparatus. The organic light-emitting display apparatus can be display screen of various smart devices, such a mobile phone display screen, a computer display screen, a liquid crystal television display screen, a smart watch display screen, a display panel of smart car, a display screen of Virtual Reality (VR) or Augmented Reality (AR). FIG. 5 is a schematic diagram of a display apparatus according to an embodiment of the present disclosure, in which 10 denotes a mobile phone display panel, and 20 denotes a display apparatus. The preferable embodiments of the present disclosure described above are not intended to limit the scope of the present disclosure. Those skilled in the art can make various changes and modifications without departing from the scope of the present disclosure. The protection scope of the present disclosure is defined by the appending claims.

What is claimed is:

1. A compound having a structure according to Formula (1):

Formula (1)

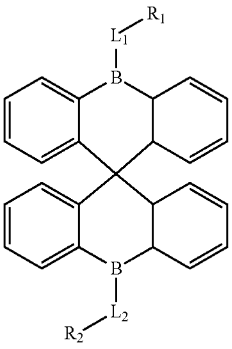

wherein $L_1$ and $L_2$ are each independently selected from the group consisting of phenyl, naphthyl, anthracyl, pyridyl, pyrimidinyl, and pyrazinyl; and $R_1$ and $R_2$ are each independently selected from a group consisting of a substituted or unsubstituted phenyl, a substituted or unsubstituted biphenyl, a substituted or unsubstituted naphthyl, a substituted or unsubstituted anthracyl, a substituted or unsubstituted phenanthryl, a substituted or unsubstituted acenaphthylenyl, a substituted or unsubstituted pyrenyl, a substituted or unsubstituted perylenyl, a substituted or unsubstituted fluorenyl, a substituted or unsubstituted spirodifluorenyl, a substituted or unsubstituted chrysenyl, a substituted or unsubstituted benzophenanthryl, a substituted or unsubstituted benzoanthracyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, carbazolyl, carbazolyl derivatives, acridinyl, acridinyl derivatives, diarylamino, and diarylamino derivatives.

2. The compound according to claim 1, wherein $R_1$ and $R_2$ are each independently according to any one of the following formulas:

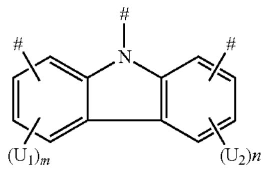

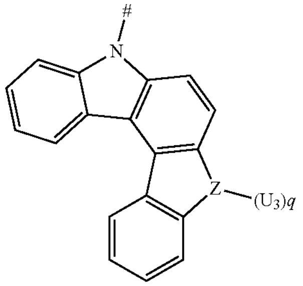

-continued

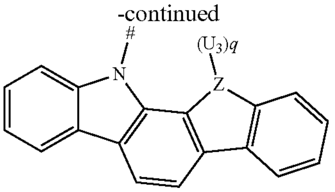

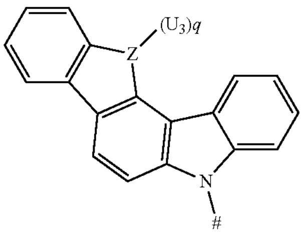

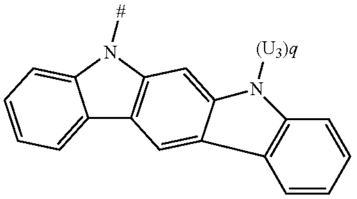

or

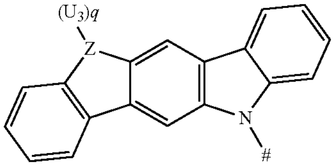

wherein Z is selected from the group consisting of a carbon atom, a nitrogen atom, an oxygen atom, and a sulfur atom;

$U_1$, $U_2$ and $U_3$ are each independently selected from the group consisting of a hydrogen atom, C1-C6 alkyl, and C1-C6 alkoxy; m, n and q are each an integer independently selected from 0, 1 or 2;

when Z is an oxygen atom or a sulfur atom, q is 0; and # represents a bonding position.

3. The compound according to claim 2, wherein $R_1$ and $R_2$ are each independently selected from the group consisting of

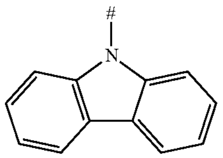

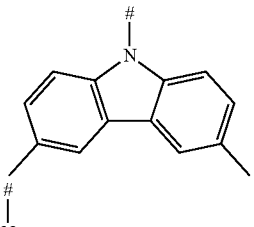

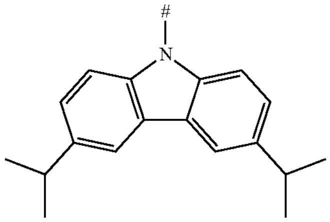

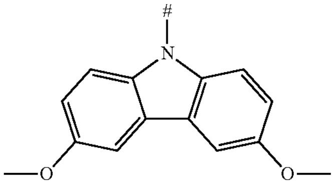

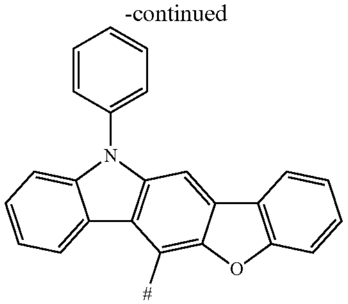
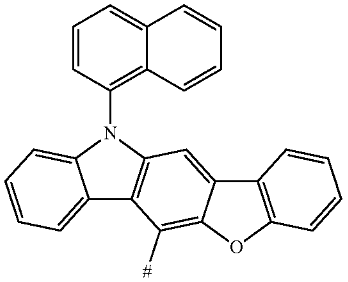
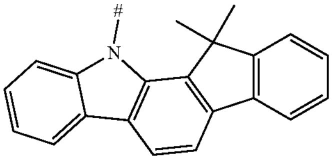
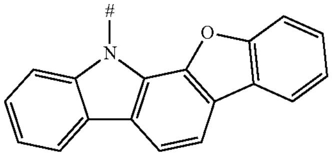
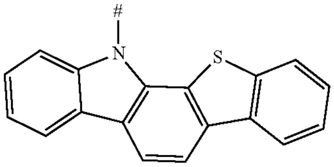
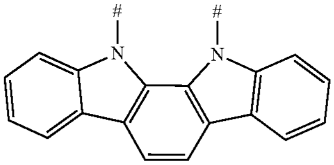
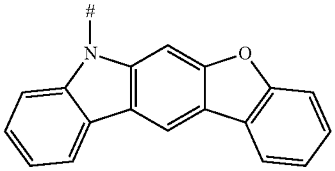
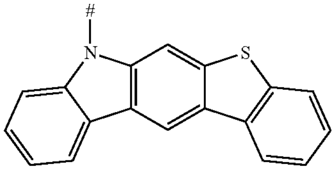
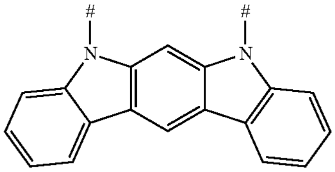
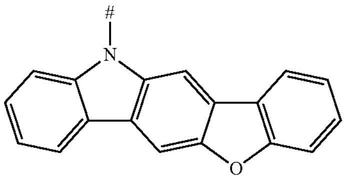
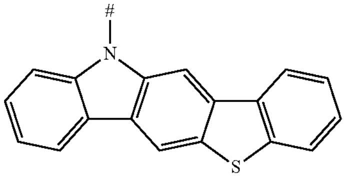
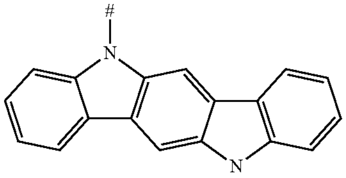
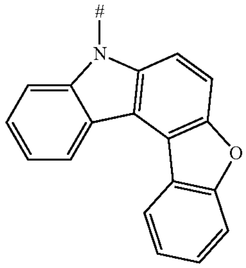
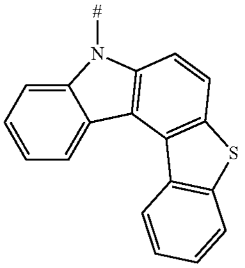
and
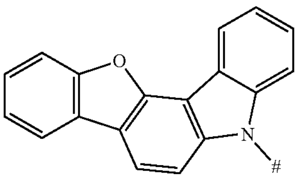
.
4. The compound according to claim 1, wherein $R_1$ and $R_2$ are each independently according to any one of the following formulas:
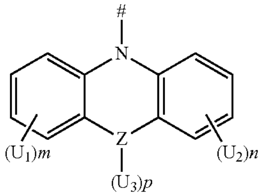
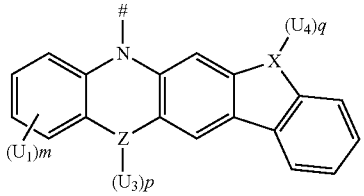

-continued

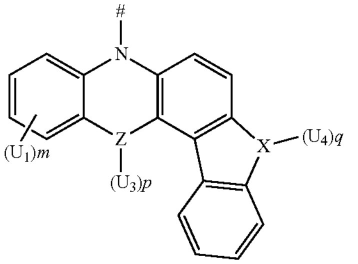

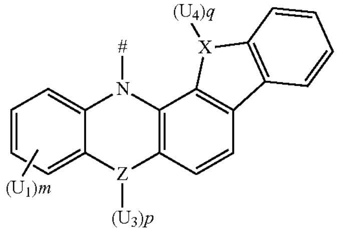

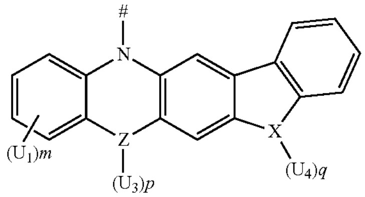

or

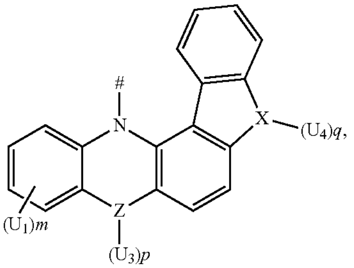

wherein Z is selected from the group consisting of a carbon atom, a nitrogen atom, an oxygen atom, a sulfur atom, and a silicon atom;

X is selected from the group consisting of a carbon atom, a nitrogen atom, an oxygen atom, and a sulfur atom;

$U_1$, $U_2$, $U_3$ and $U_4$ are each independently selected from the group consisting of a hydrogen atom, C1-C6 alkyl, C3-C6 cycloalkyl, C1-C6 alkoxy, and C6-C12 aryl; m, n, p and q are each an integer independently selected from 0, 1 or 2;

when Z or X is an oxygen atom or a sulfur atom, p or q is 0; and represents a bonding position.

5. The compound according to claim 4, wherein $R_1$ and $R_2$ are each independently according to any one of the following formulas:

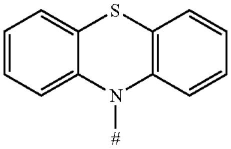

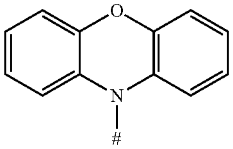

-continued

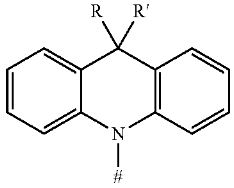

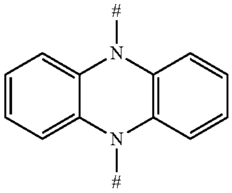

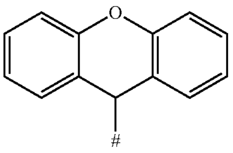

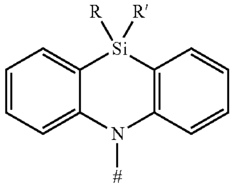

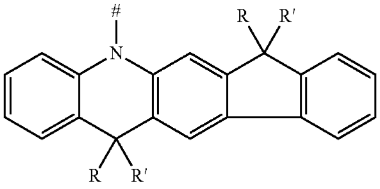

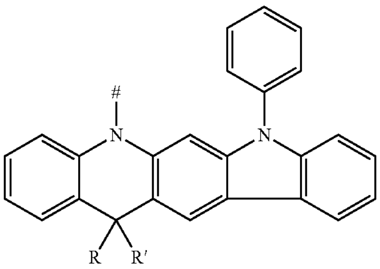

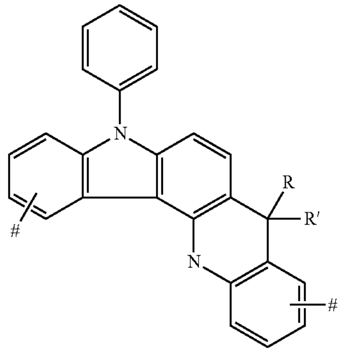

or

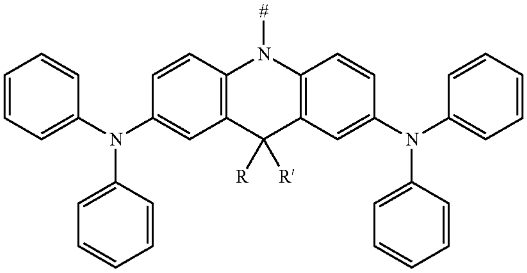

wherein R and R' are each independently selected from the group consisting of a hydrogen atom, C1-C3 alkyl, and phenyl.

6. The compound according to claim 1, wherein $R_1$ and $R_2$ are each independently

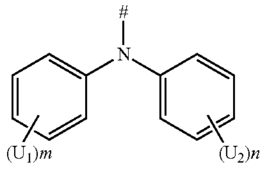

wherein $U_1$ and $U_2$ are each independently selected from the group consisting of a hydrogen atom, C1-C6 alkyl, C1-C6 alkoxy;

m and n are each an integer independently selected from 0, 1, or 2; and represents a bonding position.

7. The compound according to claim 6, wherein $R_1$ and $R_2$ are each independently selected from the group consisting of

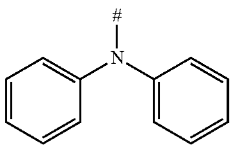

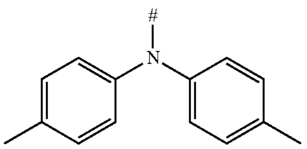

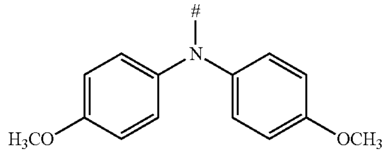

and

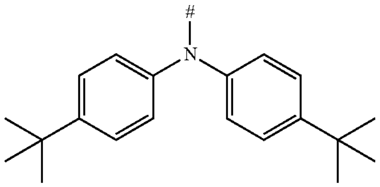

wherein # represents a bonding position.

8. The compound according to claim 1, wherein $L_1$ and $L_2$ are the same.

9. The compound according to claim 8, wherein $R_1$ and $R_2$ are the same.

10. The compound according to claim 1, wherein $L_1$ and $L_2$ are each independently selected from the group consisting of

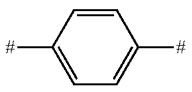

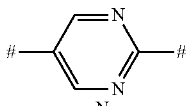

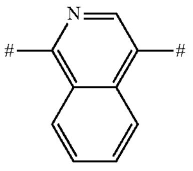

and

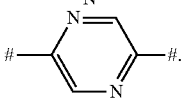

11. The compound according to claim 1, wherein $L_1$ and $L_2$ are each independently selected from the group consisting of

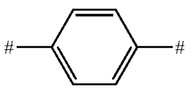

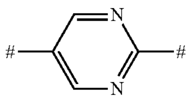

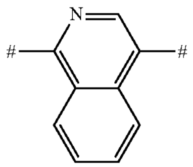

and

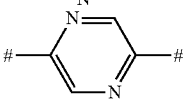

wherein $R_1$ and $R_2$ are each independently according to any one of the following formulas:

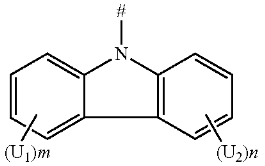

wherein $U_1$ and $U_2$ are each C1-C3 alkyl; m and n are each an integer independently selected from 0, 1, or 2.

12. The compound according to claim 1, wherein $L_1$ and $L_2$ are each independently selected from the group consisting of

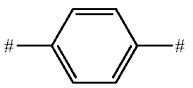

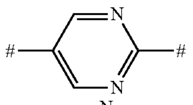

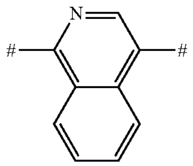

and

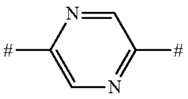

$R_1$ and $R_2$ are each independently according to the following formula:

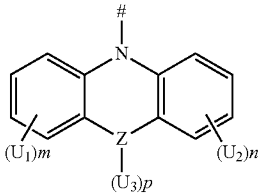

wherein Z is selected from the group consisting of a carbon atom, a nitrogen atom, an oxygen atom and a sulfur atom;

$U_1$, $U_2$ and $U_3$ are each C1-C3 alkyl, or C6-C12 aryl; m and n are an integer independently selected from 0, 1, or 2; and p is an integer selected from 0, 1 or 2;

when Z is an oxygen atom or a sulfur atom, p is 0; and represents a bonding position.

13. The compound according to claim 1, wherein $L_1$ and $L_2$ are each independently selected from the group consisting of

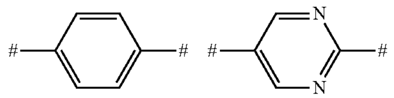

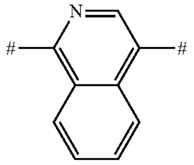

and

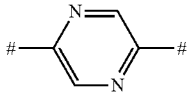

$R_1$ and $R_2$ are each independently selected from the group consisting of the following groups:

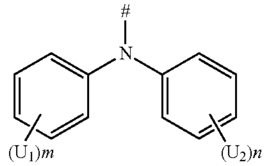

$U_1$ and $U_2$ are each C1-C3 alkyl; and m and n are each an integer independently selected from 0, 1, or 2.

14. The compound according to claim 1, wherein $L_1$ and $L_2$ are each independently selected from the group consisting of

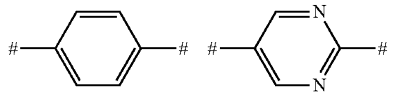

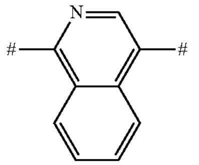

and

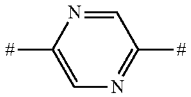

$R_1$ and $R_2$ are each independently selected from the group consisting of

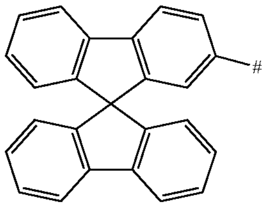

and

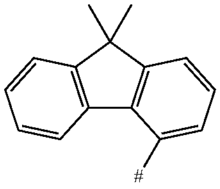

.

15. The compound according to claim 1, having any one of chemical structures represented by Formula (1-1) to Formula (1-6):

Formula (1-1)

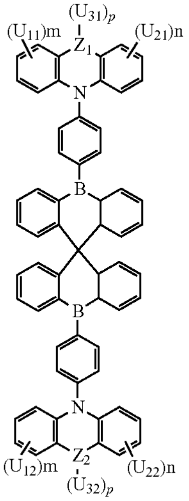

Formula (1-2)

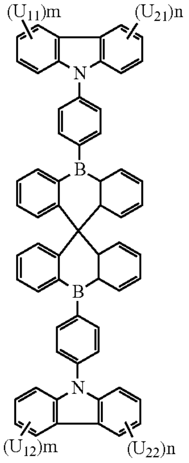

Formula (1-3)

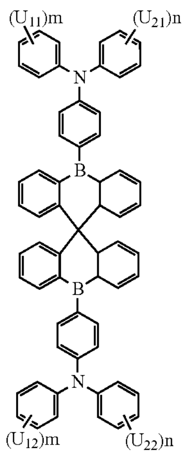

-continued

Formula (1-4)

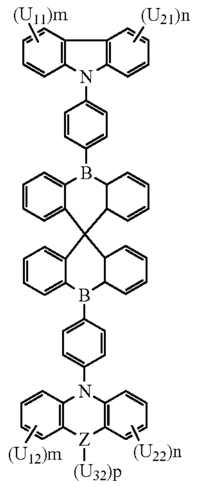

Formula (1-5)

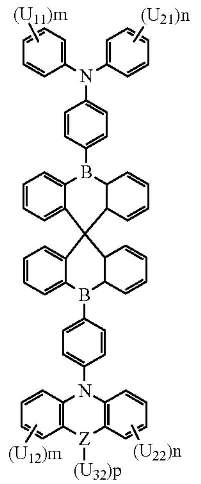

Formula (1-6)

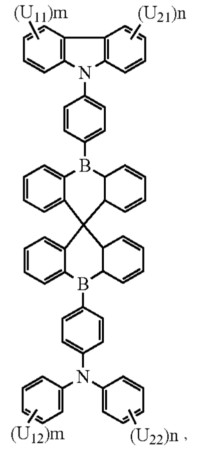

wherein Z is selected from the group consisting of a carbon atom, a nitrogen atom, an oxygen atom, and a sulfur atom;

$U_{11}$, $U_{12}$, $U_{21}$, $U_{22}$, $U_{31}$ and $U_{32}$ are each independently selected from the group consisting of a hydrogen atom, C1-C6 alkyl, C3-C6 cycloalkyl, C1-C6 alkoxy, and C6-C12 aryl;

m, n, and p are each an integer independently selected from 0, 1, or 2; and when Z is an oxygen atom or a sulfur atom, p is 0.

16. The compound according to claim 1, wherein the compound is any one of the following compounds:

M1

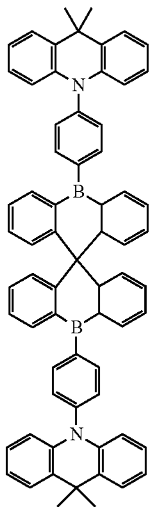

M2

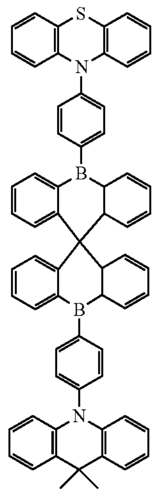

M3

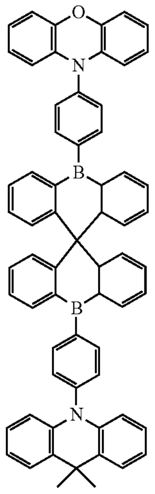

-continued
M4
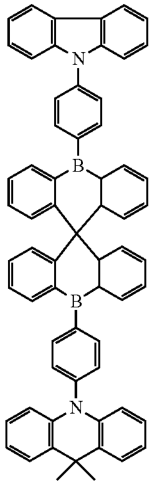
M5
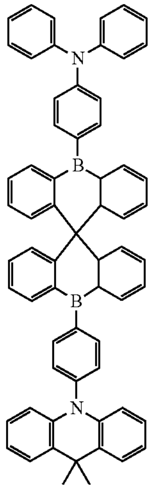
M6
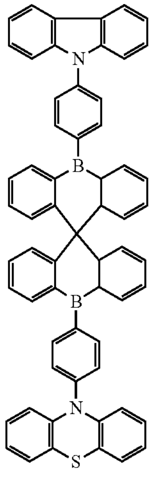
-continued
M7
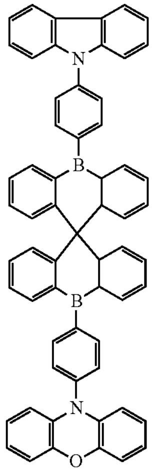
M8
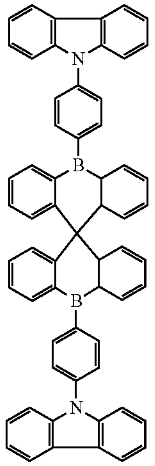
M9
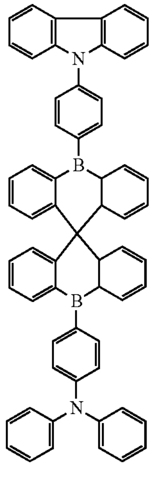

-continued
M10
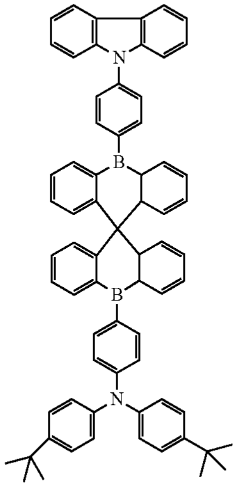
M11
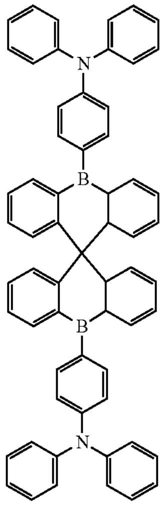
M12
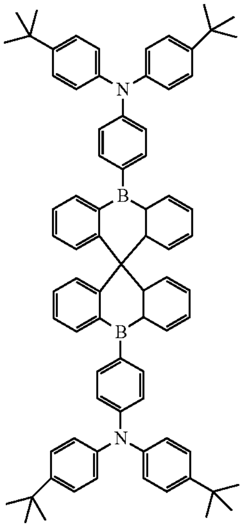
-continued
M13
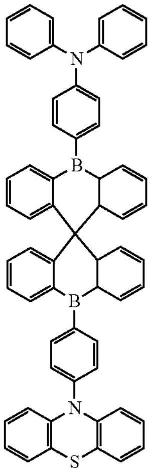
M14
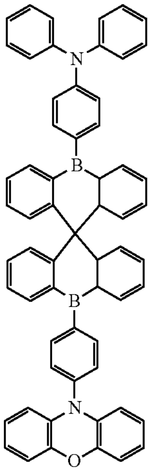
M15
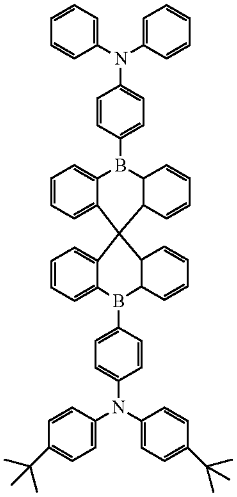

-continued
M16
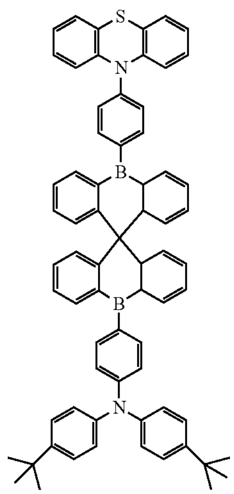
M17
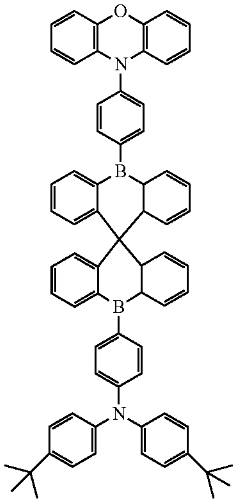
M18
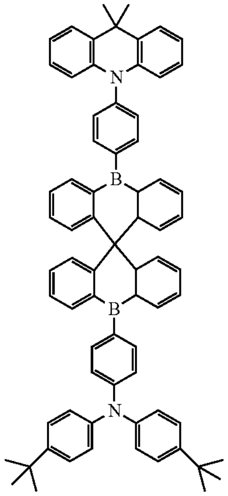
-continued
M19
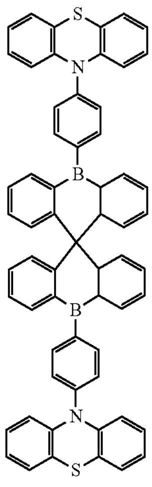
M20
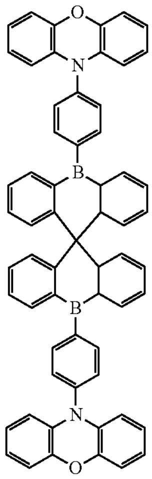
M21
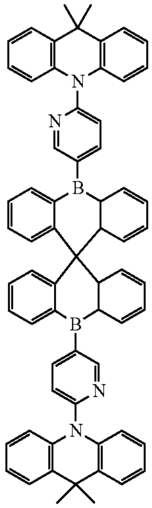

-continued

M22

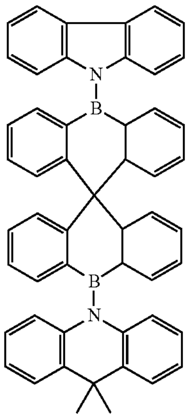

M23

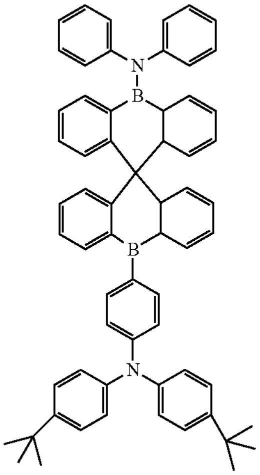

or

-continued

M24

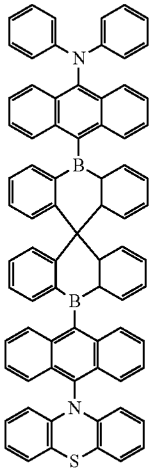

.

17. The compound according to claim 1, wherein an energy level difference $\Delta E_{st}$ between a lowest singlet energy level S1 of the compound and a lowest triplet energy level T1 of the compound satisfies an equation $\Delta E_{st}=E_{S1}-E_{T1}\leq 0.1$ eV.

18. A display panel, comprising an organic light-emitting device, wherein the organic light-emitting device comprises an anode, a cathode, a light-emitting layer disposed between the anode and the cathode, a host material or a guest material of the light-emitting layer being one or more compounds according to claim 1.

19. The display panel according to claim 18, further comprising one or more layers selected from a hole injection layer, a hole transmission layer, an electron blocking layer, a hole blocking layer, an electron transmission layer or an electron injection layer.

20. A display apparatus, comprising the display panel according to claim 18.

* * * * *